(12) United States Patent
Nakamura

(10) Patent No.: US 9,972,706 B2
(45) Date of Patent: May 15, 2018

(54) POWER SEMICONDUCTOR DEVICE

(71) Applicant: Mitsubishi Electric Corporation, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 15/027,541

(22) PCT Filed: Jan. 29, 2014

(86) PCT No.: PCT/JP2014/051909
§ 371 (c)(1),
(2) Date: Apr. 6, 2016

(87) PCT Pub. No.: WO2015/114747
PCT Pub. Date: Aug. 6, 2015

(65) Prior Publication Data
US 2016/0254375 A1 Sep. 1, 2016

(51) Int. Cl.
*H01L 29/739* (2006.01)
*H01L 29/40* (2006.01)
(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC ............. H01L 29/1095; H01L 29/7397; H01L 29/0619; H01L 29/0696; H01L 29/0834;
(Continued)

(56) References Cited

U.S. PATENT DOCUMENTS 7,635,878 B2   12/2009  Suekawa
7,808,014 B2   10/2010  Suekawa
(Continued)

FOREIGN PATENT DOCUMENTS

JP    2005-354031 A    12/2005
JP    2009-105265 A     5/2009
(Continued)

OTHER PUBLICATIONS

An Office Action; "Notification of Reason(s) for Refusal" issued by the Japanese Patent Office dated Feb. 14, 2017, which corresponds to Japanese Patent Application No. 2015-559653 and is related to U.S. Appl. No. 15/027,541; with English language partial translation.

(Continued)

*Primary Examiner* — Bilkis Jahan
*Assistant Examiner* — Victor Barzykin
(74) *Attorney, Agent, or Firm* — Studebaker & Brackett PC

(57) ABSTRACT

A semiconductor substrate includes a drift region and a collector region. The drift region is provided across an active area, an interface area, and an edge termination area. The collector region is provided only in the active area and forms part of a second surface. An emitter electrode is provided in the active area and contacts a first surface of the semiconductor substrate. A collector electrode is provided on the second surface of the semiconductor substrate and contacts the collector region.

15 Claims, 94 Drawing Sheets

(51) Int. Cl.
*H01L 29/423* (2006.01)
*H01L 29/06* (2006.01)
*H01L 29/08* (2006.01)
*H01L 29/10* (2006.01)
*H01L 29/78* (2006.01)

(52) U.S. Cl.
CPC ...... *H01L 29/0834* (2013.01); *H01L 29/1095* (2013.01); *H01L 29/404* (2013.01); *H01L 29/407* (2013.01); *H01L 29/4238* (2013.01); *H01L 29/42368* (2013.01); *H01L 29/7823* (2013.01)

(58) Field of Classification Search
CPC ............... H01L 29/404; H01L 29/407; H01L 29/42368; H01L 29/4238; H01L 29/7823
See application file for complete search history.

(56) References Cited

U.S. PATENT DOCUMENTS

| | | | |
|---|---|---|---|
| 7,838,926 | B2 | 11/2010 | Tsukuda et al. |
| 8,039,879 | B2 | 10/2011 | Ueno |
| 8,242,535 | B2 | 8/2012 | Senoo |
| 8,507,352 | B2 | 8/2013 | Koyama et al. |
| 8,598,622 | B2 | 12/2013 | Sadamatsu et al. |
| 8,686,469 | B2 | 4/2014 | Nakamura |
| 9,035,351 | B2 | 5/2015 | Naito |
| 9,041,051 | B2 | 5/2015 | Chen et al. |
| 2009/0114946 | A1* | 5/2009 | Ueno ................. H01L 29/7395 257/137 |
| 2010/0140658 | A1* | 6/2010 | Koyama ............. H01L 27/0664 257/140 |
| 2011/0006338 | A1 | 1/2011 | Senoo |
| 2014/0197451 | A1* | 7/2014 | Chen ................... H01L 29/7393 257/139 |
| 2015/0014741 | A1 | 1/2015 | Chen et al. |
| 2015/0243772 | A1 | 8/2015 | Chen et al. |

FOREIGN PATENT DOCUMENTS

| | | |
|---|---|---|
| JP | 2009-176772 A | 8/2009 |
| JP | 2009-200098 A | 9/2009 |
| JP | 2009-218543 A | 9/2009 |
| JP | 2010-141170 A | 6/2010 |
| JP | 2010-192597 A | 9/2010 |
| JP | 2011-086852 A | 4/2011 |
| JP | 2012-009811 A | 1/2012 |
| JP | 2012-231011 A | 11/2012 |
| JP | 2013-065735 A | 4/2013 |
| WO | 2012/036247 A1 | 3/2012 |
| WO | 2013/005304 A1 | 1/2013 |
| WO | 2013/132568 A1 | 9/2013 |

OTHER PUBLICATIONS

International Search Report; PCT/JP2014/051909 dated Apr. 15, 2015.
Notification of Transmittal of Translation of the International Preliminary Report on Patentability and Translation of Written Opinion of the International Searching Authority; PCT/JP2014/051909 dated Aug. 11, 2016.

\* cited by examiner

F I G . 3
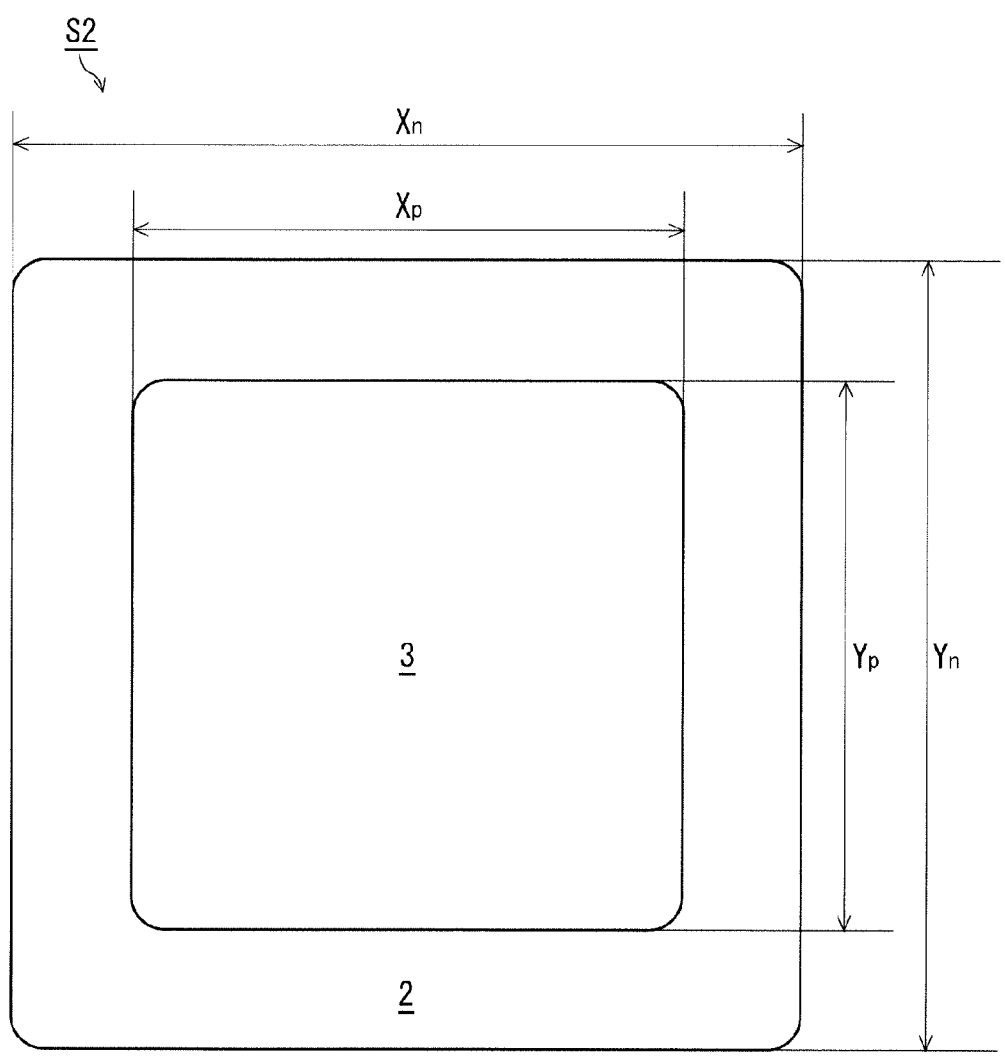

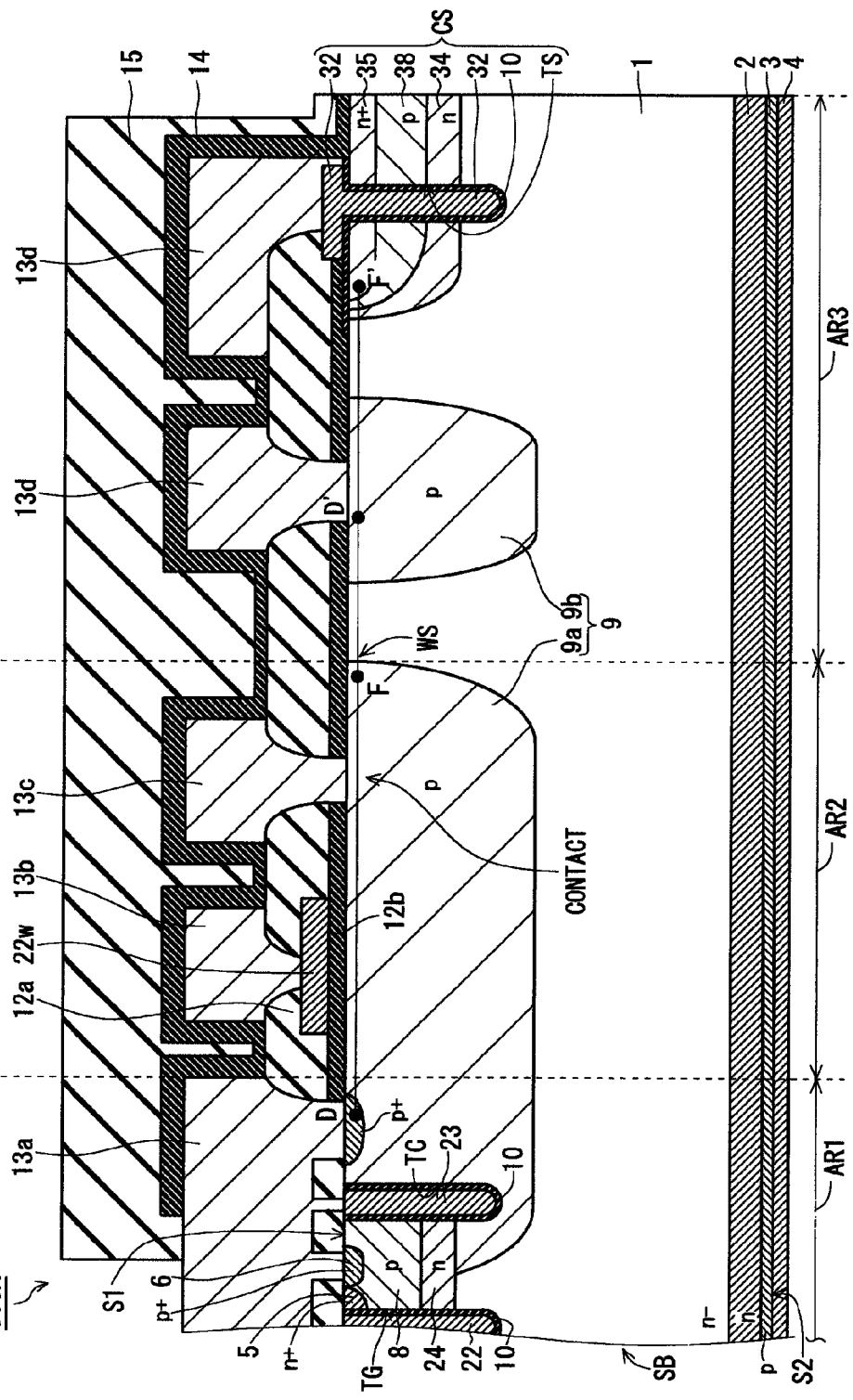

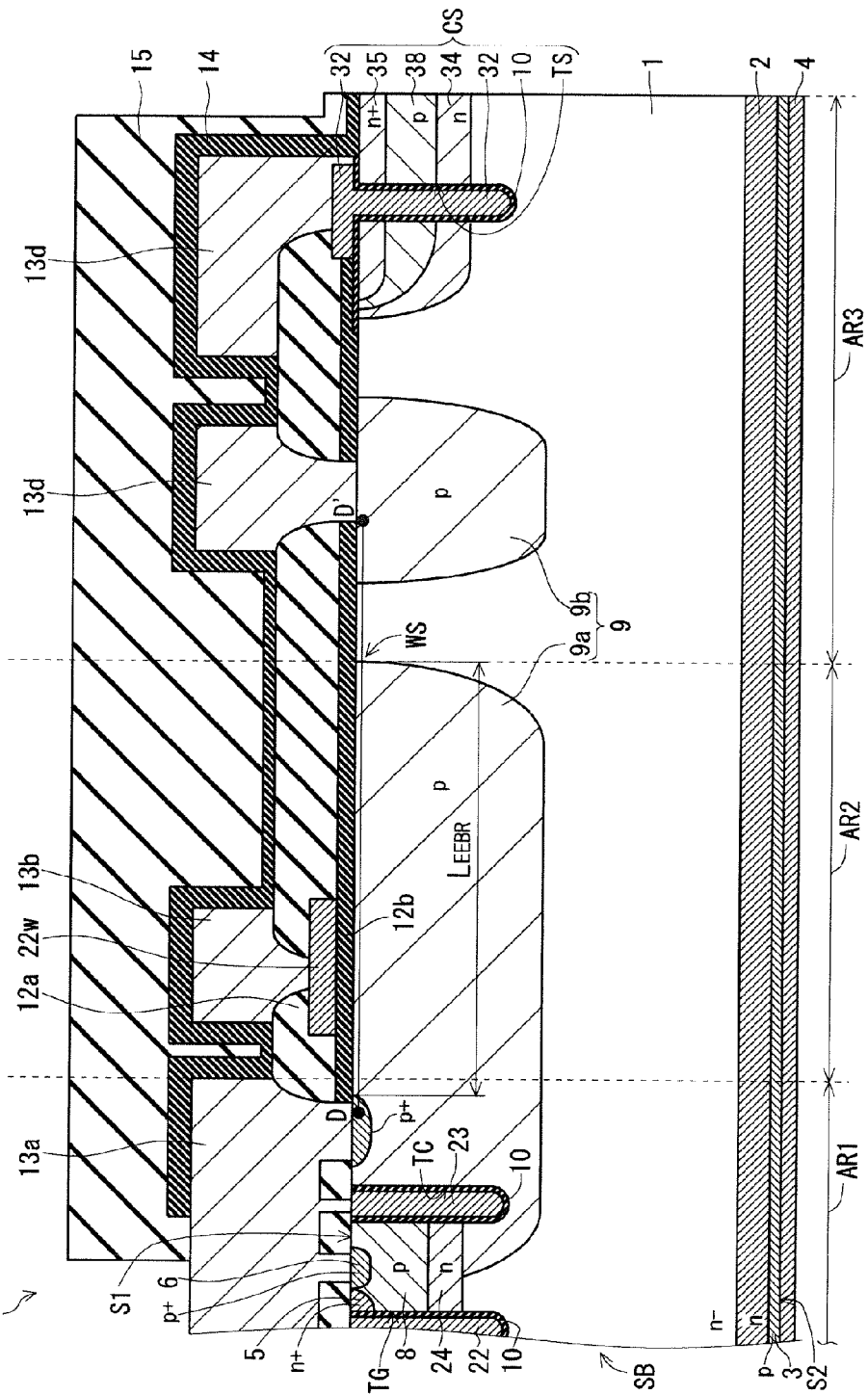

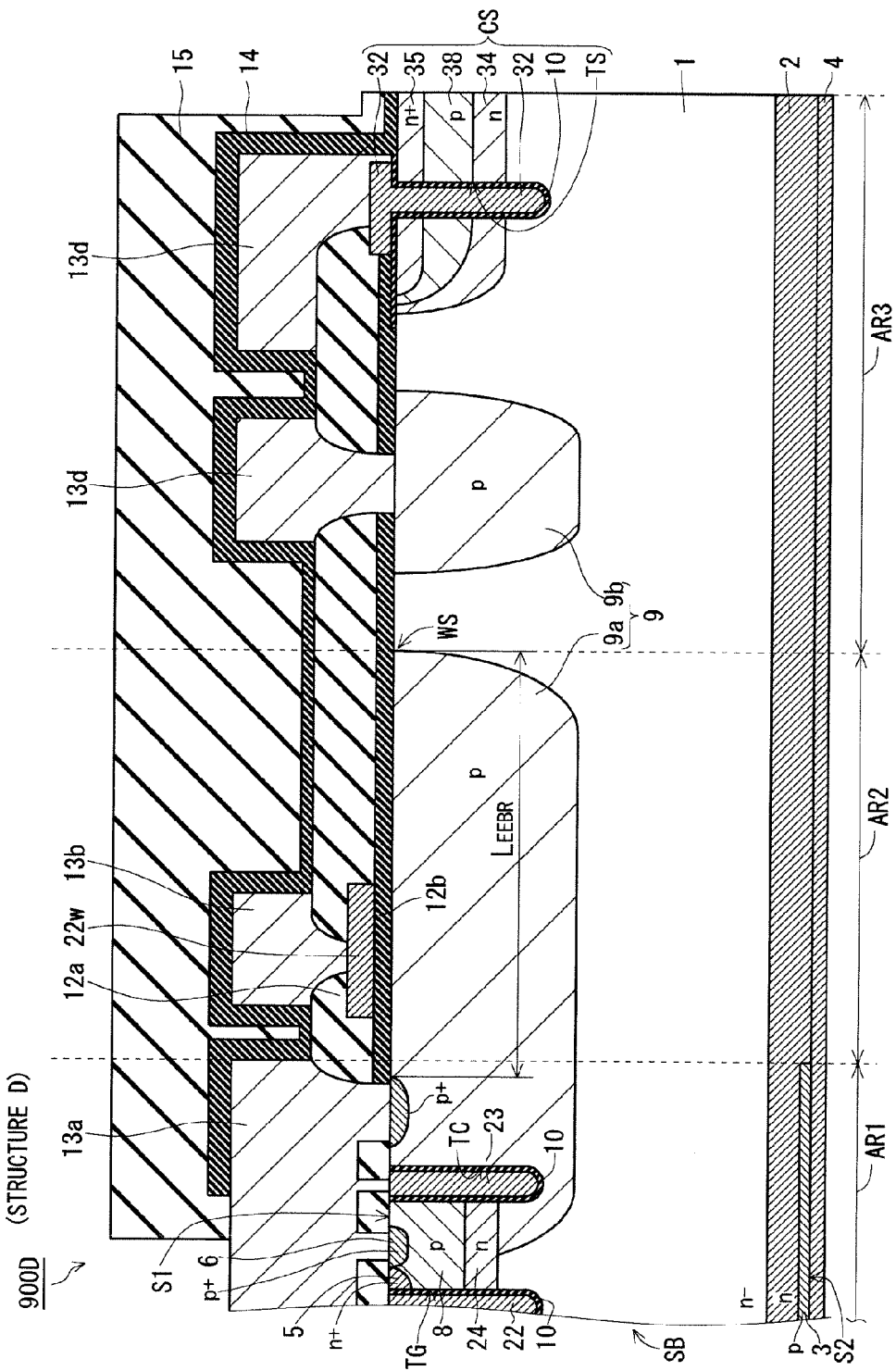

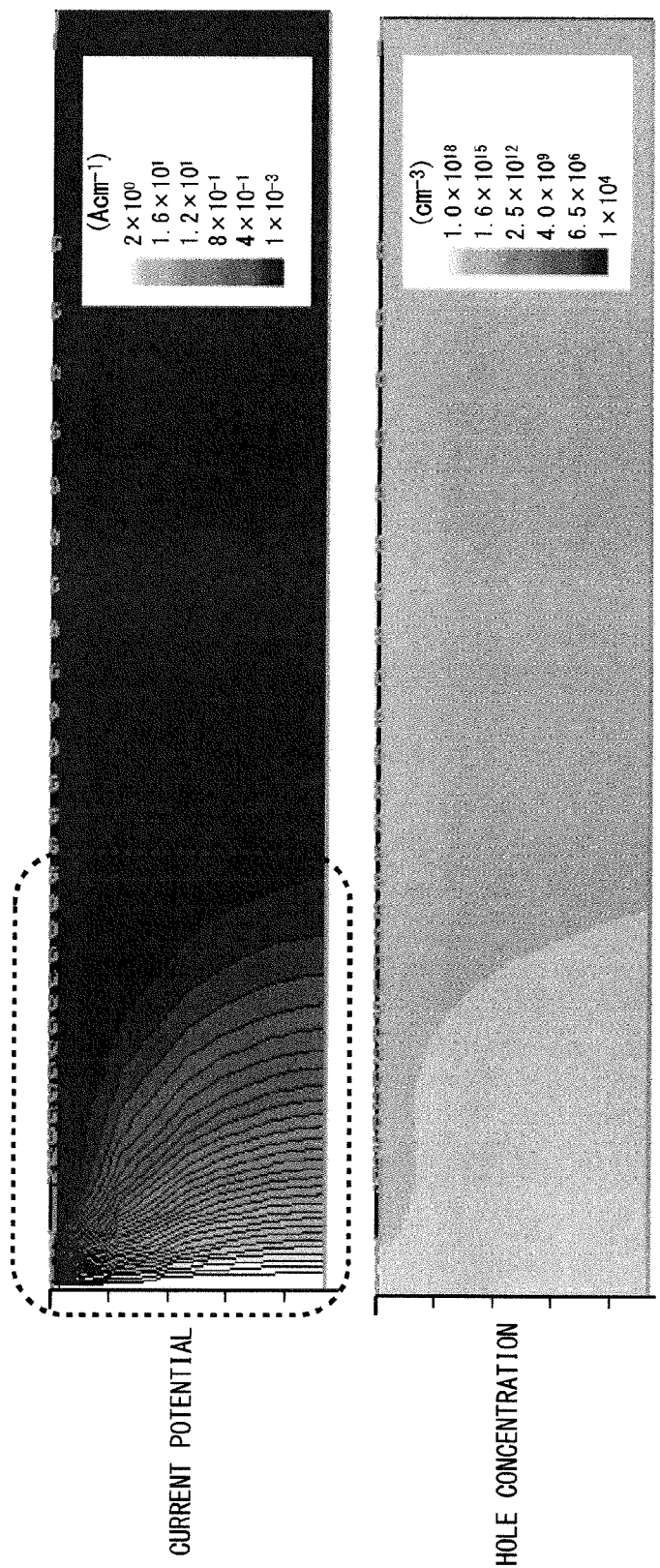

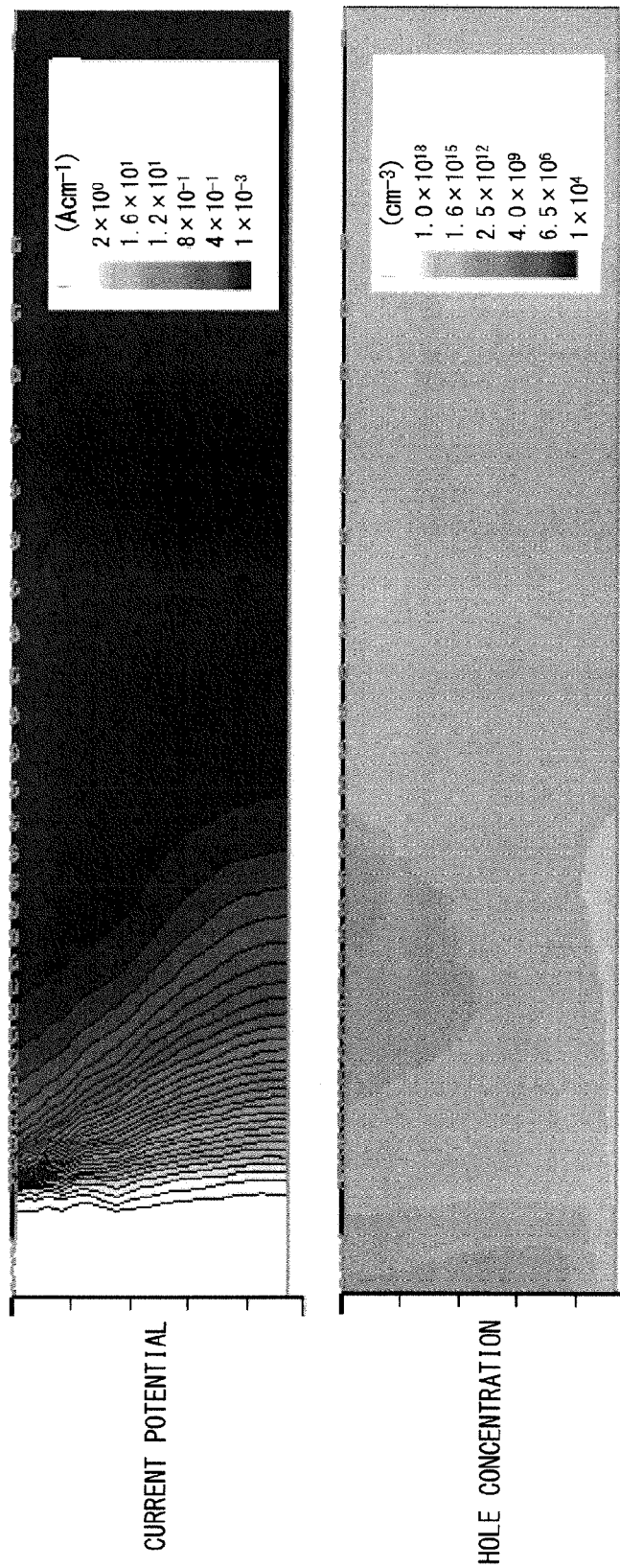

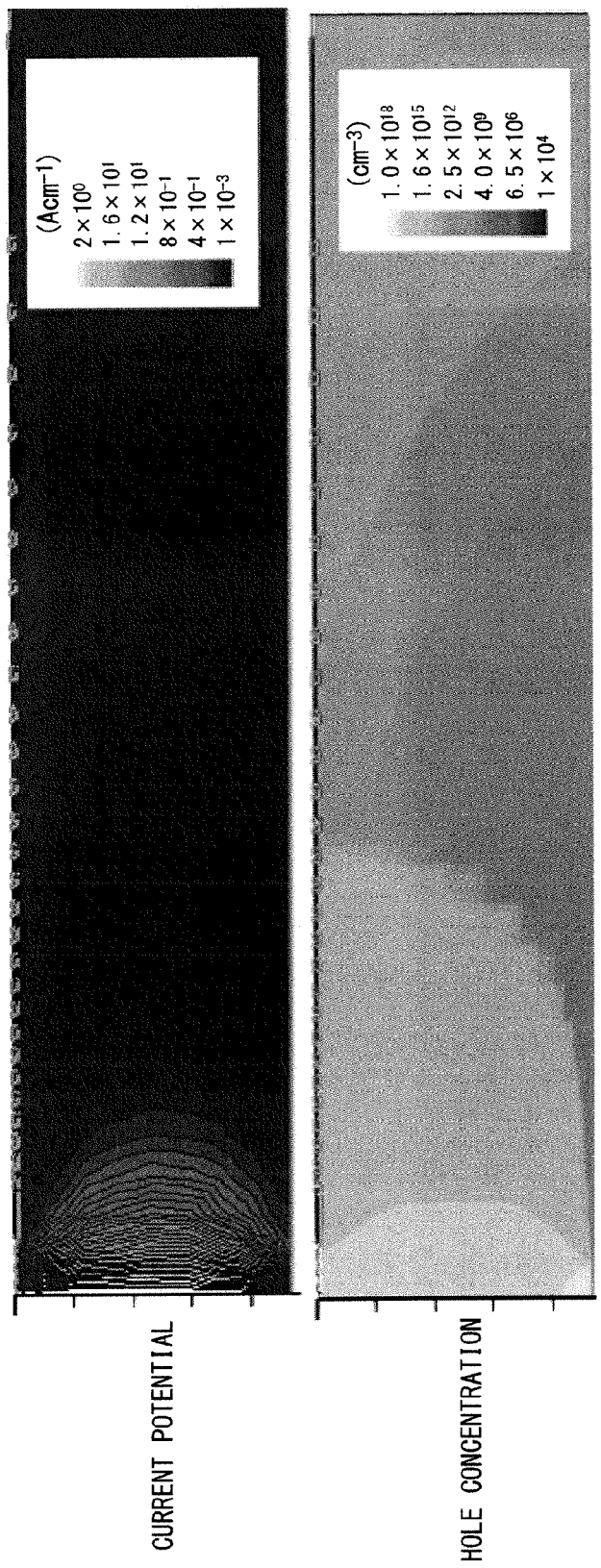

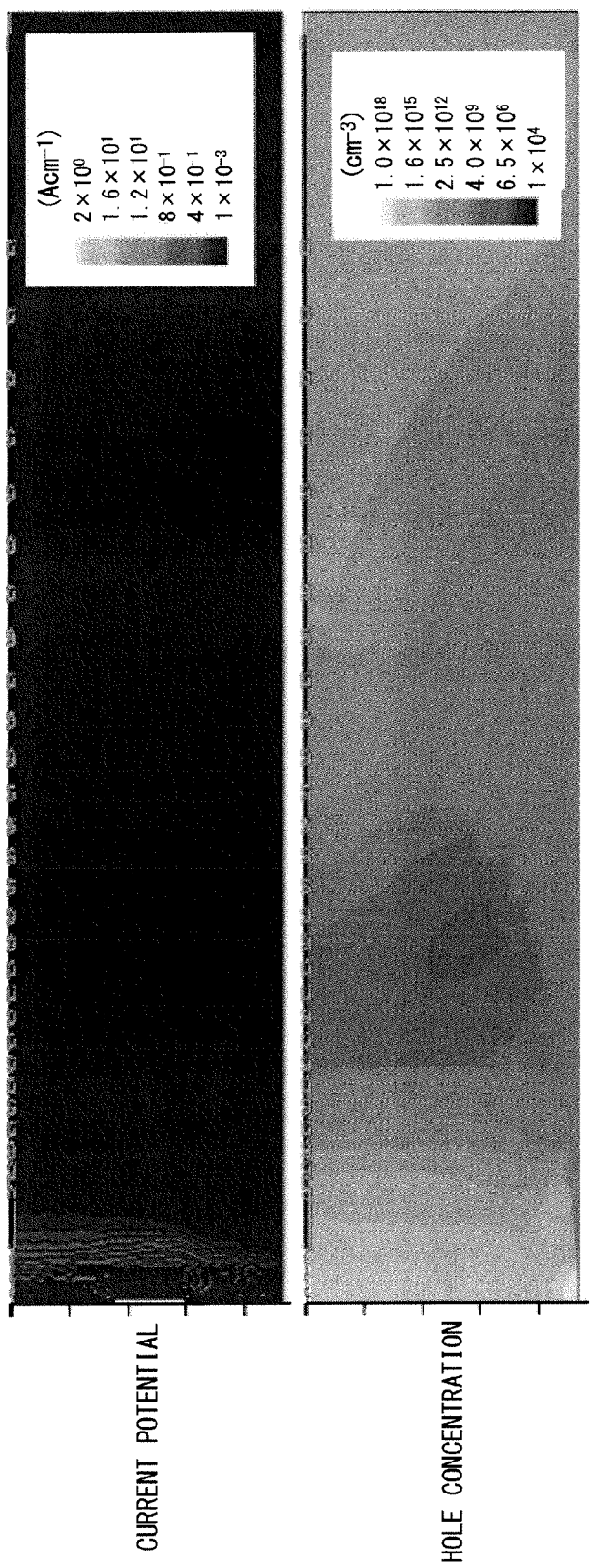

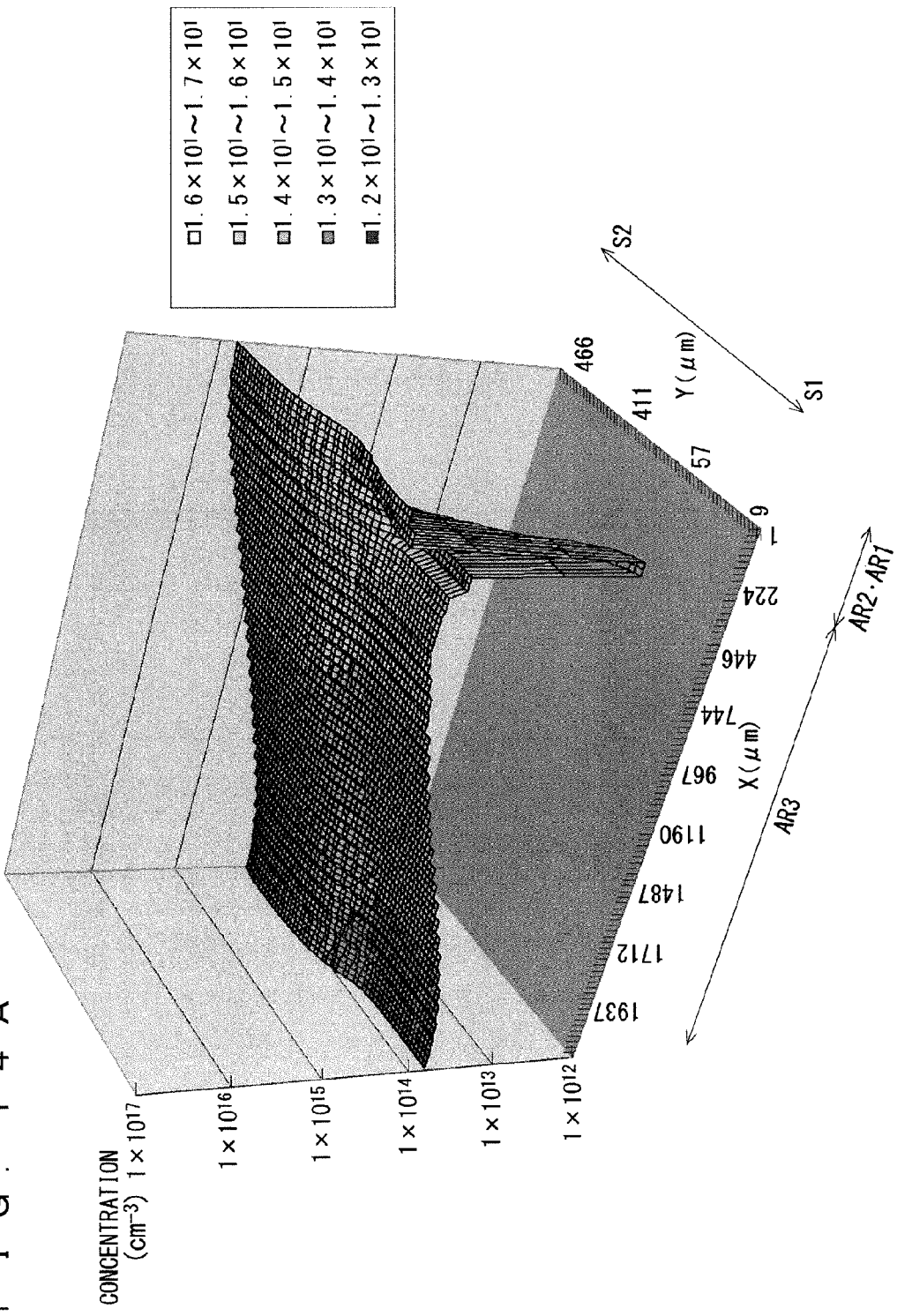

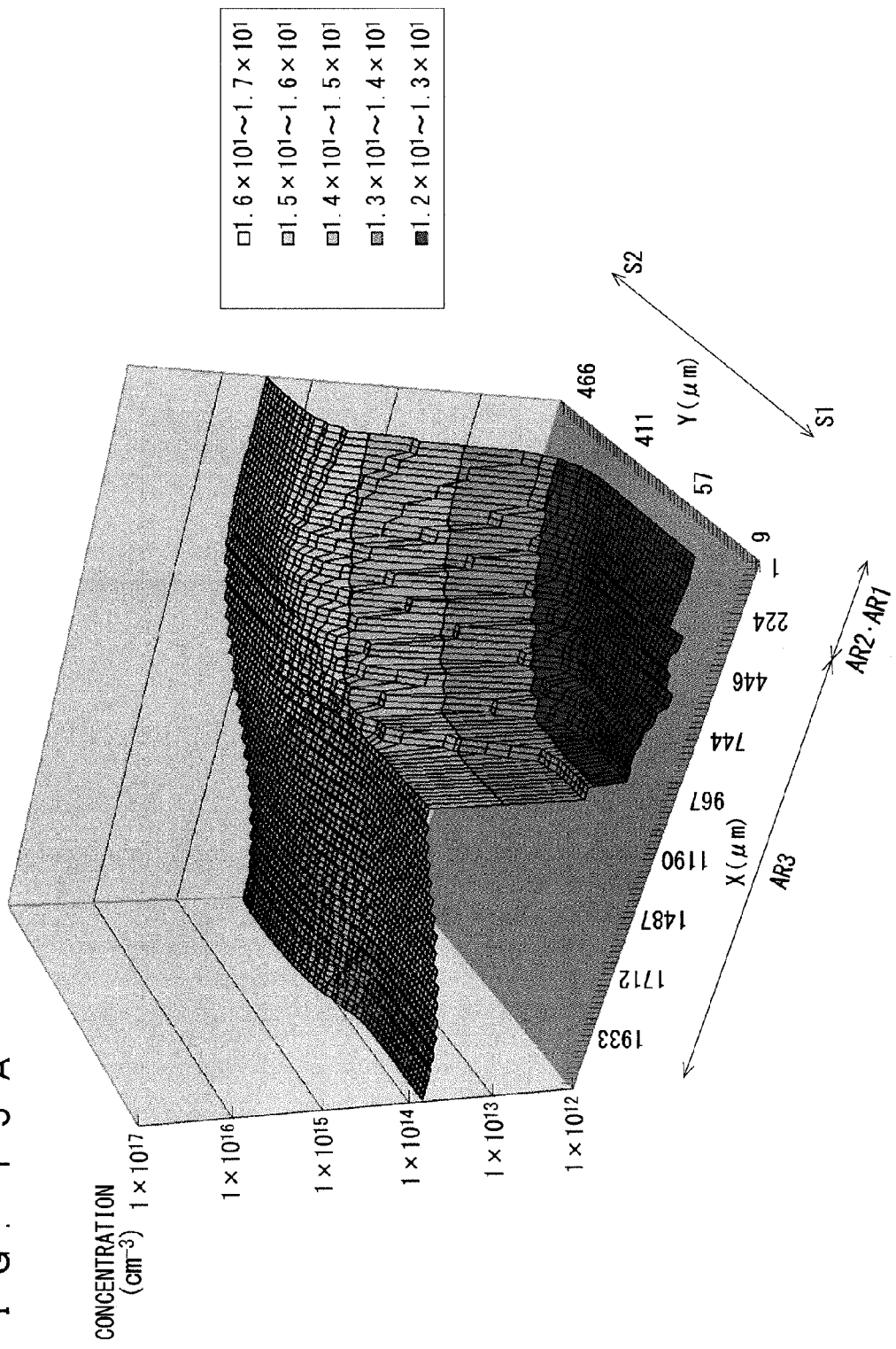

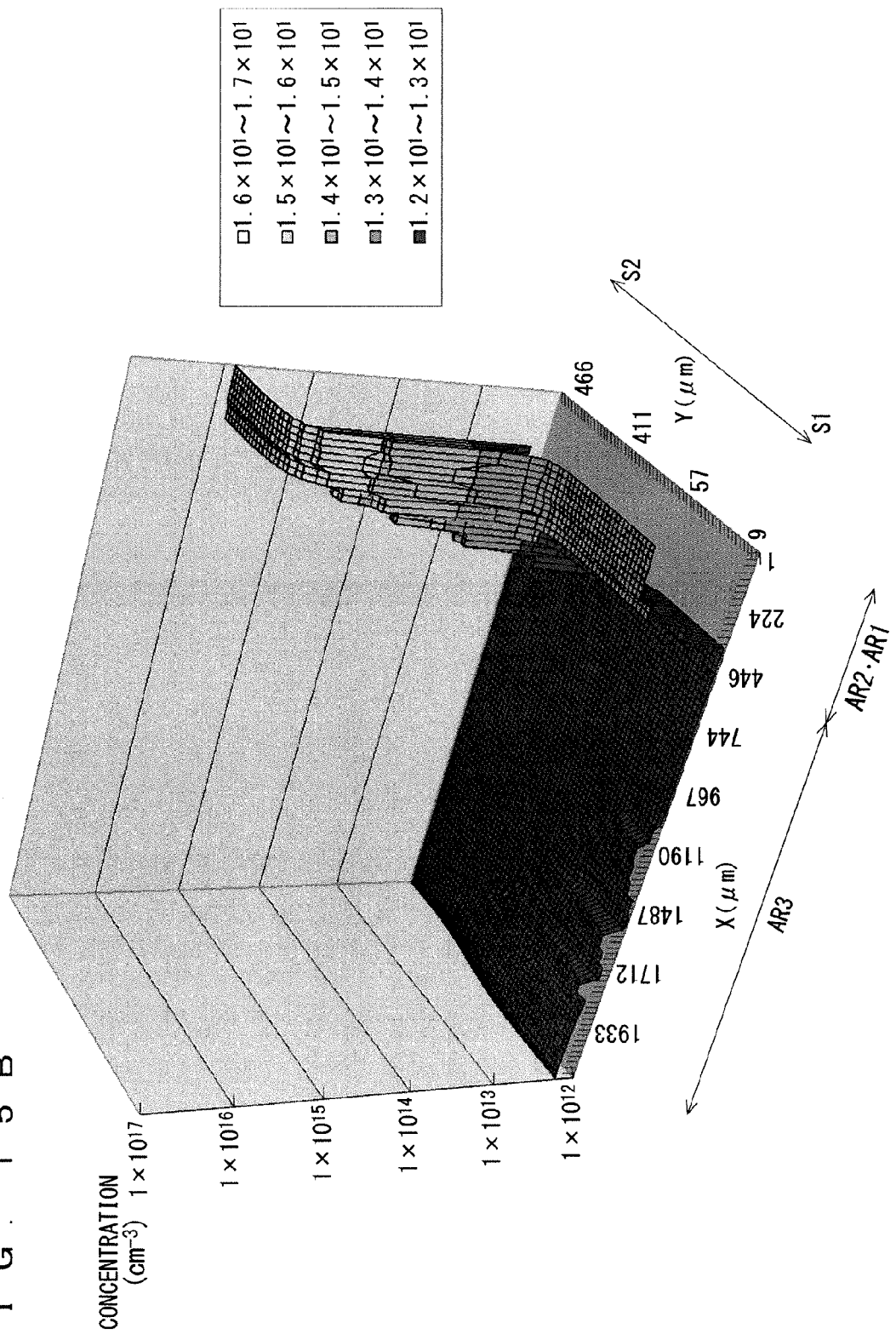

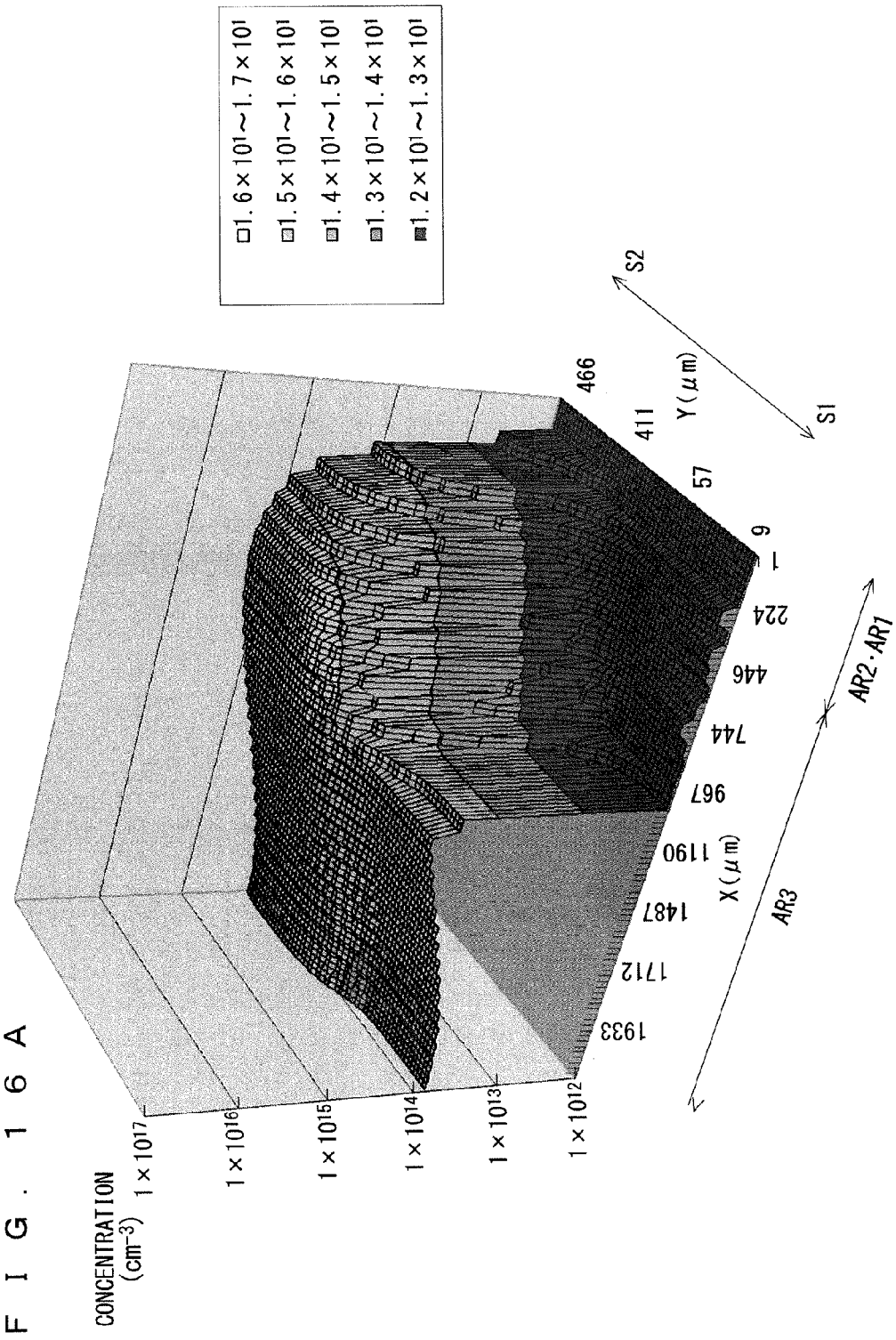

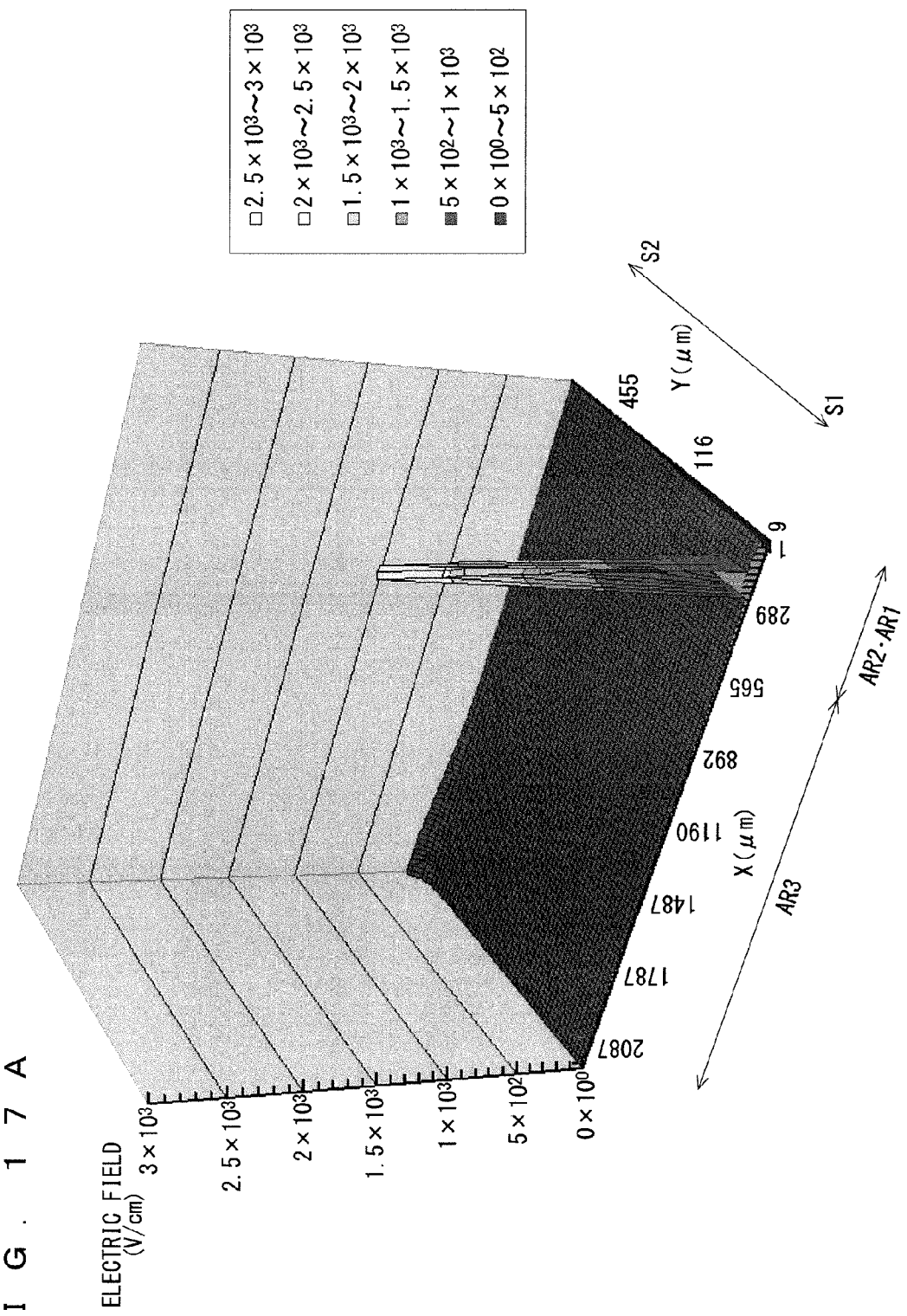

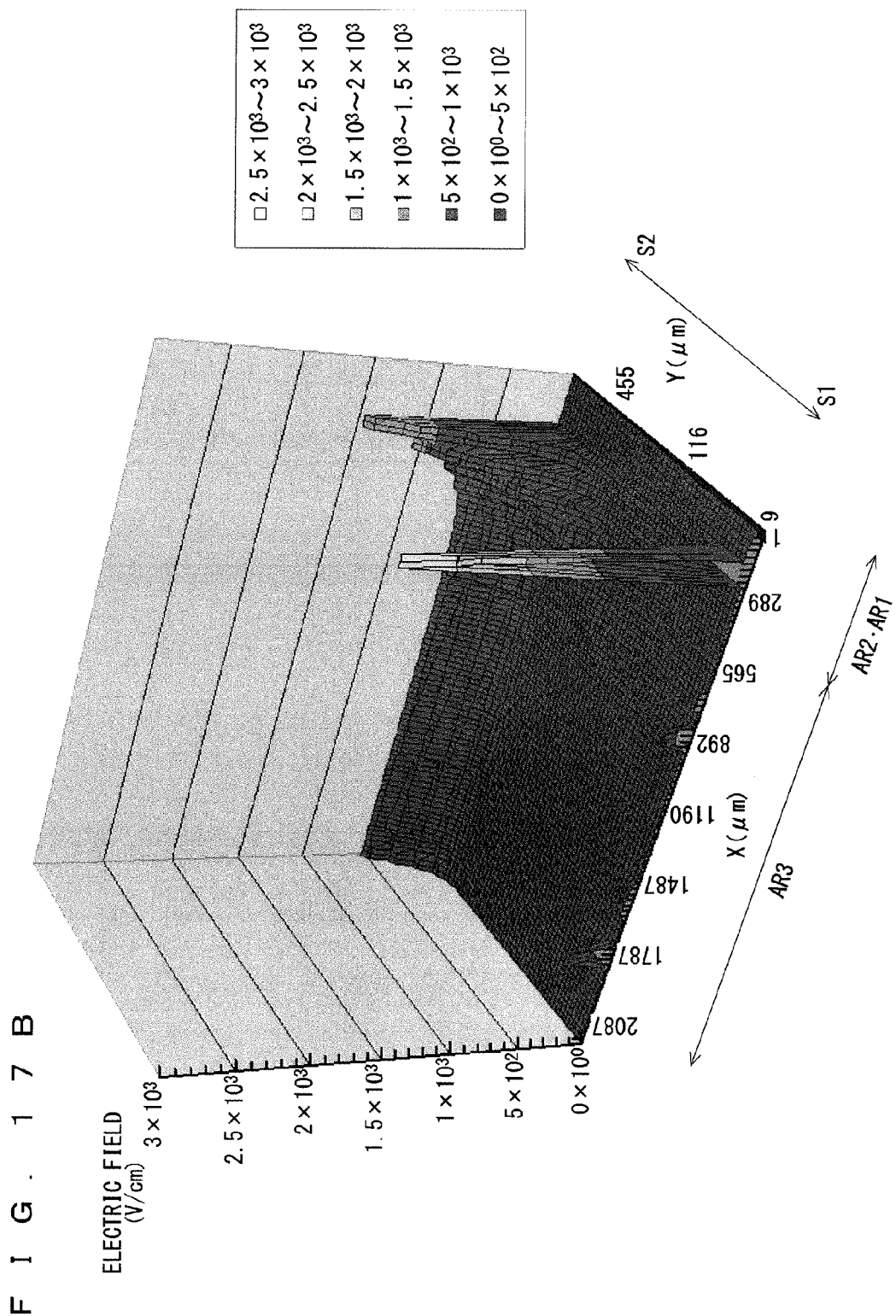

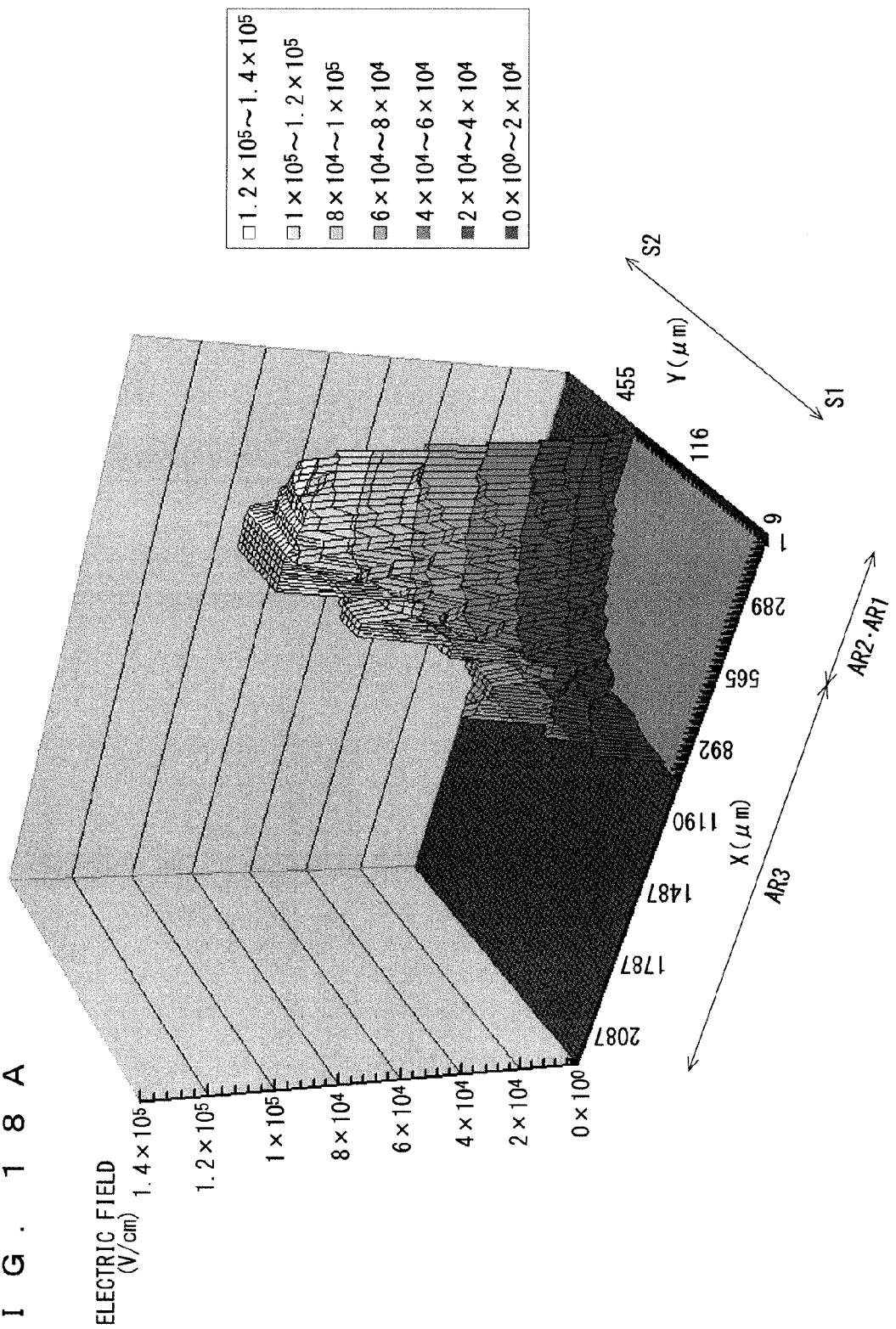

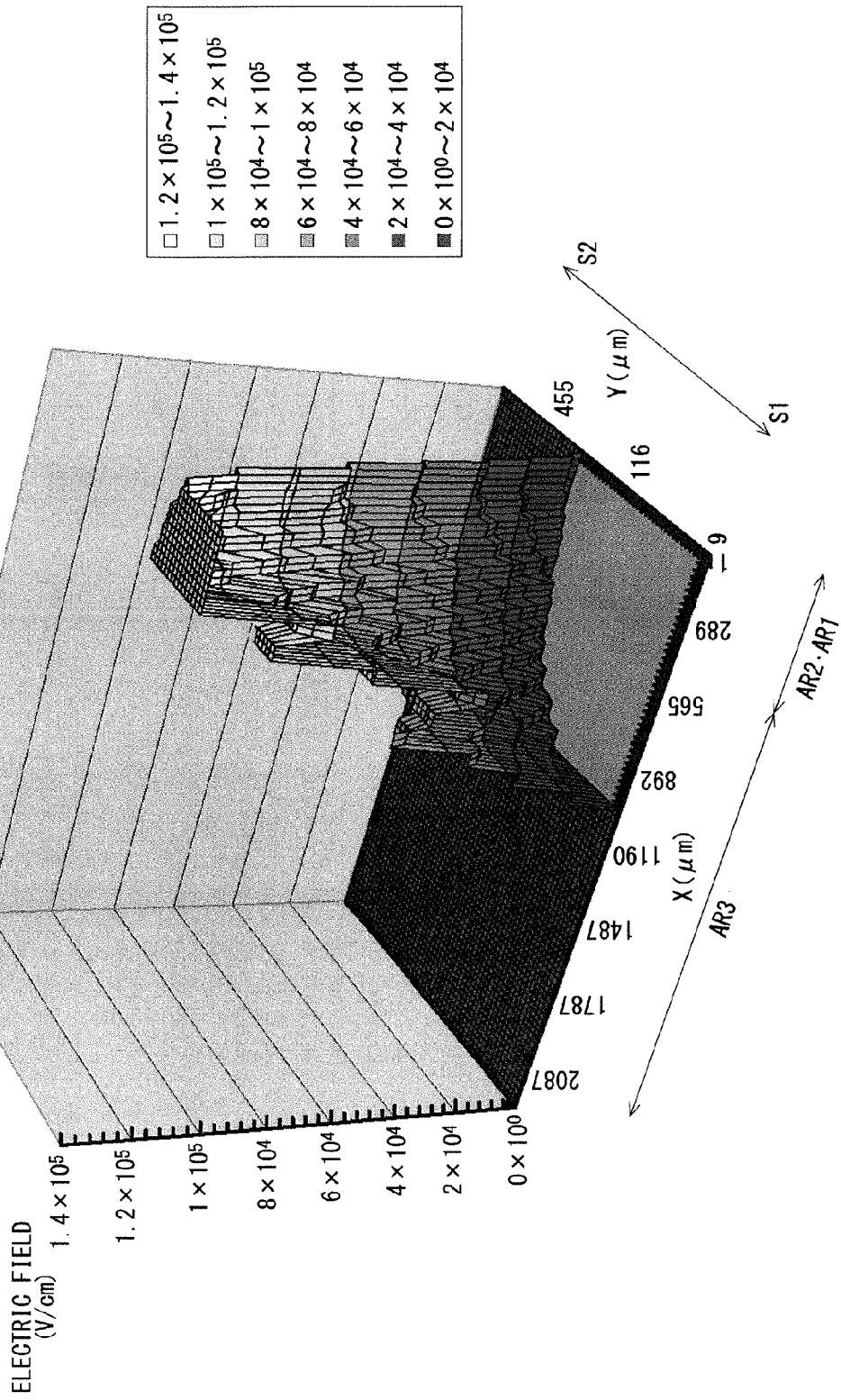

F I G. 3 0 B
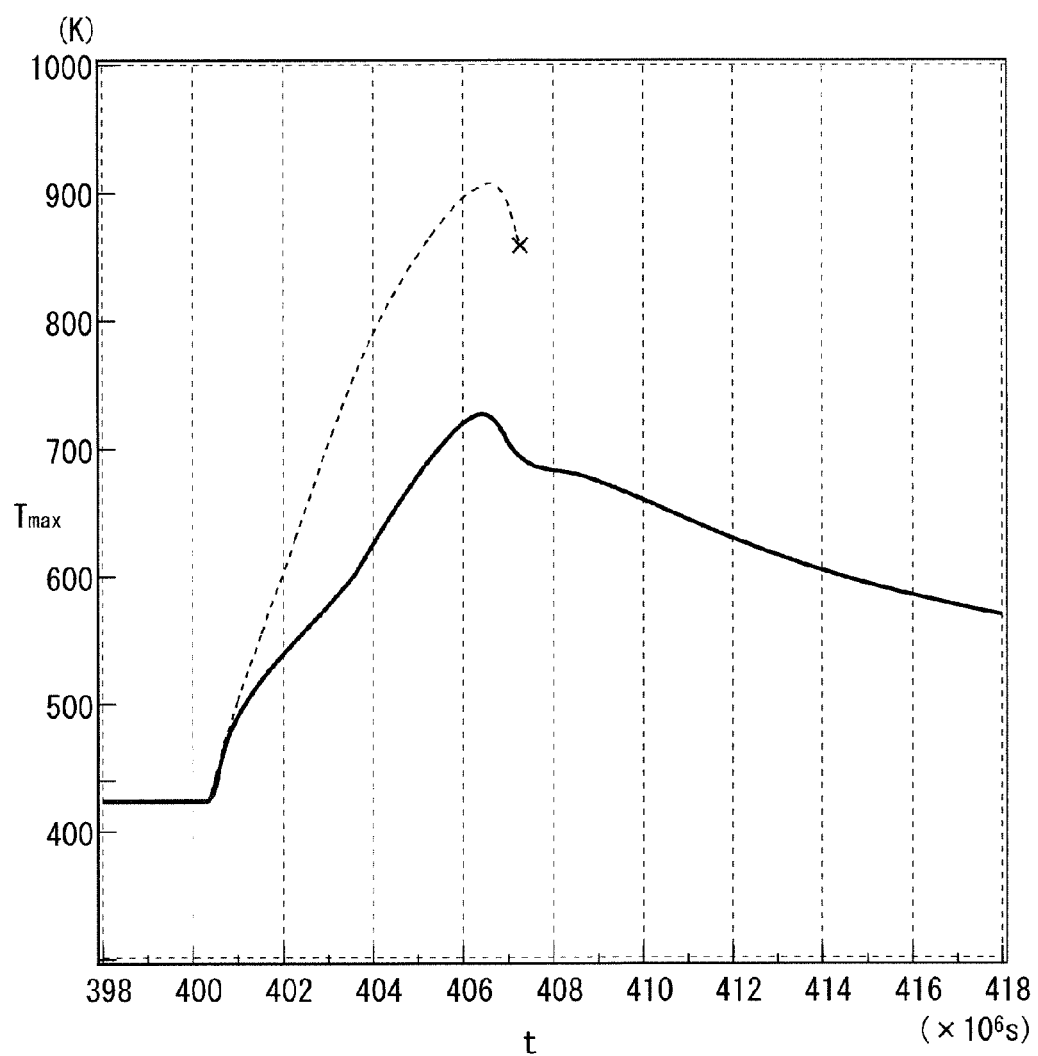

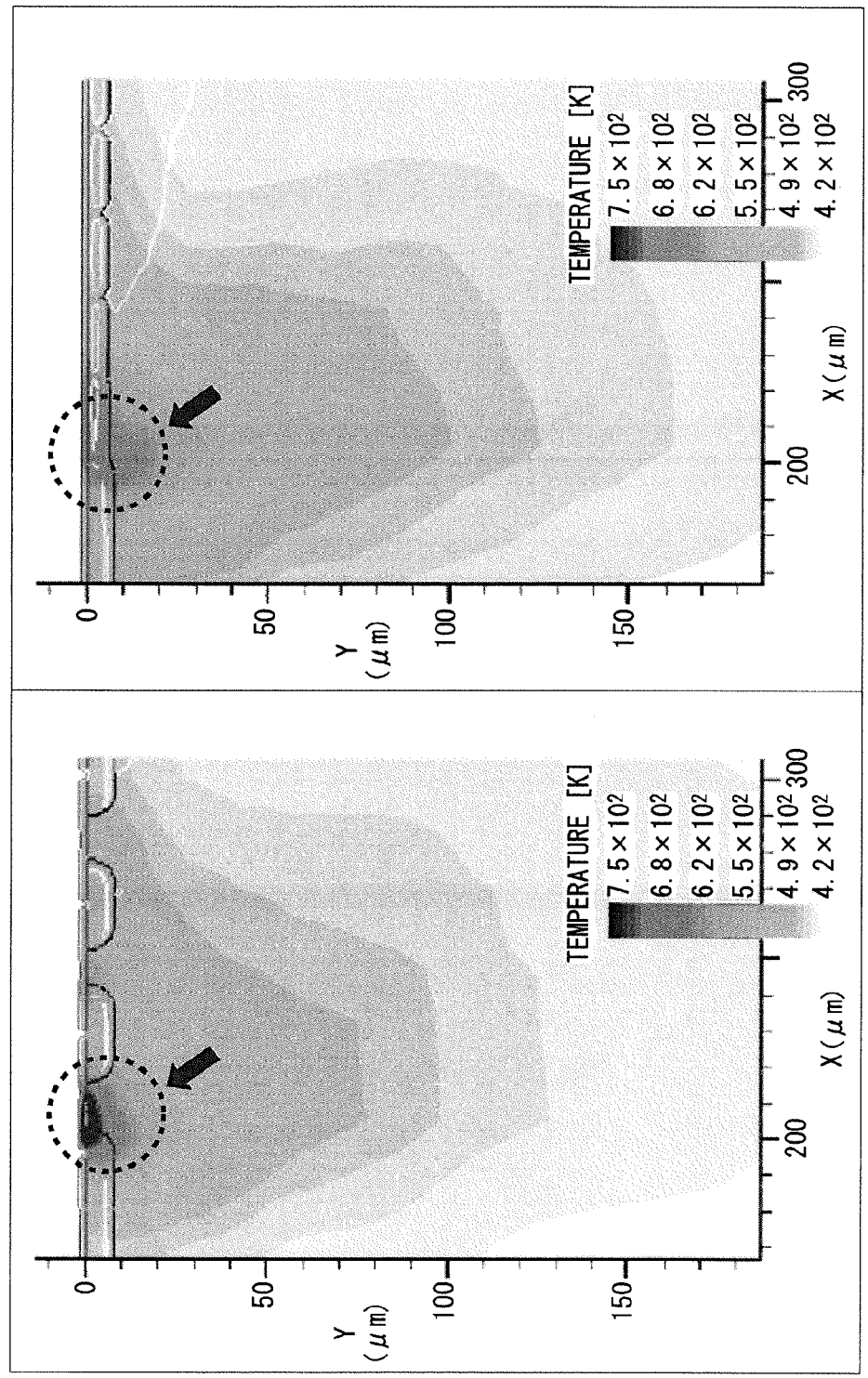

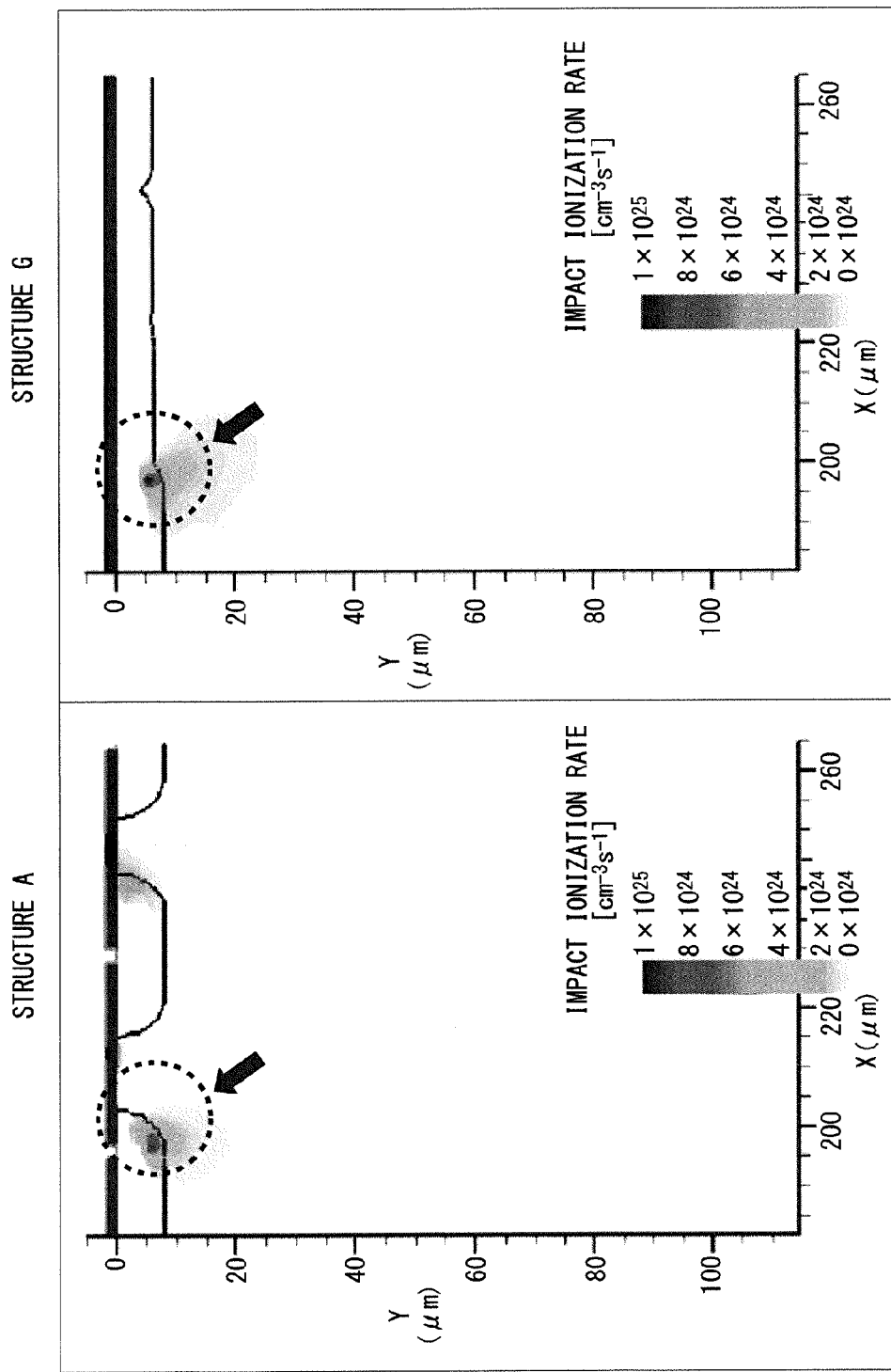

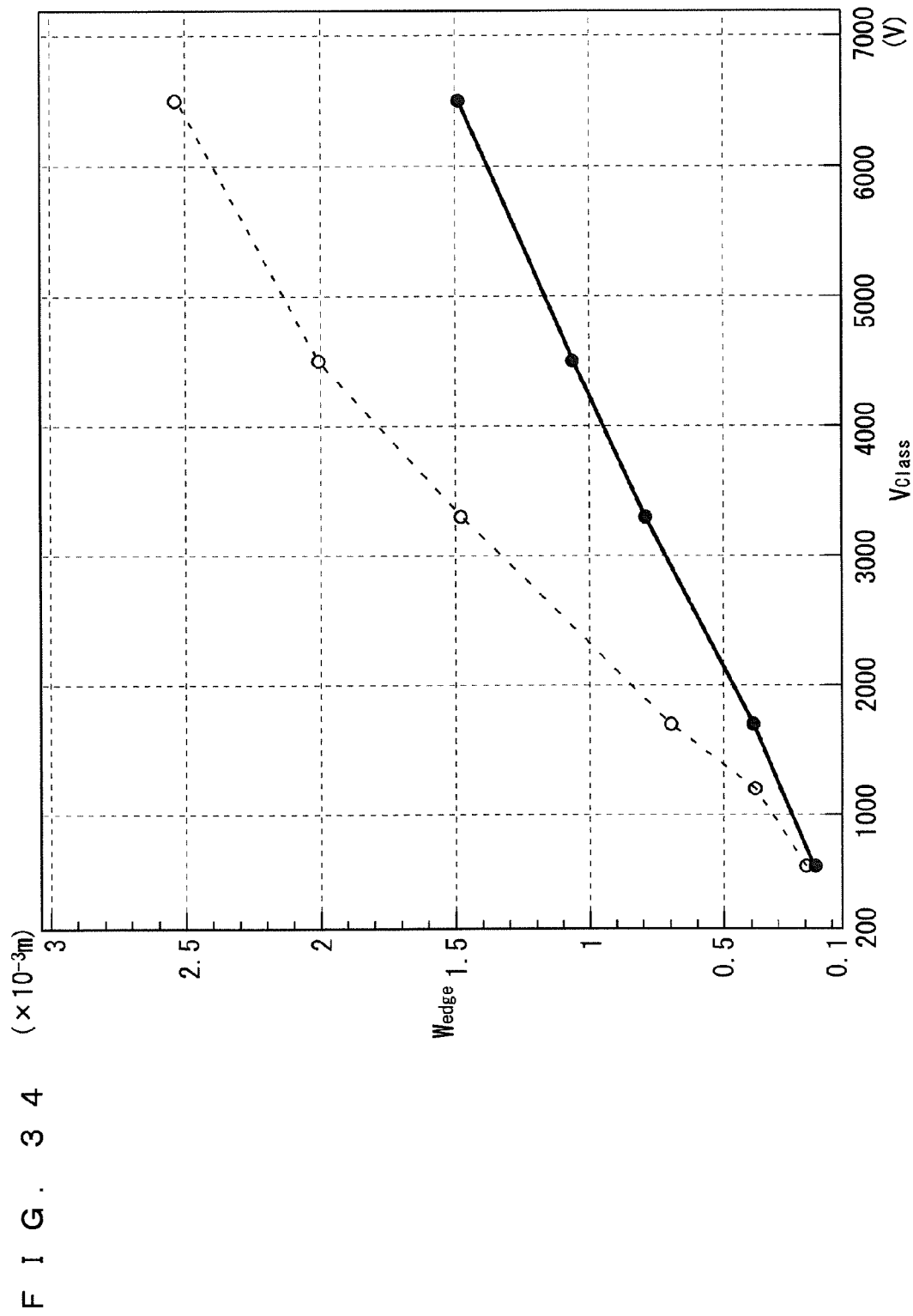
F I G. 34

F I G . 4 0 A
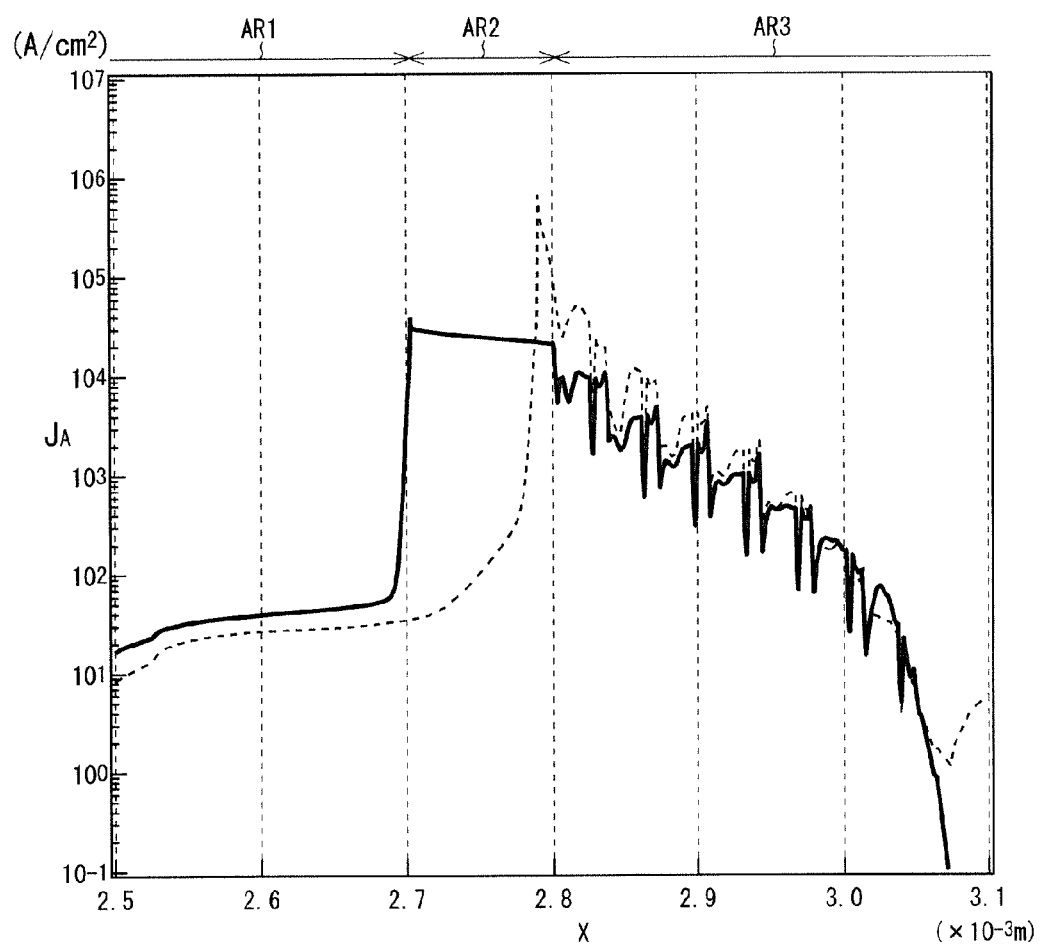

F I G . 4 0 B
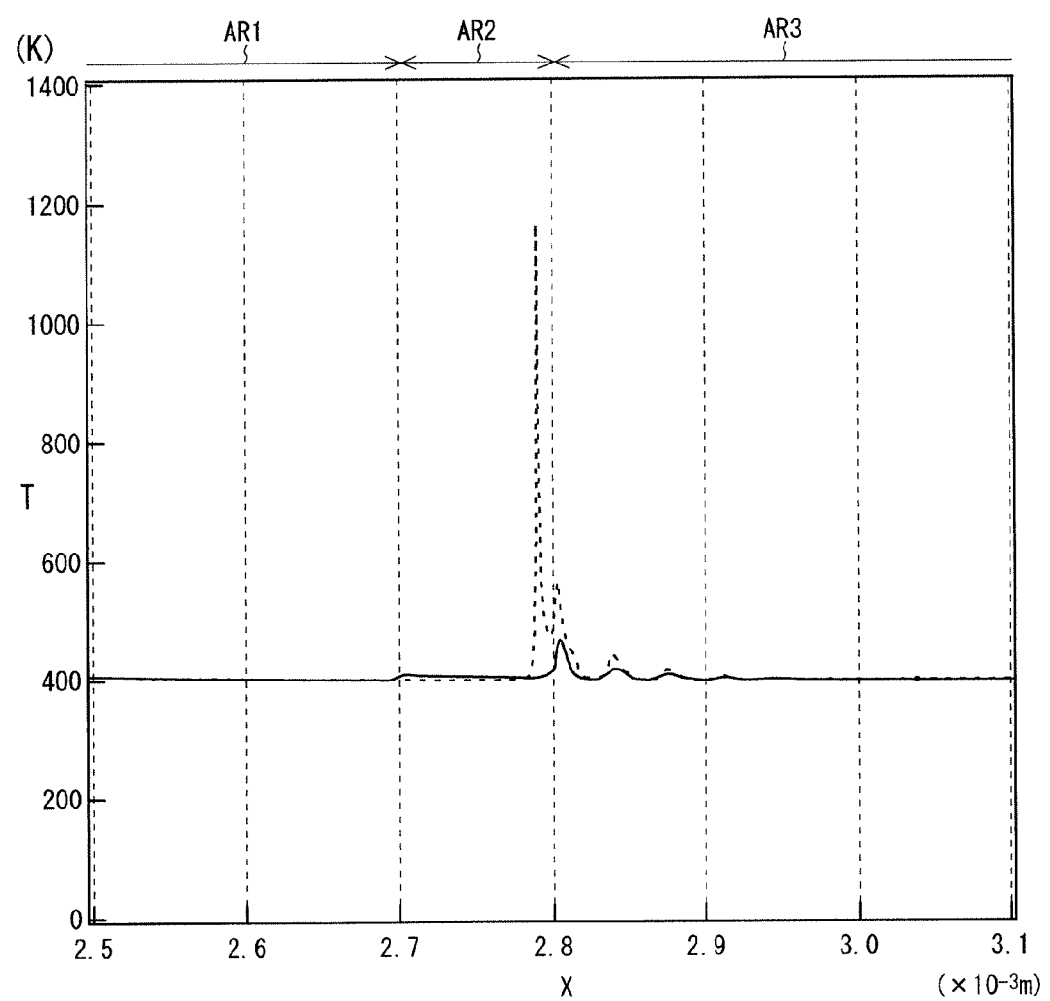

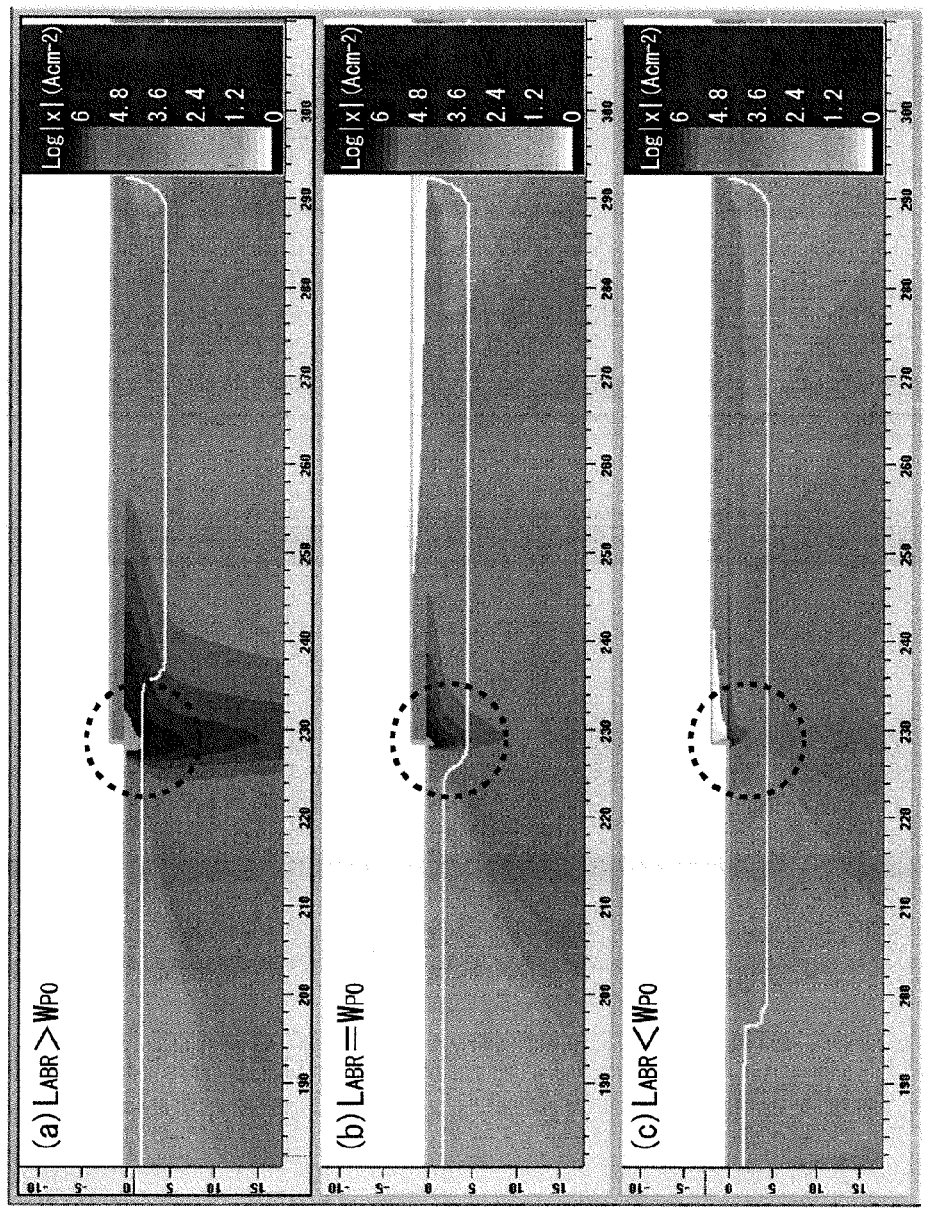

F I G . 4 4
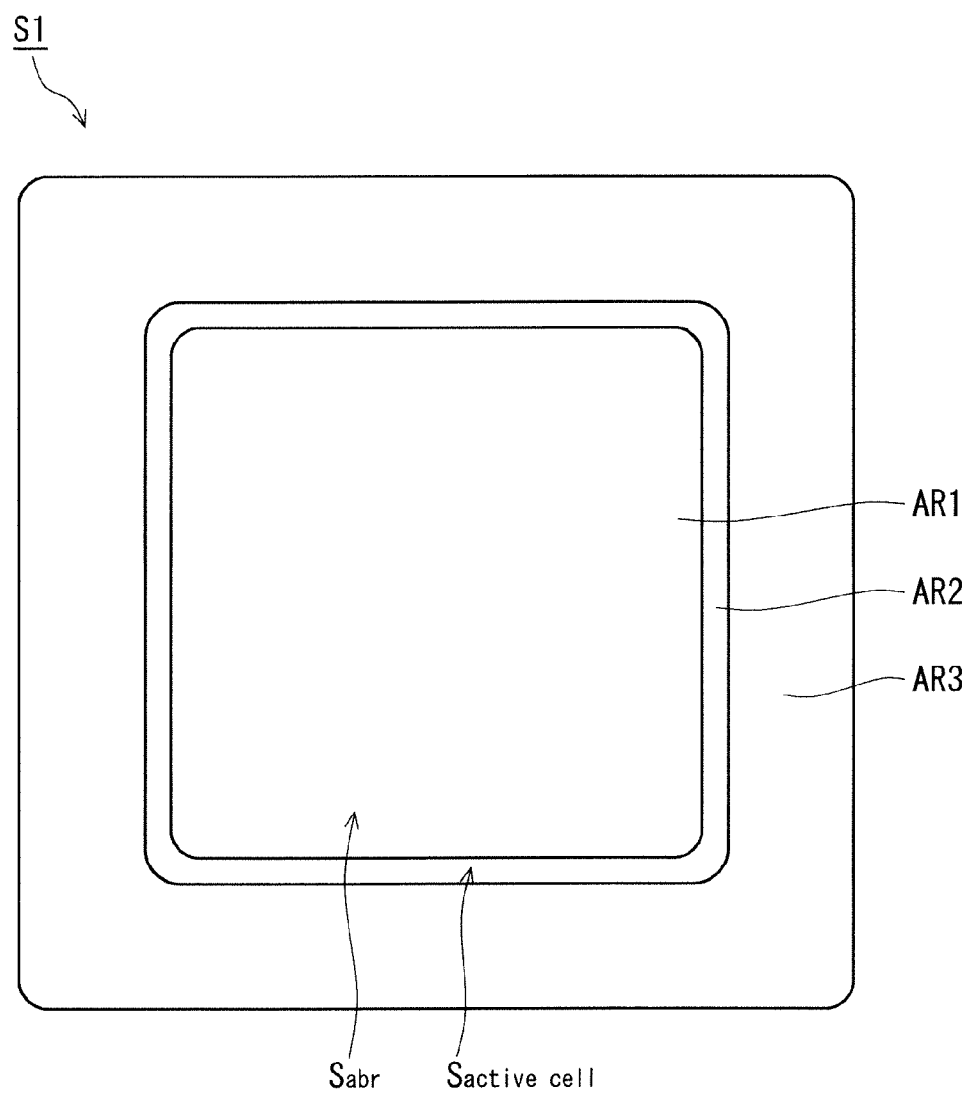

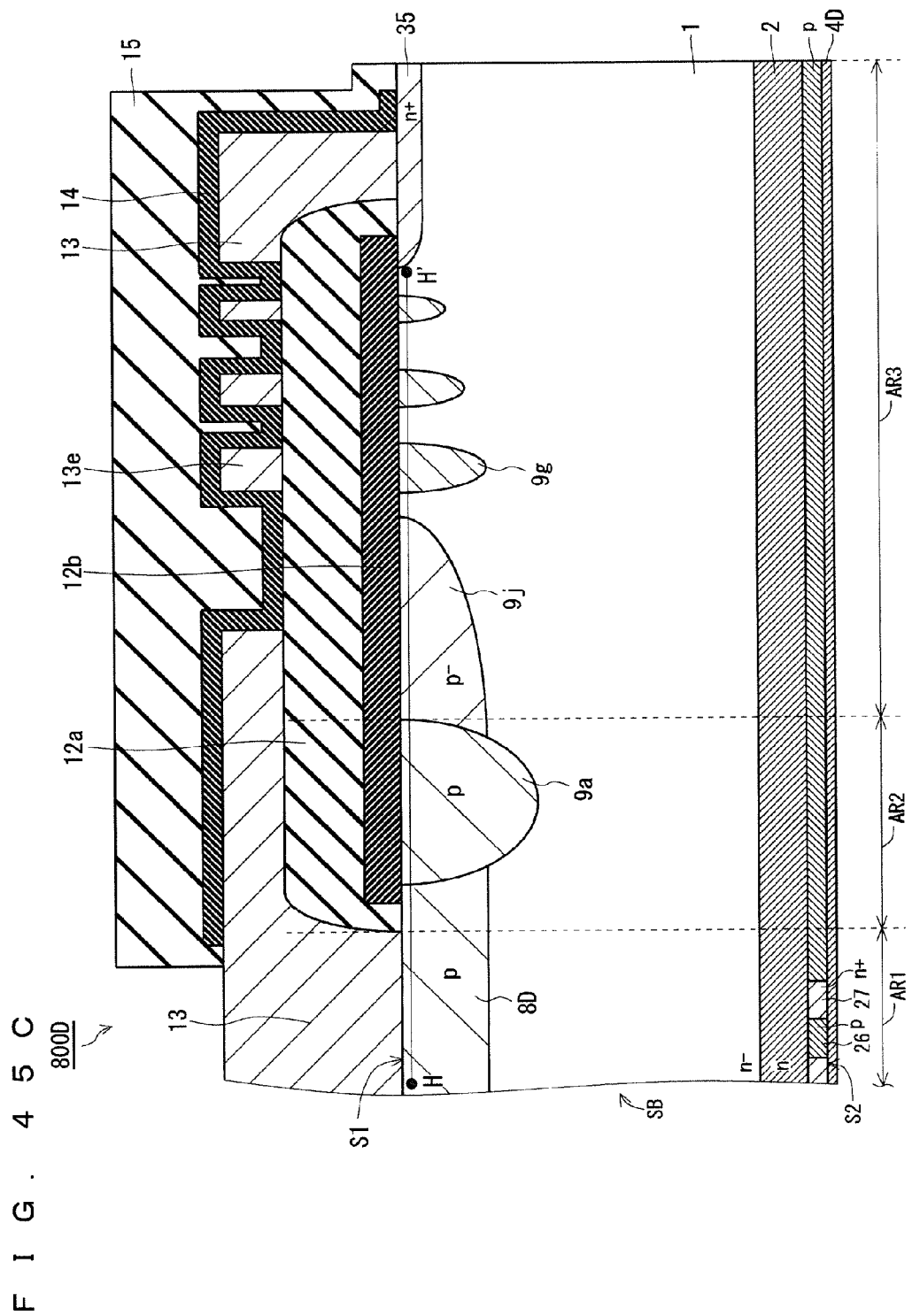

F I G. 4 6 A
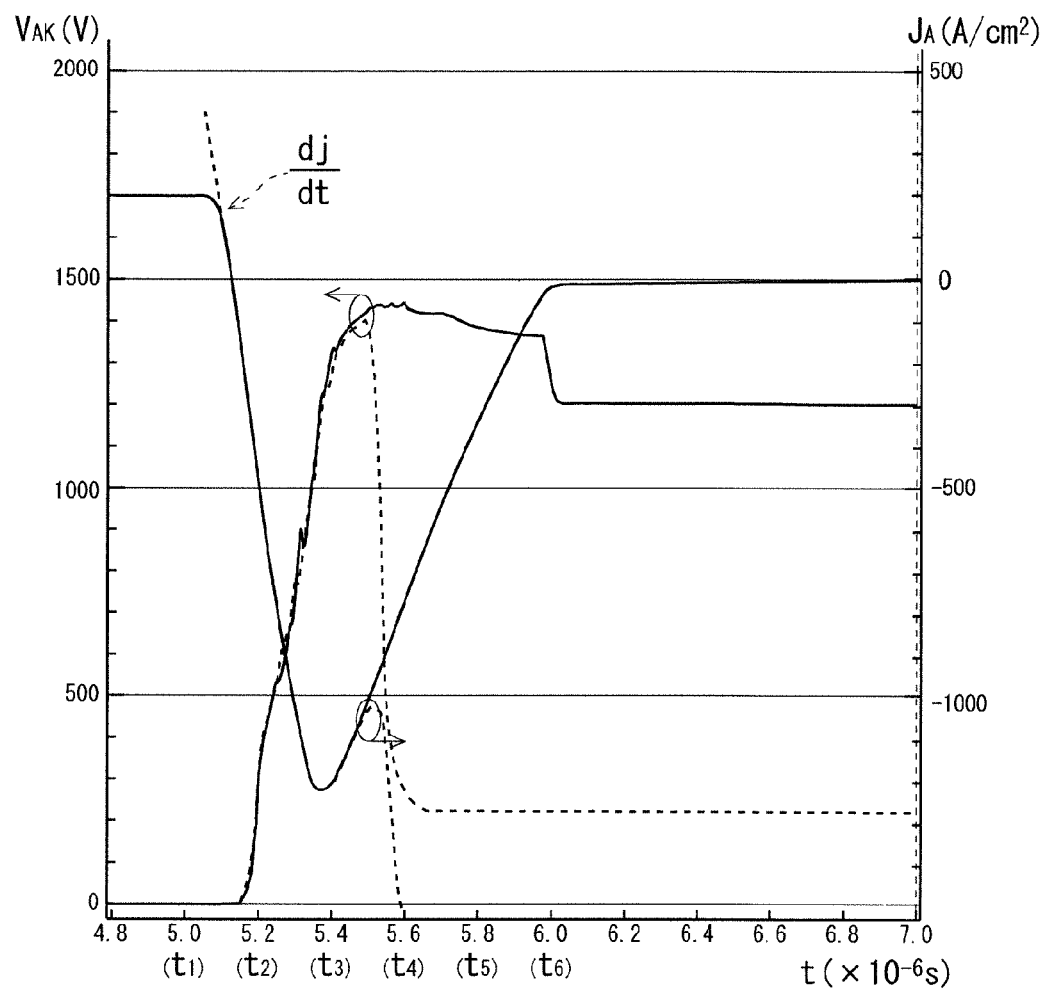

F I G . 4 7 A
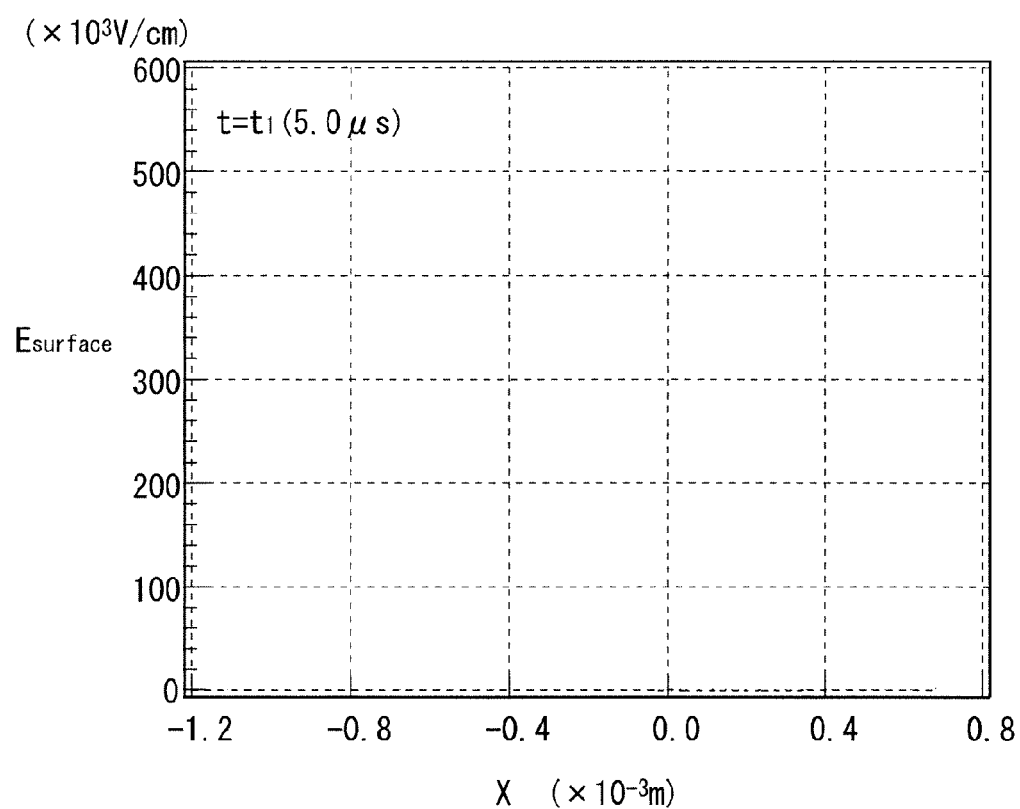

F I G . 4 7 C
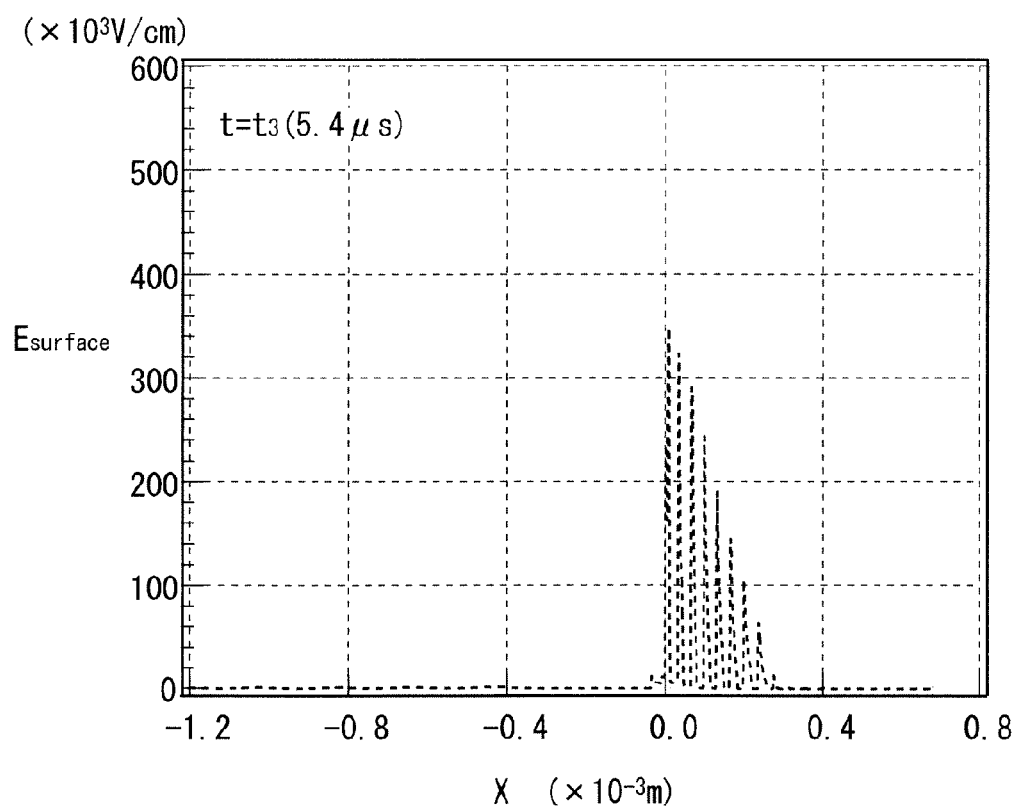

F I G . 4 7 D
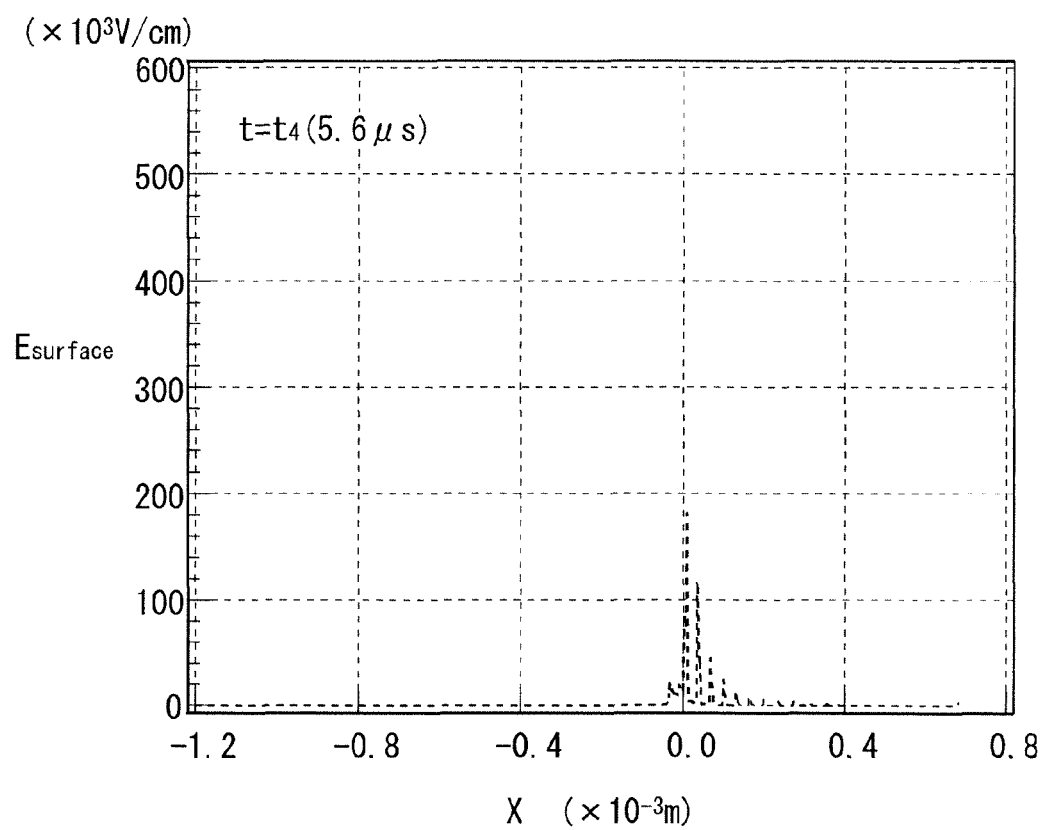

F I G. 4 8 A
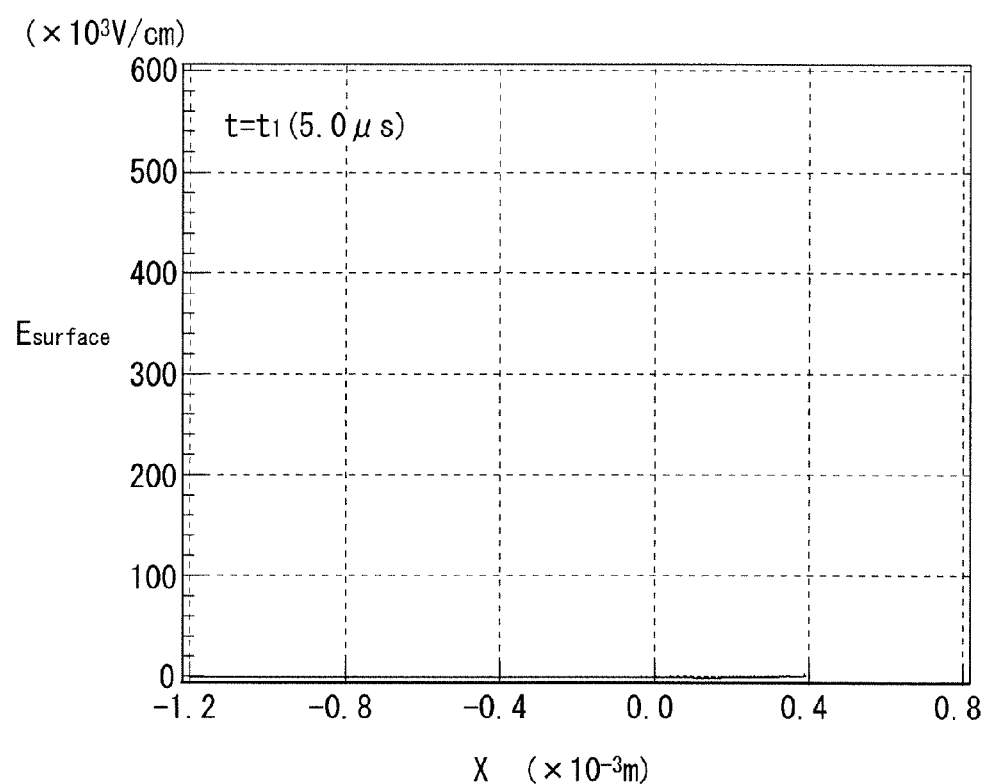

F I G . 4 8 B
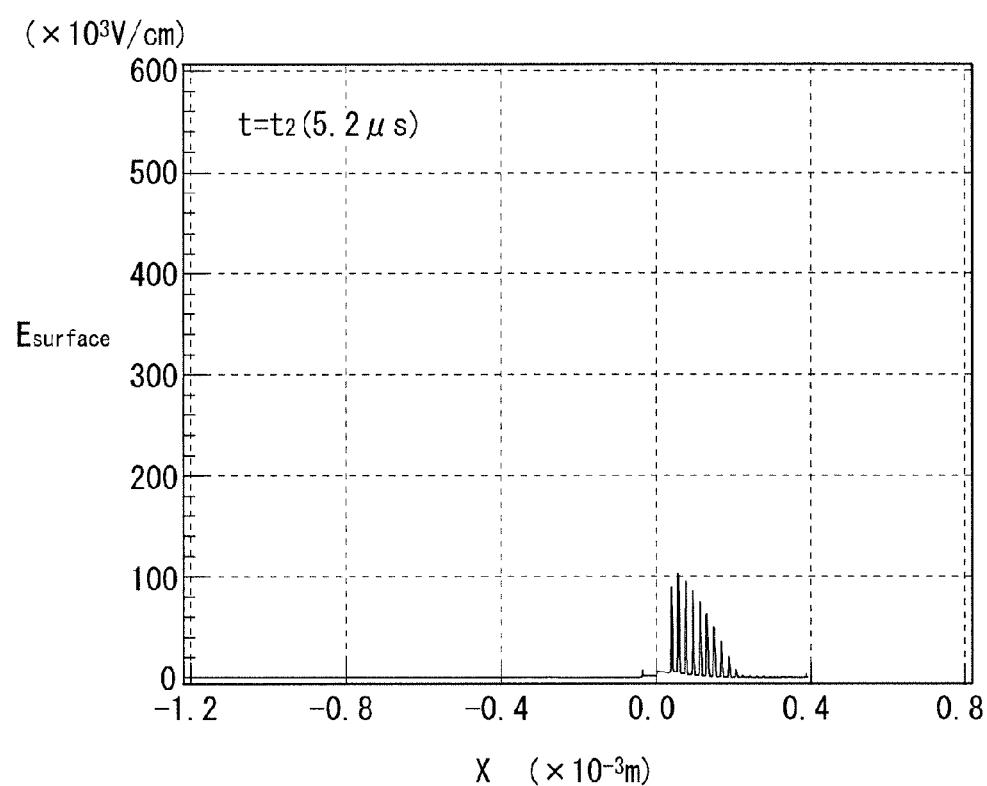

F I G . 4 8 D
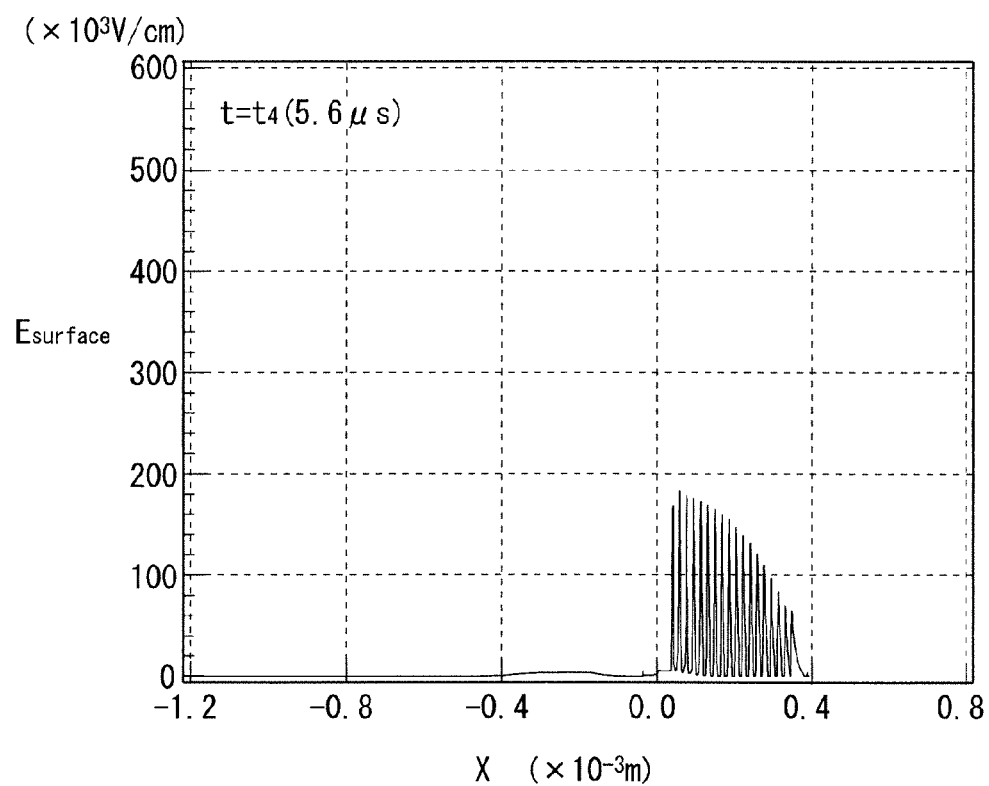

F I G . 4 9 C
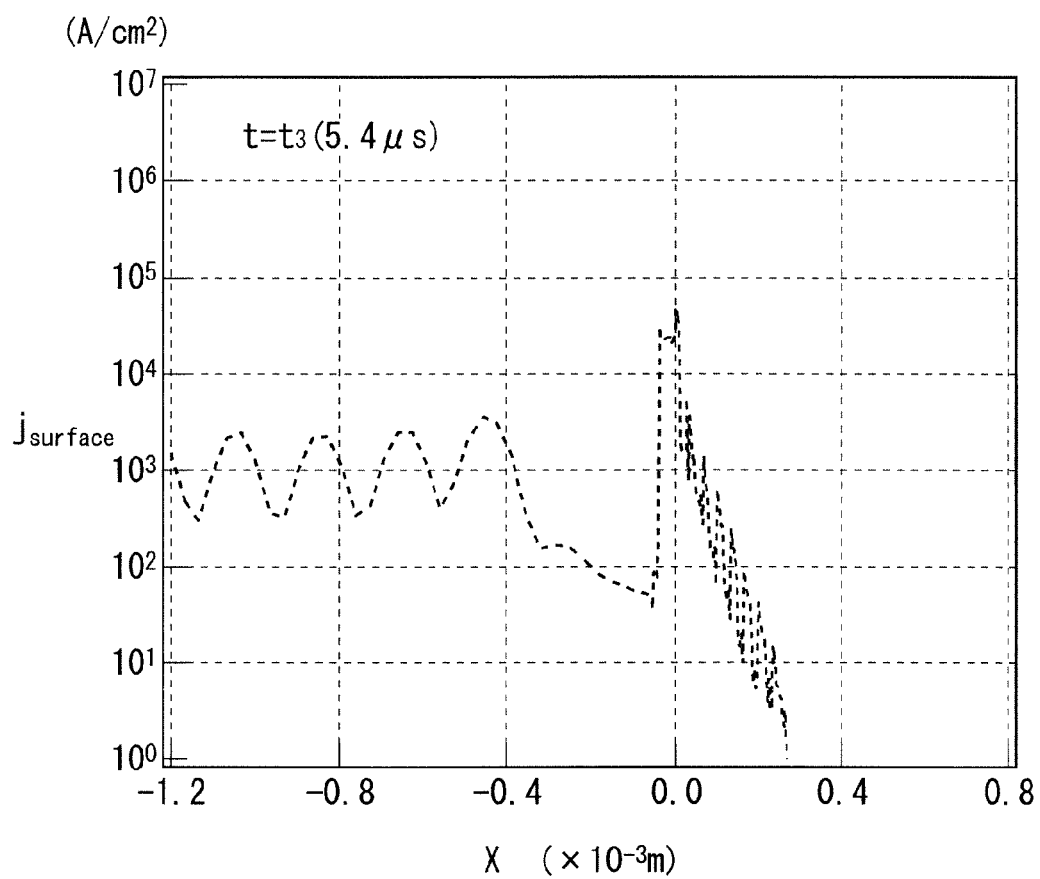

F I G. 5 0 A
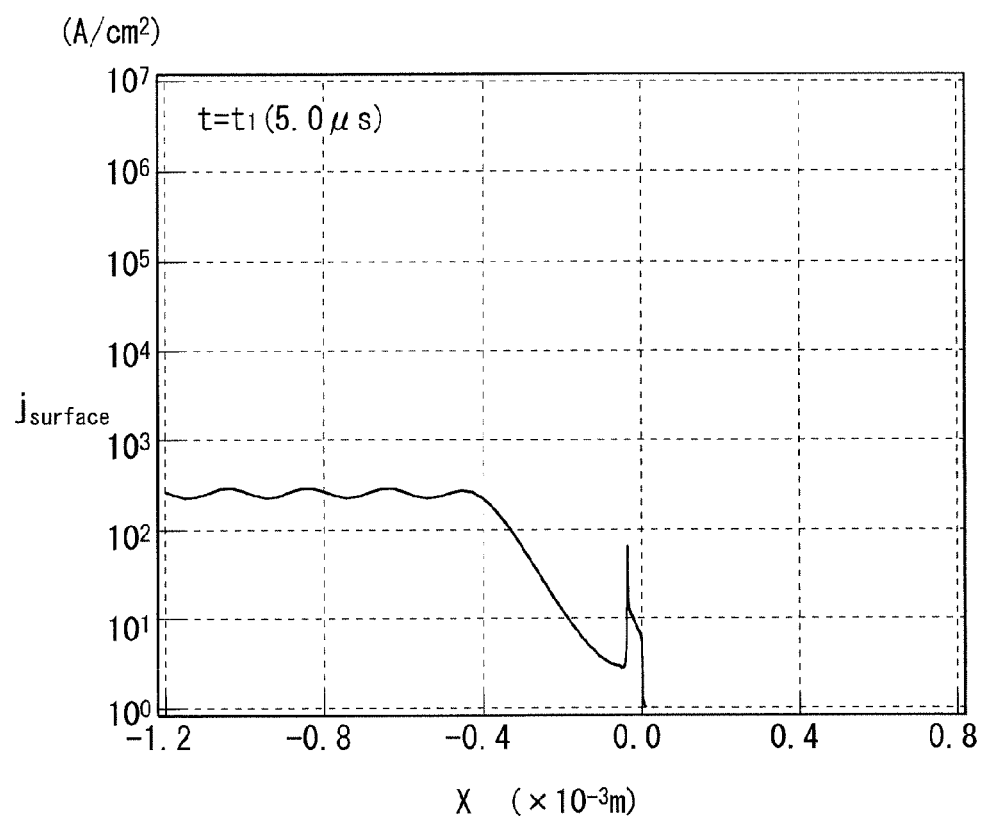

F I G . 5 0 D
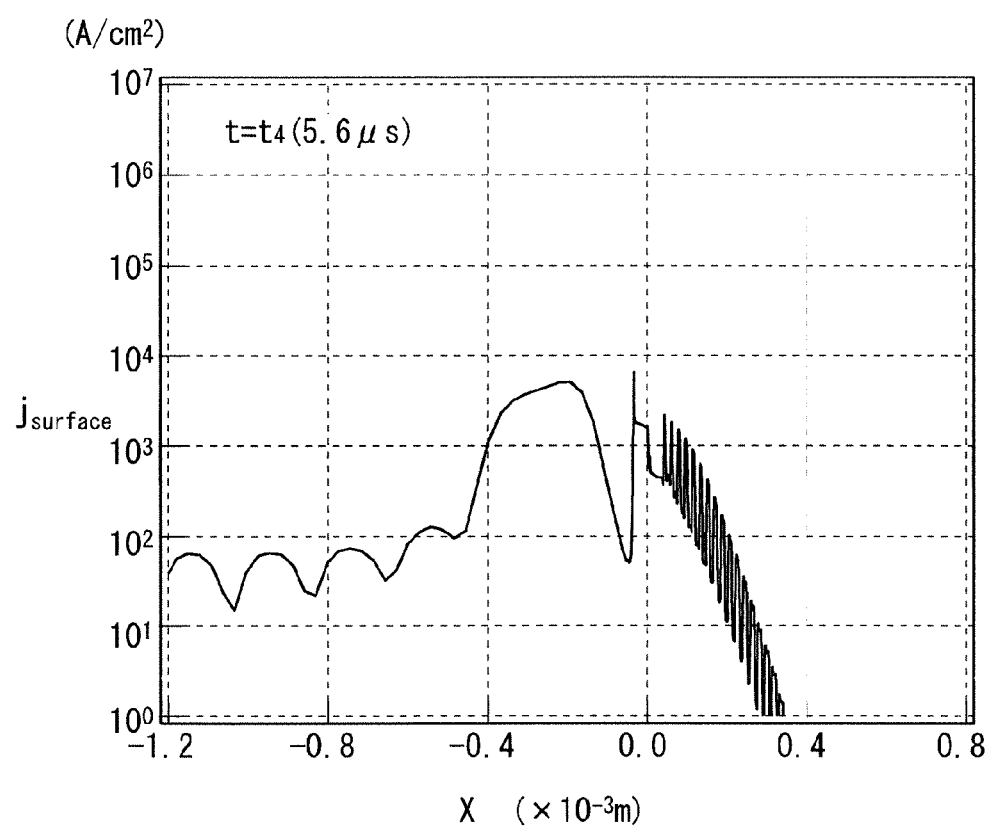

F I G . 5 0 F
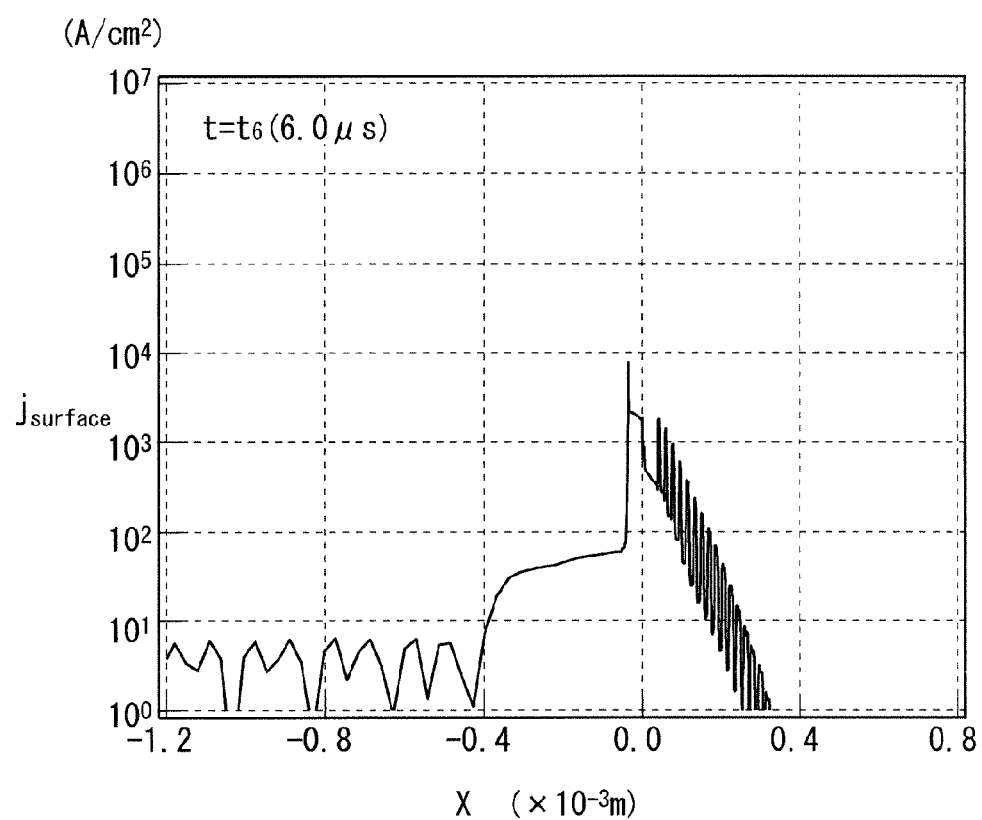

F I G. 5 1 B
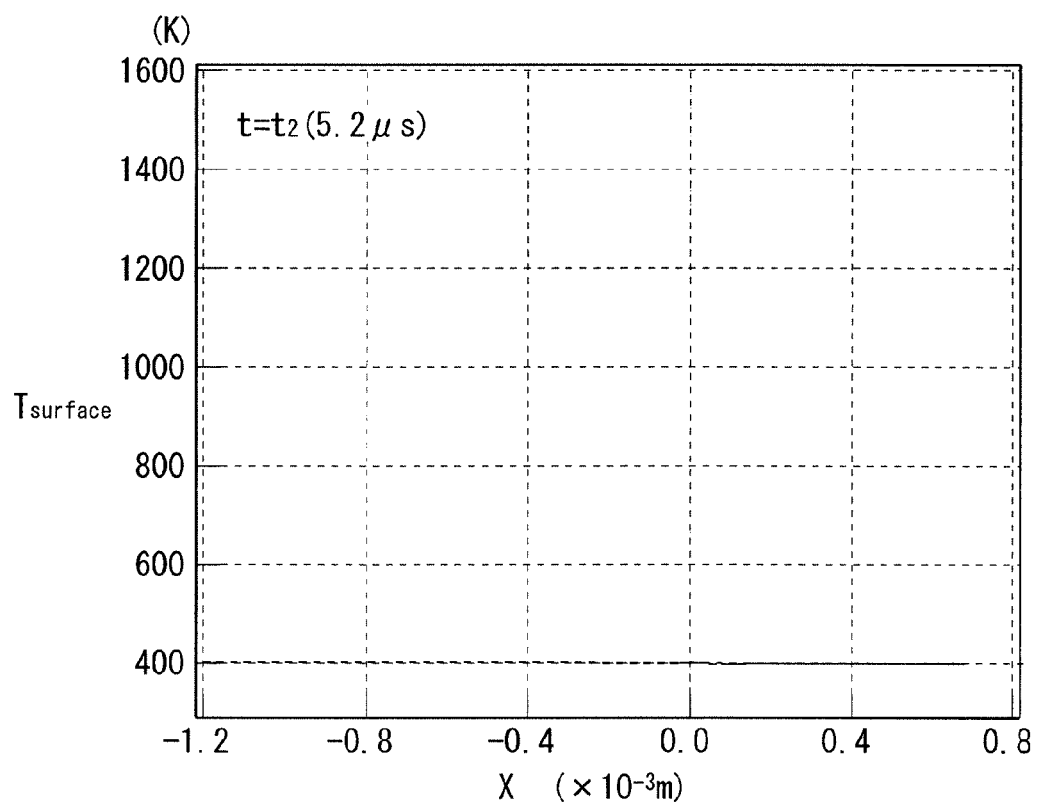

F I G. 5 1 C
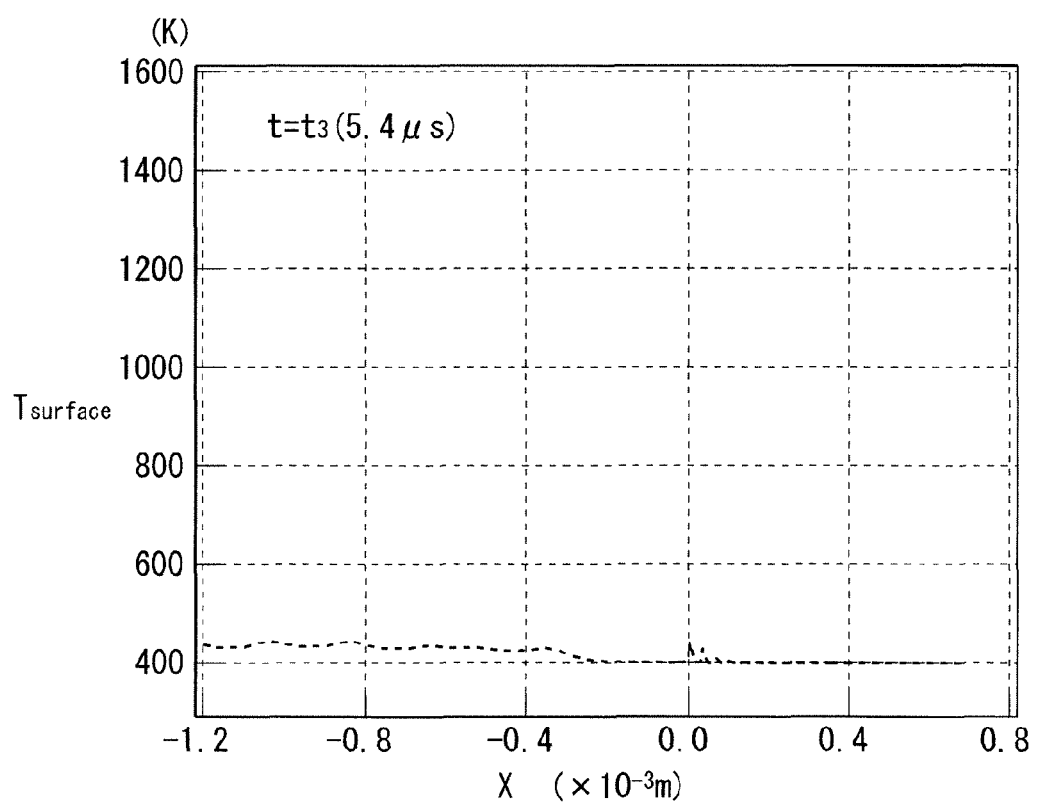

F I G. 5 1 D
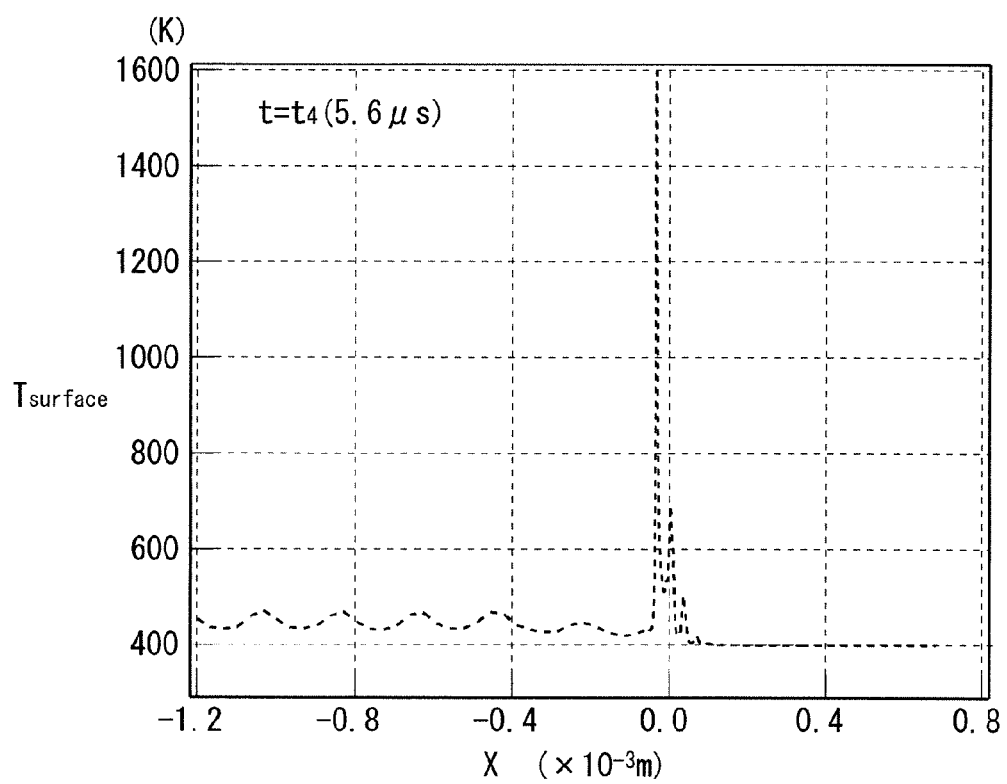

F I G . 5 2 A
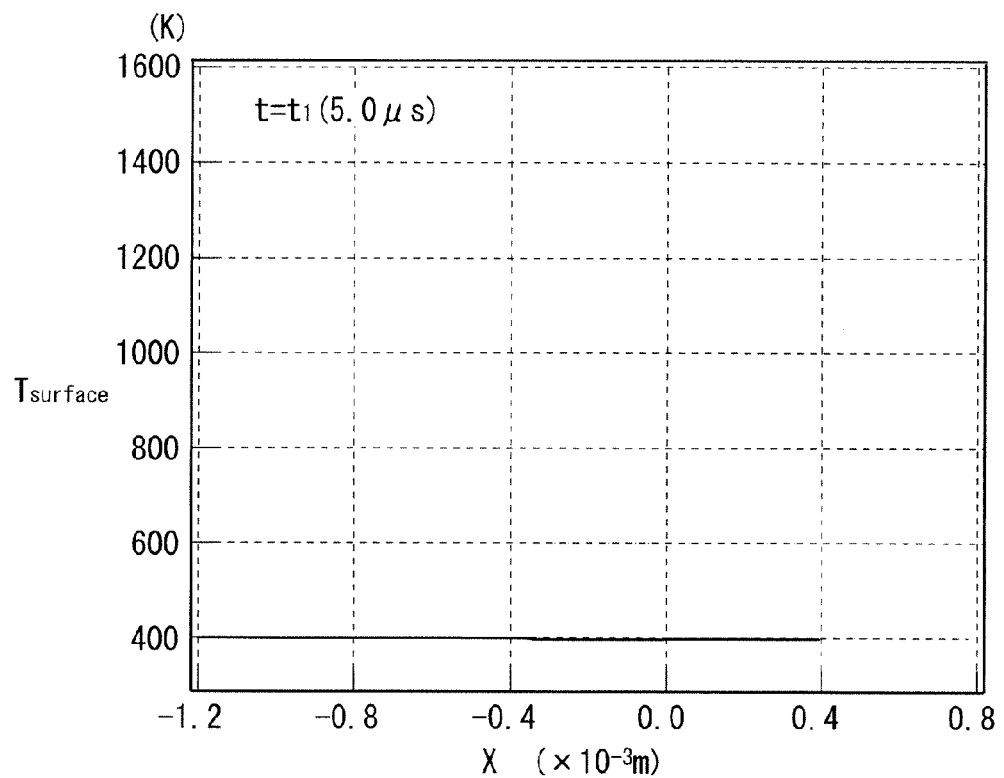

F I G. 5 2 D
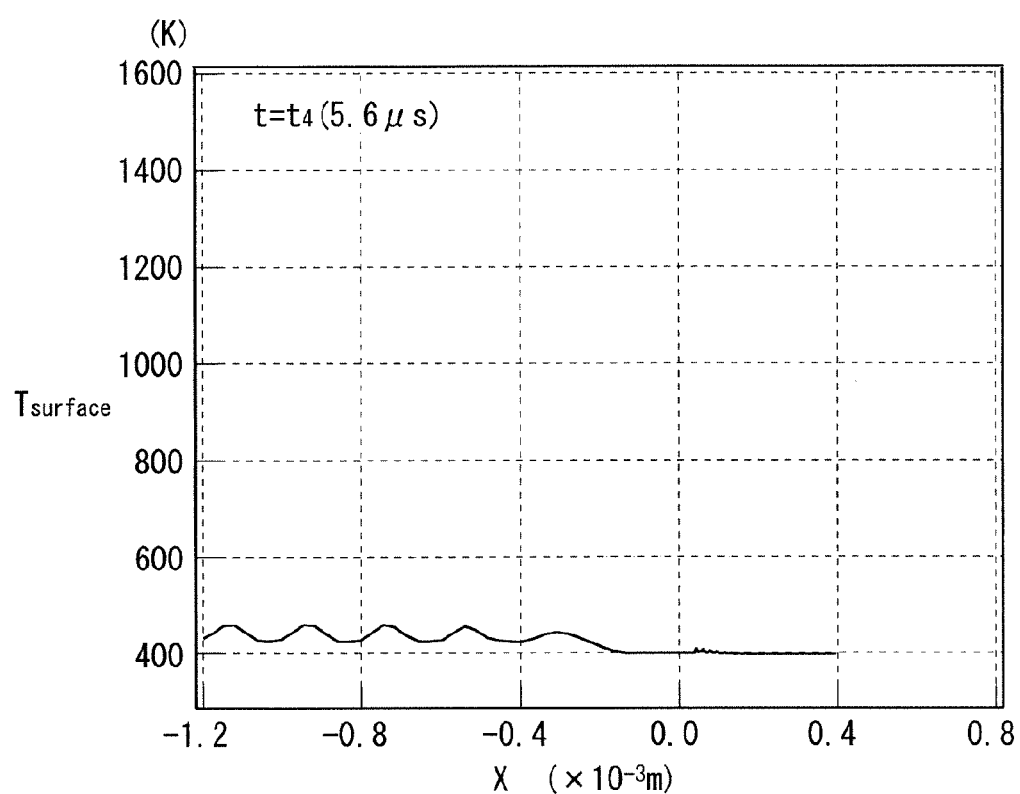

F I G . 5 2 E
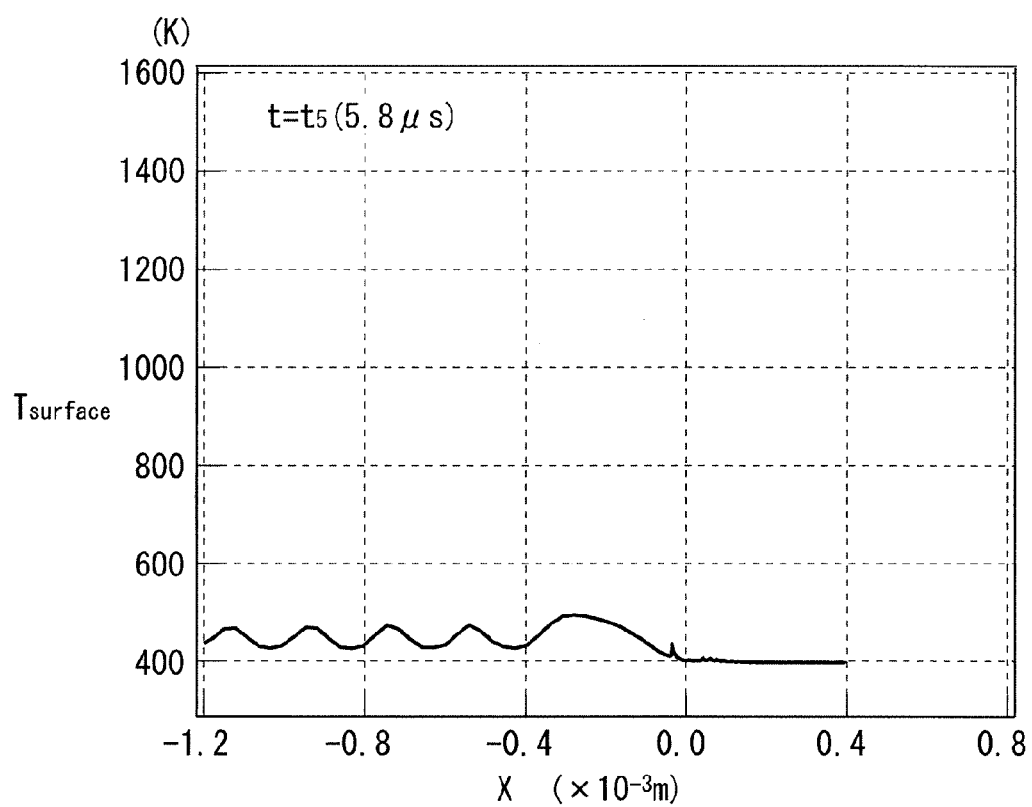

POWER SEMICONDUCTOR DEVICE

TECHNICAL FIELD

The present invention relates to a power semiconductor device.

BACKGROUND ART

According to Japanese Patent Application Laid-Open No. 2012-231011 (Patent Document 1), an extraction region is disposed between a transistor region and a termination region disposed around the transistor region in an insulated gate bipolar transistor (IGBT). A p-type layer is provided on an n⁻-type drift layer in the extraction region. The p-type layer is connected to an emitter electrode. A dummy gate electrode is provided on the p-type layer with an insulating film therebetween. The dummy gate electrode is connected to a gate electrode. A current density easily increases in a boundary between the extraction region and the termination region, namely, at an outer end of the p-type layer, during a turn-off operation of the IGBT. As a result, thermal breakdown may occur. A current breaking capability during the turn-off operation is limited by this phenomenon.

According to the description in the above-mentioned Patent Document 1, a lattice defect is introduced in the termination region. Thus, carrier annihilation in the termination region is facilitated, which reduces the carrier concentration in the extraction region during the turn-off operation of the IGBT. Therefore, the depletion from the p-type layer toward the collector is accelerated, and electric field strength decreases. As a result, the current breaking capability during the turn-off operation of the IGBT improves. On the other hand, no lattice defect is introduced in the extraction region. This intends to avoid an increase in ON-state voltage. As described above, the technology in the above-mentioned Patent Document 1 intends to improve the breaking capability during the turn-off operation without adversely affecting the ON-state voltage of the IGBT.

PRIOR ART DOCUMENT

Patent Document

Patent Document 1: Japanese Patent Application Laid-Open No. 2012-231011

SUMMARY OF INVENTION

Problems to be Solved by the Invention

Both of a low ON-state voltage and a high breaking capability can be obtained to some extent by the above-mentioned technology. However, a trade-off relationship between both of them in an IGBT still needs improvements and further needs technologies. Other power semiconductor devices have similar challenges, and diodes, for example, need improvements in the trade-off relationship between the low ON-state voltage and the high breaking capability during a recovery operation.

The present invention has been made in view of the above mentioned problems, and an object thereof is to provide a power semiconductor device having both of a low ON-state voltage and a high breaking capability.

Means to Solve the Problems

A power semiconductor device according to one aspect of the present invention has an active area, an interface area provided around a periphery of the active area, and an edge termination area provided around a periphery of the interface area. The power semiconductor device includes a semiconductor substrate, an emitter electrode, and a collector electrode. The semiconductor substrate has a first surface and a second surface opposite to the first surface, the first surface and the second surface each being located across the active area, the interface area, and the edge termination area. The semiconductor substrate includes a drift region, a collector region, and a buffer layer. The drift region is provided across the active area, the interface area, and the edge termination area and has a first conductivity type. The collector region is provided only in the active area, forms part of the second surface, and has a second conductivity type different from the first conductivity type. The buffer layer has a portion located between the drift region and the collector region in the active area, has the first conductivity type, and has an impurity concentration higher than an impurity concentration in the drift region. The emitter electrode is provided in the active area and contacts the first surface of the semiconductor substrate. The collector electrode is provided on the second surface of the semiconductor substrate and contacts the collector region.

A power semiconductor device according to another aspect of the present invention has an active area, an interface area provided around a periphery of the active area, and an edge termination area provided around a periphery of the interface area. The power semiconductor device includes a semiconductor substrate, a first electrode and a second electrode. The semiconductor substrate has a first surface and a second surface opposite to the first surface, the first surface and the second surface each being located across the active area, the interface area, and the edge termination area. The semiconductor substrate includes a drift region and a well region. The drift region is provided across the active area, the interface area, and the edge termination area and has a first conductivity type. The well region is provided on the first surface, is at least partially included in the interface area, has an end portion on the first surface between the interface area and the edge termination area, and has a second conductivity type different from the first conductivity type. The first electrode is provided in the active area and contacts the first surface of the semiconductor substrate. The first surface has an electrical path formed thereon, the electrical path connecting the first electrode to the end portion of the well region with a region of the second conductivity type, the electrical path having a resistance region that is formed of the well region and has a width L. The width L is set so as to suppress a local temperature rise in one of both ends of the resistance region by sharing the temperature rise at both the ends during a breaking operation of the power semiconductor device. The second electrode contacts the second surface of the semiconductor substrate.

Effects of the Invention

In the power semiconductor device according to the one aspect of the present invention, the collector region is provided only in the active area. In other words, the collector region is not provided in the edge termination area and the interface area. This suppresses a local temperature rise in the boundary between the interface area and the edge termination area on the first surface of the semiconductor substrate in a dynamic breaking operation of the power semiconductor device. At this time, the configuration of the active area does not need to be greatly modified, which prevents an adverse effect such as an increase in the ON-state voltage. Consequently, the power semiconductor device has both of the low ON-state voltage and the high breaking capability.

In the power semiconductor device according to the other aspect of the present invention, a local temperature rise in one of ends of the resistance region is suppressed by sharing the temperature rise at both the ends, during a turn-off operation of the power semiconductor device. This distributes the temperature rise, so that the local temperature rise in the boundary between the interface area and the edge termination area can be reduced. At this time, the configuration of the active area does not need to be greatly modified, which prevents an adverse effect such as an increase in the ON-state voltage on the ON-state voltage. Consequently, both of the low ON-state voltage and the high breaking capability can be obtained.

These and other objects, features, aspects and advantages of the present invention will become more apparent from the following detailed description of the present invention when taken in conjunction with the accompanying drawings.

BRIEF DESCRIPTION OF DRAWINGS

FIG. 3 is a plan view schematically showing a configuration of a second surface of a semiconductor substrate in FIG. 2.

FIG. 4 is a partial cross-sectional view showing a structure A of an IGBT in a comparative example when seen similarly to FIG. 2 (IGBT 900A, structure A).

FIG. 5 is a partial cross-sectional view schematically showing a structure C of an IGBT as a power semiconductor device in the first embodiment of the present invention when seen similarly to FIG. 2 (IGBT 900C, structure C).

FIG. 6 is a partial cross-sectional view schematically showing a structure D of an IGBT as a power semiconductor device in the first embodiment of the present invention when seen similarly to FIG. 2 (IGBT 900D, structure D).

FIG. 12A is a distribution chart showing a current potential and a hole concentration when $t=t_{ON}$ (FIG. 11) in the structure A as the comparative example.

FIG. 12B is a distribution chart showing the current potential and the hole concentration when $t=t_{peak}$ (FIG. 11) in the structure A as the comparative example.

FIG. 13A is a distribution chart showing the current potential and the hole concentration when $t=t_{ON}$ (FIG. 11) in the structure D as the embodiment.

FIG. 13B is a distribution chart showing the current potential and the hole concentration when $t=t_{peak}$ (FIG. 11) in the structure D as the embodiment.

FIG. 14A is a distribution chart showing a carrier concentration inside the device when $t=t_{peak}$ (FIG. 11) in the structure A as the comparative example.

FIG. 15A is a distribution chart showing the carrier concentration inside the device when $t=t_{peak}$ (FIG. 11) in the structure A as the comparative example.

FIG. 15B is a distribution chart showing the carrier concentration inside the device when $t=t_{peak}$ (FIG. 11) in the structure D as the embodiment.

FIG. 16A is a distribution chart showing the carrier concentration inside the device when $t=t_{tail}$ (FIG. 11) in the structure A as the comparative example.

FIG. 17A is a distribution chart showing electric field strength inside the device when $t=t_{ON}$ (FIG. 11) in the structure A as the comparative example.

FIG. 17B is a distribution chart showing the electric field strength inside the device when $t=t_{ON}$ (FIG. 11) in the structure D as the embodiment.

FIG. 18A is a distribution chart showing the electric field strength inside the device when $t=t_{peak}$ (FIG. 11) in the structure A as the comparative example.

FIG. 18B is a distribution chart showing the electric field strength inside the device when $t=t_{peak}$ (FIG. 11) in the structure D as the embodiment.

FIG. 30B is a graphical representation showing simulation results of peak temperatures inside the devices in the comparative example (broken line) having the structure A and in the embodiment (solid line) having the structure G.

FIG. 31A is a distribution chart showing simulation results of temperatures inside the devices in the comparative example having the structure A and in the embodiment having the structure G.

FIG. 31B is a distribution chart showing simulation results of impact ionization rates inside the devices in the comparative example having the structure A and in the embodiment having the structure G.

FIG. 34 is a graphical representation showing relationships between a breakdown voltage class $V_{class}$ and a necessary width $W_{edge}$ of an edge termination area in the comparative example having the structure A and in the embodiment having the structure G.

FIG. 40A is a graphical representation showing a relationship between a position X along a G-G' line (FIGS. 37 and 38) and the current density $J_A$ at a time $t_d$ (FIG. 39) in each of the embodiment (solid line) and the comparative example (broken line).

FIG. 40B is a graphical representation showing a relationship between the position X along the G-G' line (FIGS. 37 and 38) and a temperature T of an upper surface S1 of the device in each of the embodiment (solid line) and the comparative example (broken line).

FIG. 42B is an enlarged view of each of the broken line regions in FIG. 42A.

FIG. 44 is a plan view for describing the area $S_{active\ cell}$ of the active area and the area $S_{arb}$ of the ballast resistance region.

FIG. 45C is a partial cross-sectional view showing a configuration of a modification of FIG. 45A (diode 800D).

FIG. 46A is a graphical representation showing simulation results of waveforms of a voltage $V_{AK}$ and a current density $J_A$ during a recovery operation in each of the embodiment (solid line) and the comparative example (broken line).

FIG. 47A is a graphical representation showing a relationship between a position X in a H-H' line (FIG. 38) of the comparative example and electric field strength $E_{surface}$ when t=$t_1$ (FIGS. 46A and 46B).

FIG. 47C is a graphical representation showing a relationship between the position X in the H-H' line (FIG. 38) of the comparative example and the electric field strength $E_{surface}$ when t=$t_3$ (FIGS. 46A and 46B).

FIG. 47D is a graphical representation showing a relationship between the position X in the H-H' line (FIG. 38) of the comparative example and the electric field strength $E_{surface}$ when t=$t_4$ (FIGS. 46A and 46B).

FIG. 48A is a graphical representation showing a relationship between a position X in a H-H' line (FIG. 45A) of the embodiment and the electric field strength $E_{surface}$ when $t=t_1$ (FIGS. 46A and 46B).

FIG. 48B is a graphical representation showing a relationship between the position X in the H-H' line (FIG. 45A) of the embodiment and the electric field strength $E_{surface}$ when $t=t_2$ (FIGS. 46A and 46B).

FIG. 48D is a graphical representation showing a relationship between the position X in the H-H' line (FIG. 45A) of the embodiment and the electric field strength $E_{surface}$ when $t=t_4$ (FIGS. 46A and 46B).

FIG. 49C is a graphical representation showing a relationship between the position X in the H-H' line (FIG. 38) of the comparative example and the current density $j_{surface}$ when $t=t_3$ (FIGS. 46A and 46B).

FIG. 50A is a graphical representation showing a relationship between the position X in the H-H' line (FIG. 45A) of the embodiment and the current density $j_{surface}$ when $t=t_1$ (FIGS. 46A and 46B).

FIG. 50D is a graphical representation showing a relationship between the position X in the H-H' line (FIG. 45A) of the embodiment and the current density $j_{surface}$ when $t=t_4$ (FIGS. 46A and 46B).

FIG. 50F is a graphical representation showing a relationship between the position X in the H-H' line (FIG. 45A) of the embodiment and the current density $j_{surface}$ when $t=t_6$ (FIGS. 46A and 46B).

FIG. 51B is a graphical representation showing a relationship between the position X in the H-H' line (FIG. 38) of the comparative example and the temperature $T_{surface}$ of the upper surface S1 of the device when $t=t_2$ (FIGS. 46A and 46B).

FIG. 51C is a graphical representation showing a relationship between the position X in the H-H' line (FIG. 38) of the comparative example and the temperature $T_{surface}$ of the upper surface S1 of the device when $t=t_3$ (FIGS. 46A and 46B).

FIG. 51D is a graphical representation showing a relationship between the position X in the H-H' line (FIG. 38) of the comparative example and the temperature $T_{surface}$ of the upper surface S1 of the device when $t=t_4$ (FIGS. 46A and 46B).

FIG. 52A is a graphical representation showing a relationship between the position X in the H-H' line (FIG. 45A) of the embodiment and the temperature $T_{surface}$ of an upper surface S1 of the device when $t=t_1$ (FIGS. 46A and 46B).

FIG. 52D is a graphical representation showing a relationship between the position X in the H-H' line (FIG. 45A) of the embodiment and the temperature $T_{surface}$ of the upper surface S1 of the device when $t=t_4$ (FIGS. 46A and 46B).

FIG. 52E is a graphical representation showing a relationship between the position X in the H-H' line (FIG. 45A) of the embodiment and the temperature $T_{surface}$ of the upper surface S1 of the device when $t=t_5$ (FIGS. 46A and 46B).

DESCRIPTION OF EMBODIMENTS

Figure 1:
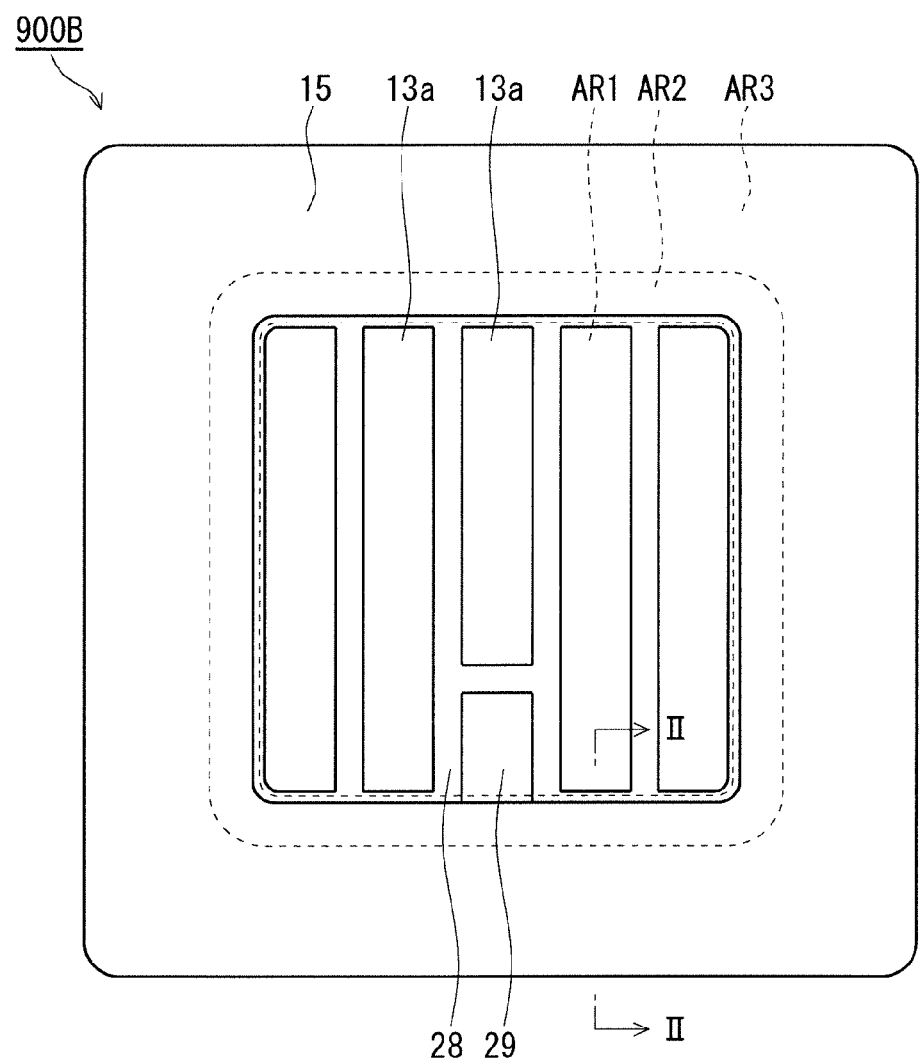
FIG. 1 is a plan view schematically showing a structure B of an IGBT as a power semiconductor device in a first embodiment of the present invention.

Hereinafter, embodiments of the present invention will be described with reference to the drawings. The same or corresponding portions have the same reference numerals in the drawings, and their description will not be repeated.

First Embodiment (About IGBT 900B)

With reference to FIG. 1, an IGBT 900B (power semiconductor device) has an active area AR1, an interface area AR2 provided around a periphery of the active area AR1, and an edge termination area AR3 provided around a periphery of the interface area AR2. The active area AR1 is a portion having basic functions of the power semiconductor device, and a portion having basic functions of the IGBT in this embodiment. The edge termination area AR3 is a portion for increasing breakdown voltage characteristics, stability, and reliability in a static state of the power semiconductor device and for keeping breakdown strength in a dynamic state. The interface area AR2 is a portion connecting the active area AR1 and the edge termination area AR3 to each other and a particularly important portion for keeping the breakdown strength in a dynamic state.

The active area AR1 of the IGBT 900B includes emitter electrodes 13a having an emitter potential, a gate pad 29 having a gate potential, and a gate wiring portion 28 extending from the gate pad 29.

Figure 2:
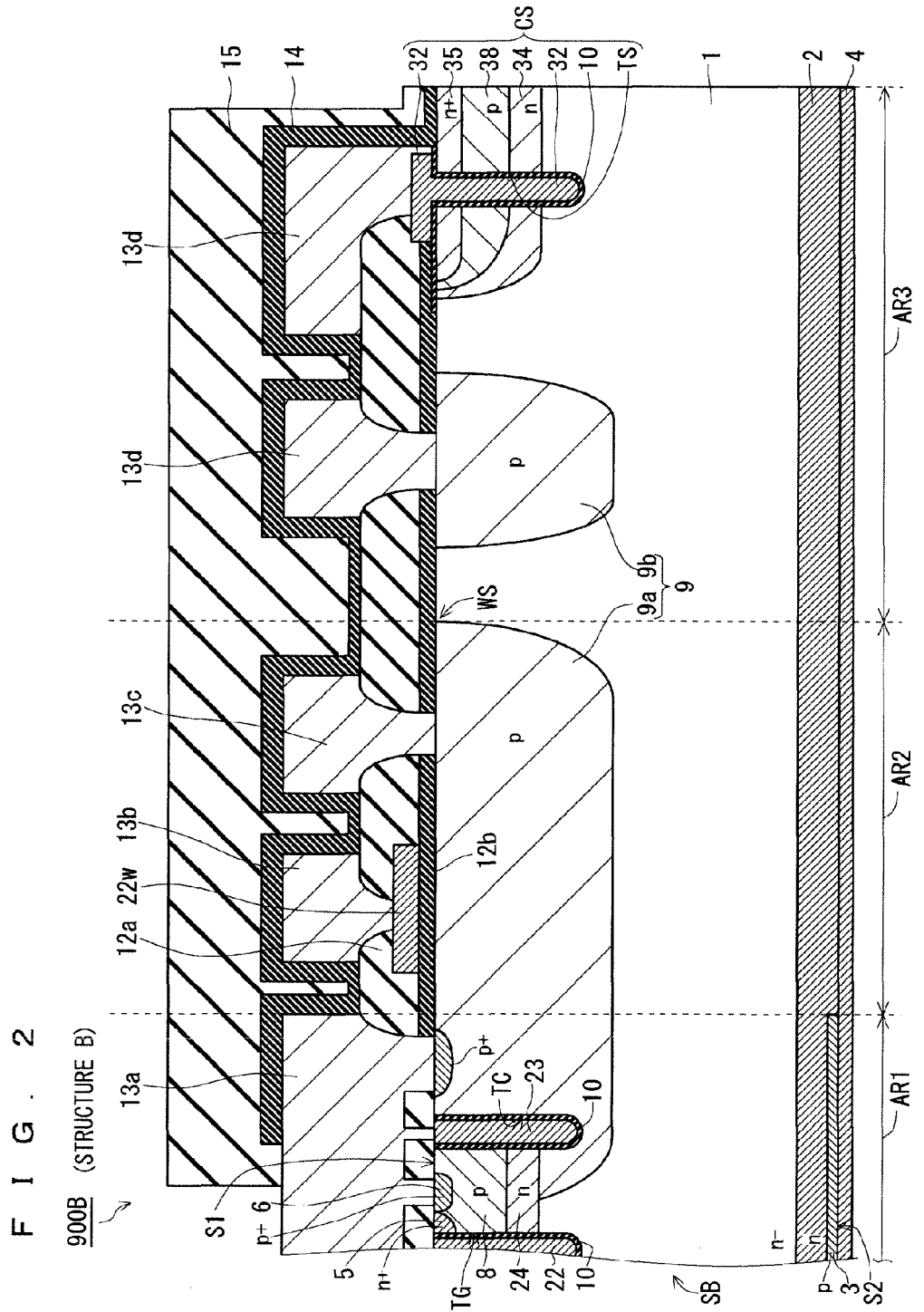
FIG. 2 is a schematic partial cross-sectional view taken along a II-II line in FIG. 1 (IGBT 900B, structure B).

With reference to FIG. 2, a structure (referred to as a structure B) of the IGBT 900B is described. FIG. 2 shows a cross-sectional structure taken along a II-II line in FIG. 1. The IGBT 900B includes a substrate SB (semiconductor substrate), an emitter electrode 13a (first electrode), a gate connecting electrode 13b, electrodes 13c, 13d, a collector electrode 4 (second electrode), a gate electrode 22, a gate wiring layer 22w, capacitor electrodes 23, 32, a trench insulating film 10, interlayer insulating films 12a, 12b, and passivation films 14, 15. In this embodiment, the substrate SB is made of silicon (Si). The substrate SB has an upper surface S1 (first surface) and a lower surface S2 (second surface opposite to the first surface). The upper surface S1 and the lower surface S2 are each located across the active area AR1, the interface area AR2, and the edge termination area AR3. The substrate SB includes an n$^-$-drift layer 1 (drift region), an n-buffer layer 2, a p-collector layer 3 (collector region), an n$^+$-emitter layer 5, a p$^+$-layer 6, a p-base layer 8, an n-layer 24, and a p-guard ring 9.

The n$^-$-drift layer 1 is provided across the active area AR1, the interface area AR2, and the edge termination area AR3. The n$^-$-drift layer 1 has an n-type (first conductivity type) and has an impurity concentration of, for example, approximately $1 \times 10^{12}$ to $1 \times 10^{15}$ cm$^{-3}$. A floating zone (FZ) wafer manufactured by a FZ method or an epitaxial wafer manufactured by an epitaxial method may be prepared for the n$^-$-drift layer 1. In this case, a portion of the substrate SB except for the n$^-$-drift layer 1 may be formed by ion implantation and an annealing technique.

The n-layer 24 is provided between the n$^-$-drift layer 1 and the p-base layer 8. The n-layer 24 has the n-type, has an impurity peak concentration at a concentration higher than the impurity concentration in the n$^-$-drift layer 1 and at a concentration lower than the p-base layer 8, and has the impurity peak concentration of, for example, approximately $1 \times 10^{15}$ to $1 \times 10^{17}$ cm$^{-3}$. A depth position that the n-layer 24 reaches from the upper surface S1 of the substrate SB is deeper than the p-base layer 8 and has a depth of, for example, approximately 0.5 to 1.0 μm deeper than the p-base layer 8.

The n-buffer layer 2 has a portion located between the n$^-$-drift layer 1 and the p-collector layer 3 in the active area AR1, and has a portion located between the n$^-$-drift layer 1 and the collector electrode 4 in the interface area AR2 and the edge termination area AR3 in this embodiment. The n-buffer layer 2 has the n-type, has an impurity concentration higher than the impurity concentration in the n$^-$-drift layer 1, and has an impurity peak concentration of, for example, approximately $1 \times 10^{15}$ to $1 \times 10^{17}$ cm$^{-3}$. A depth position that the n-buffer layer 2 reaches from the lower surface S2 of the substrate SB is, for example, approximately 1.5 to 50 μm.

The n$^-$-drift layer 1, the n-layer 24, and the buffer layer 2, which have been described above, as a whole form a region having the n-type (first region). In addition, one or both of the n-layer 24 and the n-buffer layer 2 may be omitted.

The p-base layer 8 (second region) is provided on the region (first region) including the n$^-$-drift layer 1 and the n-layer 24, and provided directly above the n-layer 24 in this embodiment. A depth position that the p-base layer 8 reaches from the upper surface S1 of the substrate SB is deeper than the n$^+$-emitter layer 5 and shallower than the n-layer 24. The p-base layer 8 has a p-type (second conductivity type different from the first conductivity type) and has an impurity peak concentration of, for example, approximately $1 \times 10^{16}$ to $1 \times 10^{18}$ cm$^{-3}$.

The n$^+$-emitter layer 5 (third region) is provided on the p-base layer 8 and disposed on the upper surface S1. The n$^+$-emitter layer 5 has a depth of approximately 0.2 to 1.0 μm, for example. The n$^+$-emitter layer 5 has the n-type and has an impurity peak concentration of, for example, approximately $1 \times 10^{18}$ to $1 \times 10^{21}$ cm$^{-3}$.

The p$^+$-layer 6 is provided on the p-base layer 8 and disposed on the upper surface S1. The p$^+$-layer 6 has a surface impurity concentration of approximately $1 \times 10^{18}$ to $1 \times 10^{21}$ cm$^{-3}$, for example. A depth position that the p$^+$-layer 6 reaches from the upper surface S1 of the substrate SB is preferably the same as or deeper than the n$^+$-emitter layer 5.

The p-collector layer 3 is provided only in the active area AR1 and forms part of the lower surface S2. The p-collector layer 3 has the p-type and has a surface impurity concentration of, for example, approximately $1 \times 10^{16}$ to $1 \times 10^{20}$ cm$^{-3}$. The p-collector layer 3 has a depth of, for example, approximately 0.3 to 1.0 μm from the lower surface S2 of the substrate SB.

The p-guard ring 9 is provided on the upper surface S1 and has the p-type. The p-guard ring 9 has a p-well region 9a and a p-edge region 9b. The p-well region 9a is connected to the emitter electrode 13a through the p$^+$-layer 6 provided on the upper surface S1 in the active area AR1. The p-well region 9a is at least partially included in the interface area AR2 and has an end portion on the upper surface S1 between the interface area AR2 and the edge termination area AR3. The p-well region 9a further increases the breaking capability of the IGBT 900B.

The p-edge region 9b is included in the edge termination area AR3 and is located far from the interface area AR2. In addition, FIG. 2 schematically shows only one p-edge region 9b, but a plurality of p-edge regions 9b are designed so as to be disposed at an interval from each other according to voltage being maintained.

A gate trench TG and a capacitor trench TC are provided on the upper surface S1 of the substrate SB in the active area AR1. A side wall of the gate trench TG faces each of the n$^-$-drift layer 1 and the n-layer 24 (first region), the p-base layer 8, and the n$^+$-emitter layer 5. A side wall of the capacitor trench TC faces each of the n$^-$-drift layer 1, the n-layer 24, and the p-base layer 8 in this embodiment. The capacitor trench TC located on the outermost side of the active area AR1 reaches the inside of the p-well region 9a of the p-guard ring 9. The trench insulating film 10 covers the gate trench TG and the capacitor trench TC of the substrate SB.

The gate electrode 22 has a portion filling the gate trench TG with the trench insulating film 10 therebetween and faces the p-base layer 8 between the n$^+$-emitter layer 5 and the n-layer 24 (first region) with the trench insulating film 10 between the p-base layer 8 and the gate electrode 22. The capacitor electrode 23 has a portion filling the capacitor trench TC with the trench insulating film 10 therebetween. Providing the capacitor electrode 23 suppresses a density of saturation current in the IGBT 900B and suppresses an oscillation phenomenon of gate voltage when a load on the IGBT 900B is short-circuited. In addition, the capacitor trench TC and the capacitor electrode 23 may be omitted.

The interlayer insulating film 12a is provided on the upper surface S1 of the substrate SB. The emitter electrode 13a, the gate connecting electrode 13b, and the electrodes 13c, 13d are provided on the interlayer insulating film 12a. The emitter electrode 13a is provided in the active area AR1 and contacts the upper surface S1 of the substrate SB. Specifically, the emitter electrode 13a contacts each of the n$^+$-emitter layer 5 and the p$^+$-layer 6 through a contact hole provided in the interlayer insulating film 12a. The gate connecting electrode 13b contacts the gate wiring layer 22w through a contact hole. Thus, the gate connecting electrode 13b is short-circuited to the gate electrode 22 and thus has a gate potential. The electrode 13c contacts the p-well region 9a through a contact hole. The electrode 13c may be short-circuited to the emitter electrode 13a. The electrode 13d is a floating electrode and contacts the p-edge region 9b through a contact hole in the IGBT 900B.

The interlayer insulating film 12b is provided on the upper surface S1 of the substrate SB. The interlayer insulating film 12b insulates the substrate SB and the gate wiring layer 22w from each other. The interlayer insulating film 12b may have a portion located between part of the interlayer insulating film 12a and the substrate SB.

The collector electrode 4 is provided on the lower surface S2 of the substrate SB. The collector electrode 4 contacts the p-collector layer 3 in the active area AR1. The collector electrode 4 may contact the n-buffer layer 2 (more generally, the above-described first region) in the interface area AR2 and the edge termination area AR3, as shown in FIG. 2.

A channel stop structure CS is preferably provided in the edge termination area AR3. In this embodiment, an n-region 34, a p-region 38, and an n$^+$-region 35 are formed on the upper surface S1 of the substrate SB in the stated order. Further, a channel stop trench TS that penetrates these regions and reaches the n$^-$-drift layer 1 is provided on the upper surface S1. A channel stop electrode 32 is provided in the channel stop trench TS with the trench insulating film 10 therebetween. An electrode 13 having a floating potential may be provided on the channel stop electrode 32. Another structure may be used instead of the channel stop structure CS described above, and a structure formed of the n$^+$-region 35 may simply be used, for example.

With reference to FIG. 3, if a proportion of an area of the p-collector layer 3 to the lower surface S2 of the substrate SB is set to be λ, λ is preferably greater than or equal to 55% and less than or equal to 70%. In other words, 55≤100× $(X_p \times Y_p)/(X_n \times Y_n)$≤70 is preferably satisfied. Herein, $X_n$ and $Y_n$ represent the chip size of the IGBT 900B. When λ<55%, a hole injection from the p-collector layer 3 in the active area AR1 of the IGBT is insufficient, and thus an ON-state voltage ($V_{CE}$ (sat)) increases. When λ>70%, electric field strength of a weak spot (arrow WS in FIG. 2) due to a local temperature rise during a turn-off operation of the IGBT as described below is not reduced because a carrier injection from the p-collector layer 3 occurs in an ON state of the IGBT and causes carriers in the portion of the arrow WS, thereby reducing the breaking capability. Consequently, a value of λ has an appropriate range according to a balance of the performance of the IGBT. In addition, a proportion of a total of the active area AR1 and the interface area AR2 to the lower surface S2 preferably exceeds 70% and is, for example, approximately 75%.

(About IGBT 900A)

With reference to FIG. 4, an IGBT 900A in a comparative example is different from the IGBT 900B and has the p-collector layer 3 in another area in addition to the active area AR1. Specifically, the p-collector layer 3 is provided on the entire lower surface S2 of the substrate SB. The configuration except for this is almost the same as that of the IGBT 900B described above.

In the IGBT 900A, repetitive turn-off operations are likely to particularly cause a local temperature rise in the boundary between the active area AR1 and the interface area AR2 on the upper surface S1 of the substrate SB, namely, the arrow WS (FIG. 2). This phenomenon may limit the breaking capability of the IGBT 900A.

(About Action Effects of IGBT 900B)

The p-collector layer 3 is not provided in the edge termination area AR3 and the interface area AR2 in the IGBT 900B shown in FIG. 2 unlike the IGBT 900A. This suppresses a temperature rise in the arrow WS in the breaking operation of the IGBT 900B. The active area AR1 has the same configuration as that in the IGBT 900A and thus is not adversely affected in such a manner that ON-state voltage increases. Accordingly, the IGBT 900B has both of a low ON-state voltage and a high breaking capability.

(About IGBT 900C)

With reference to FIG. 5, a contact (see FIG. 4) of the electrode 13c to the p-well region 9a is not provided in an IGBT 900C. The p-well region 9a has an electrical path that connects the emitter electrode 13a to an end portion (arrow WS in the diagram) of the p-well region 9a with the p-type region on the upper surface S1. This electrical path crosses the interface area AR2 between the active area AR1 and the edge termination area AR3 and has a resistance region having a width $L_{EEBR}$. The entire resistance region is covered with the interlayer insulating film 12b. The width $L_{EEBR}$, which will be described below in detail, is set so as to suppress a local temperature rise in one of ends of the resistance region by sharing the temperature rise at both the ends during the breaking operation of the IGBT. A local temperature rise occurs in the portion of the arrow WS in the IGBT 900A (FIG. 4), whereas the resistance region is provided in the IGBT 900C to share a temperature rise at both the ends of the resistance region. Such effect is referred to as a ballast resistance, and the resistance region is also referred to as a ballast resistance region.

The configuration except for the above-described configuration is almost the same as that of the IGBT 900B described above.

Under the operation of the IGBT 900C, a local temperature rise occurs not only in a position of one end (right end of the width $L_{EEBR}$ in the diagram) of the ballast resistance region but also in a position of another end (left end of the width $L_{EEBR}$ in the diagram), the position of the one end corresponding to the position of the boundary between the interface area AR2 and the edge termination area AR3 (arrow WS in FIG. 5). This causes the temperature rise to be distributed, and thus the local temperature rise in the arrow WS can be reduced. Herein, the active area AR1 has the same configuration as that in the IGBT 900A, so that the ON-state voltage is not adversely affected. Accordingly, the IGBT 900C has both of a low ON-state voltage and a high breaking capability.

(About IGBT 900D)

With reference to FIG. 6, an IGBT 900D has the characteristics of each of the IGBTs 900B, 900C described above. Specifically, the p-collector layer 3 is provided only in the active area AR1 similarly to the IGBT 900B. Moreover, the ballast resistance region having the width $L_{EEBR}$ is provided similarly to the IGBT 900C. The configuration except for this is almost the same as that of the IGBT 900B or the IGBT 900C described above. The IGBT 900D can have both of a low ON-state voltage and a high breaking capability by the action of each of the IGBTs 900B and 900C described above.

(Verification of Effects of IGBT 900C)

Figure 7:
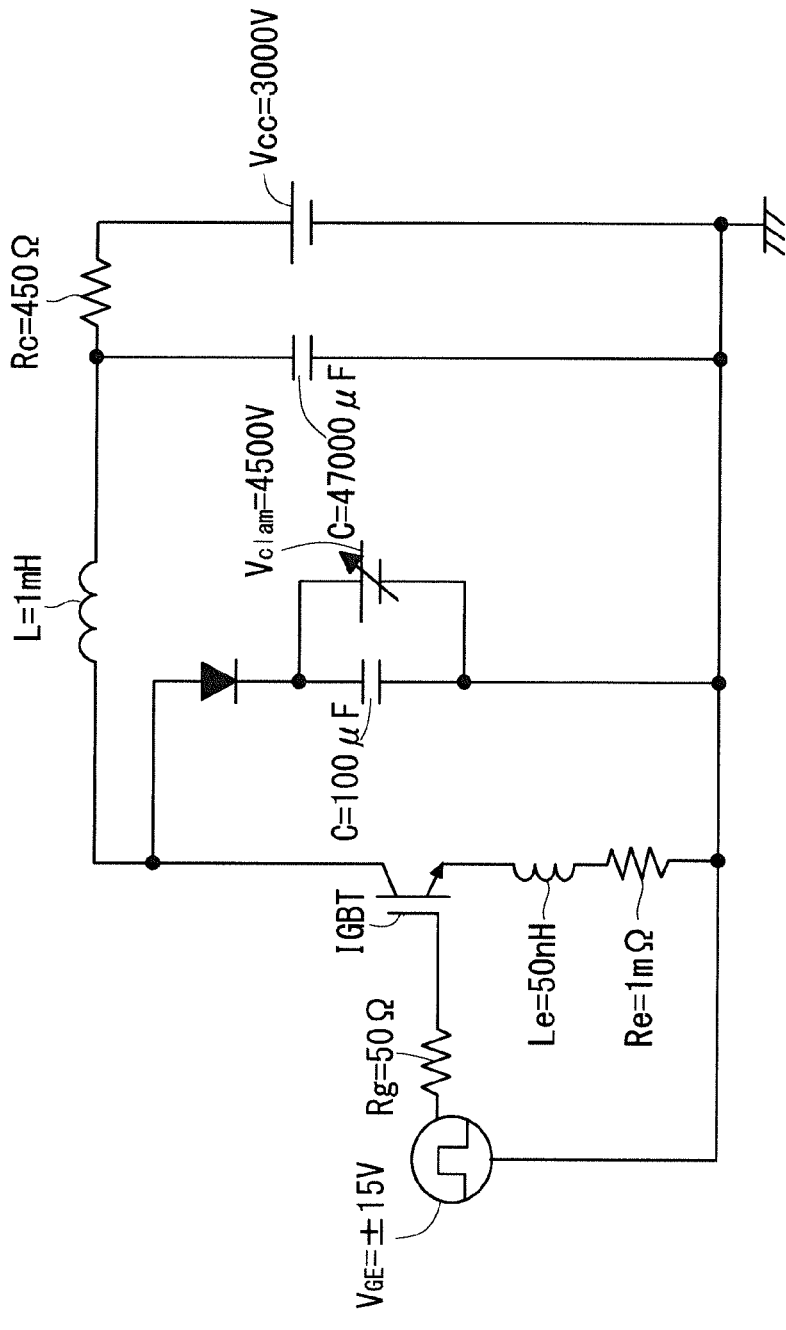
FIG. 7 is a diagram of a circuit used for a simulation of a turn-off operation of an IGBT.
Figure 8:
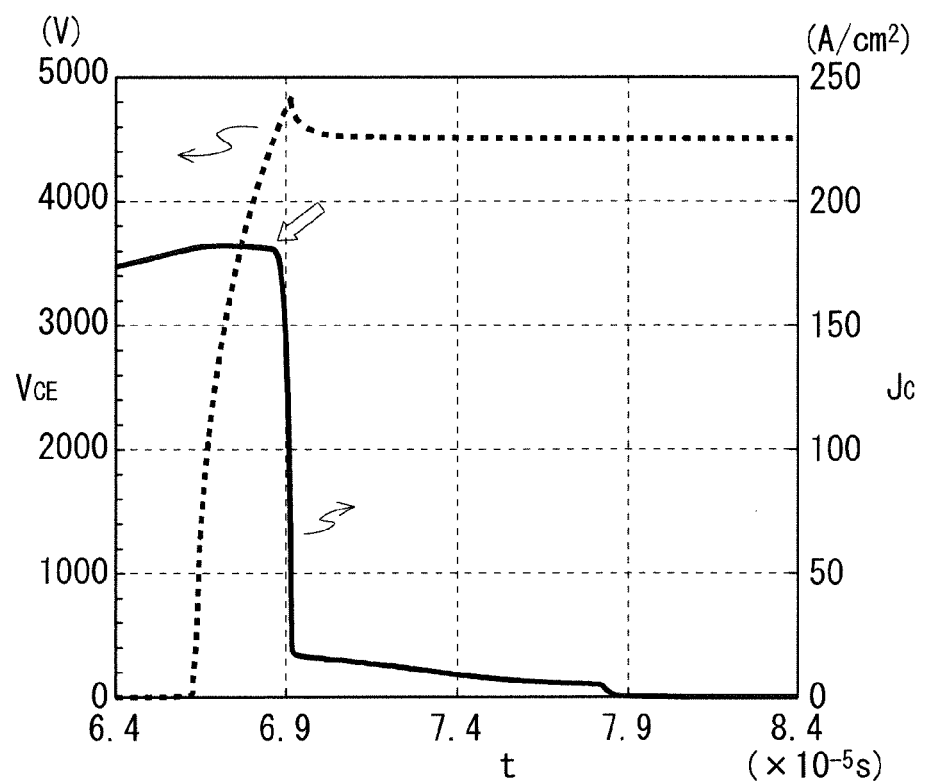
FIG. 8 is a graphical representation showing turn-off waveforms obtained from the simulation using the circuit in FIG. 7.
Figure 9:
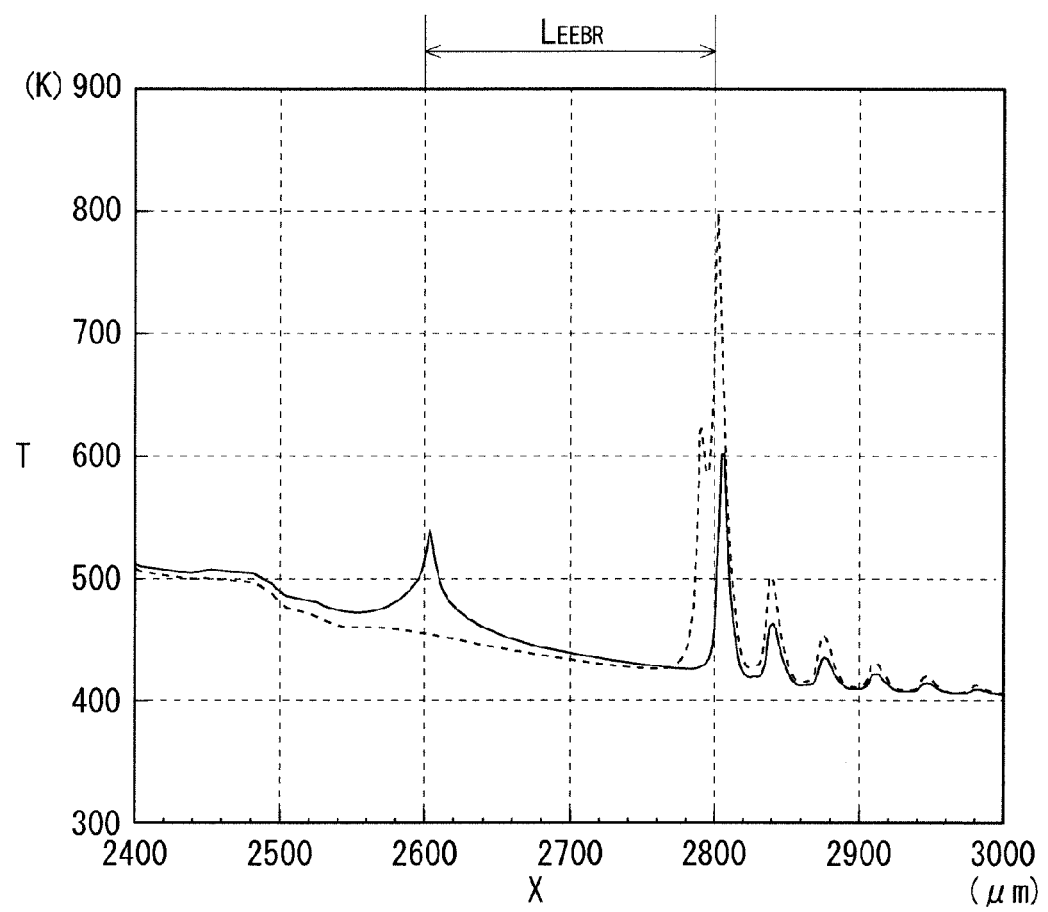
FIG. 9 is a graphical representation showing a temperature distribution of an upper surface S1 of a device in a D-D' line each in the structure A (broken line) of the comparative example and the structure C (solid line) of the embodiment.
Figure 10:
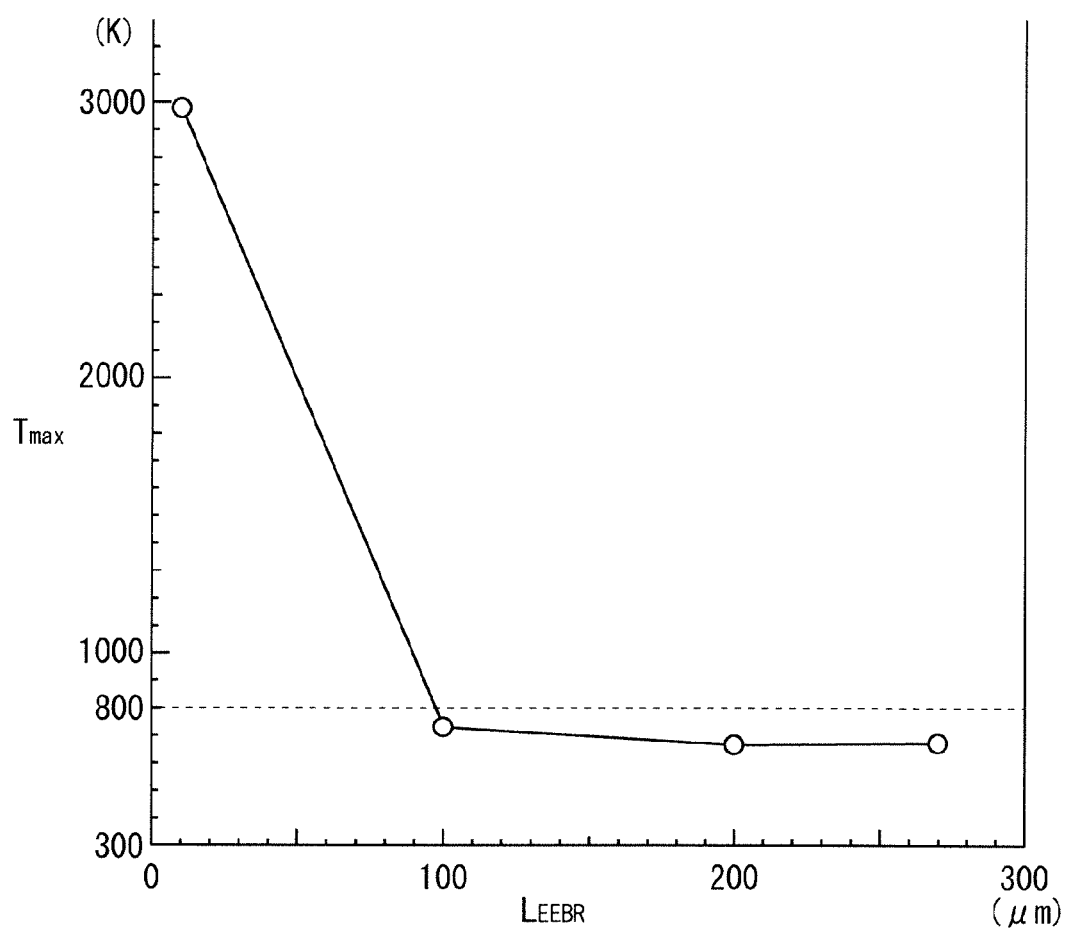
FIG. 10 is a graphical representation showing a relationship between a peak temperature $T_{max}$ in FIG. 9 and a ballast-resistance-region width ($L_{EEBR}$).

FIG. 7 is a diagram of a circuit used for a simulation of a turn-off operation of an IGBT of 4500V class. FIG. 8 shows turn-off waveforms obtained from using the circuit in FIG. 7, namely, relationships between a time t and a collector-emitter voltage $V_{CE}$. FIG. 9 shows a temperature distribution in the X coordinate along a D-D' line (FIGS. 4 and 5) immediately before a collector current density $J_C$ abruptly decreases (at the point indicated by an arrow in FIG. 8) each in the IGBT 900A (broken line) as the comparative example and the IGBT 900C (solid line) as the embodiment in which $L_{EEBR}$=200 μm. FIG. 10 shows a relationship between a peak temperature $T_{max}$ inside the device and $L_{EEBR}$.

As seen from the simulation results, the peak temperature $T_{max}$ inside the device can be suppressed by sharing voltage in the ballast resistance region, and when $L_{EEBR}$ is particularly set to be greater than or equal to 100 μm, $T_{max}$ can be set to be less than or equal to 800 K. As described above, it is clear that providing the ballast resistance region can prevent breakdown due to heat generation, that is to say, providing the ballast resistance region can increase the breaking capability of the IGBT.

(Verification of Effects of IGBT 900B and IGBT 900D)

Figure 11:
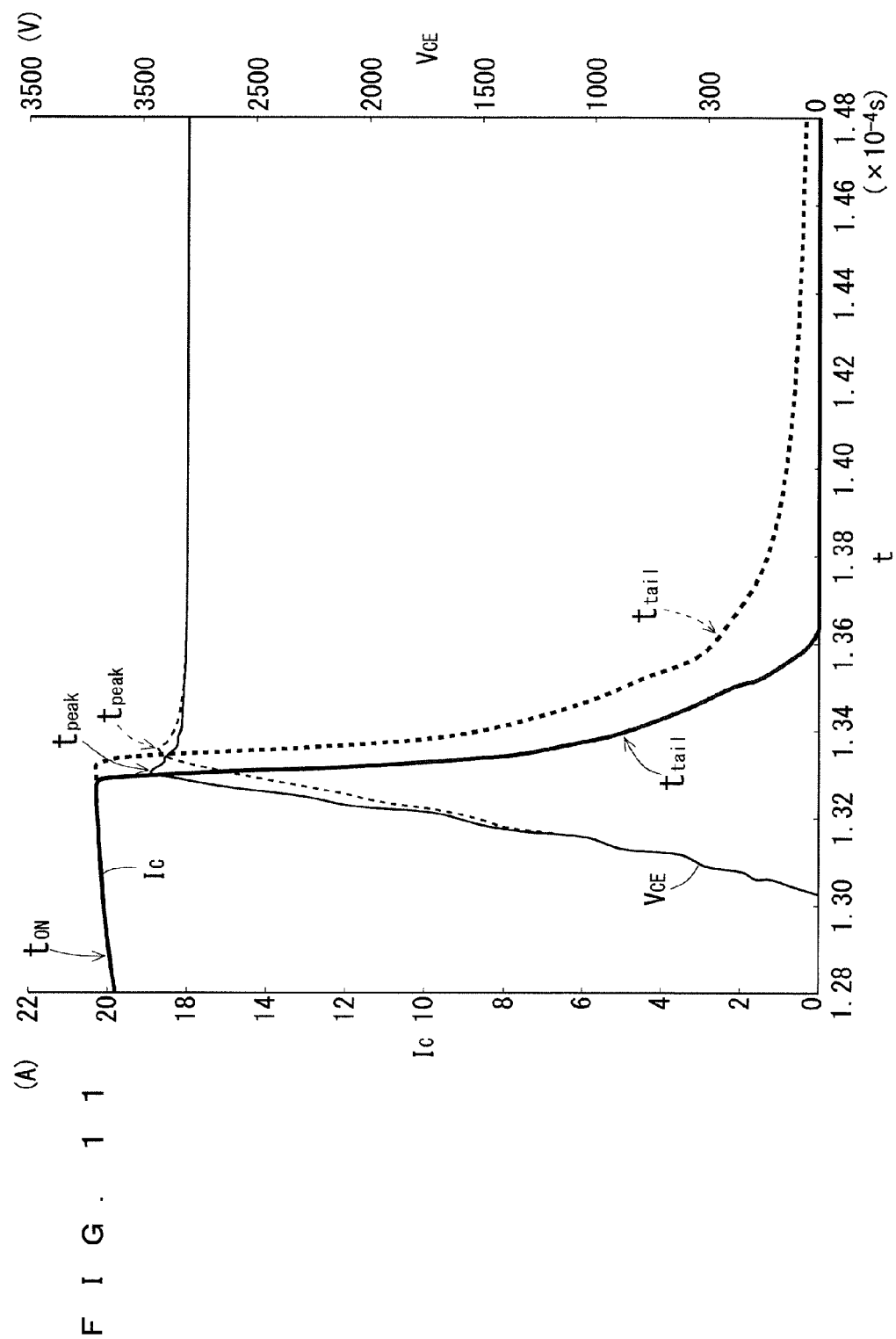
FIG. 11 is a graphical representation showing each turn-off waveform of a collector-emitter voltage $V_{CE}$ and a collector current $I_C$ in the comparative example (broken line) having the structure A and in the embodiment (solid line) having the structure D.
Figure 14B:
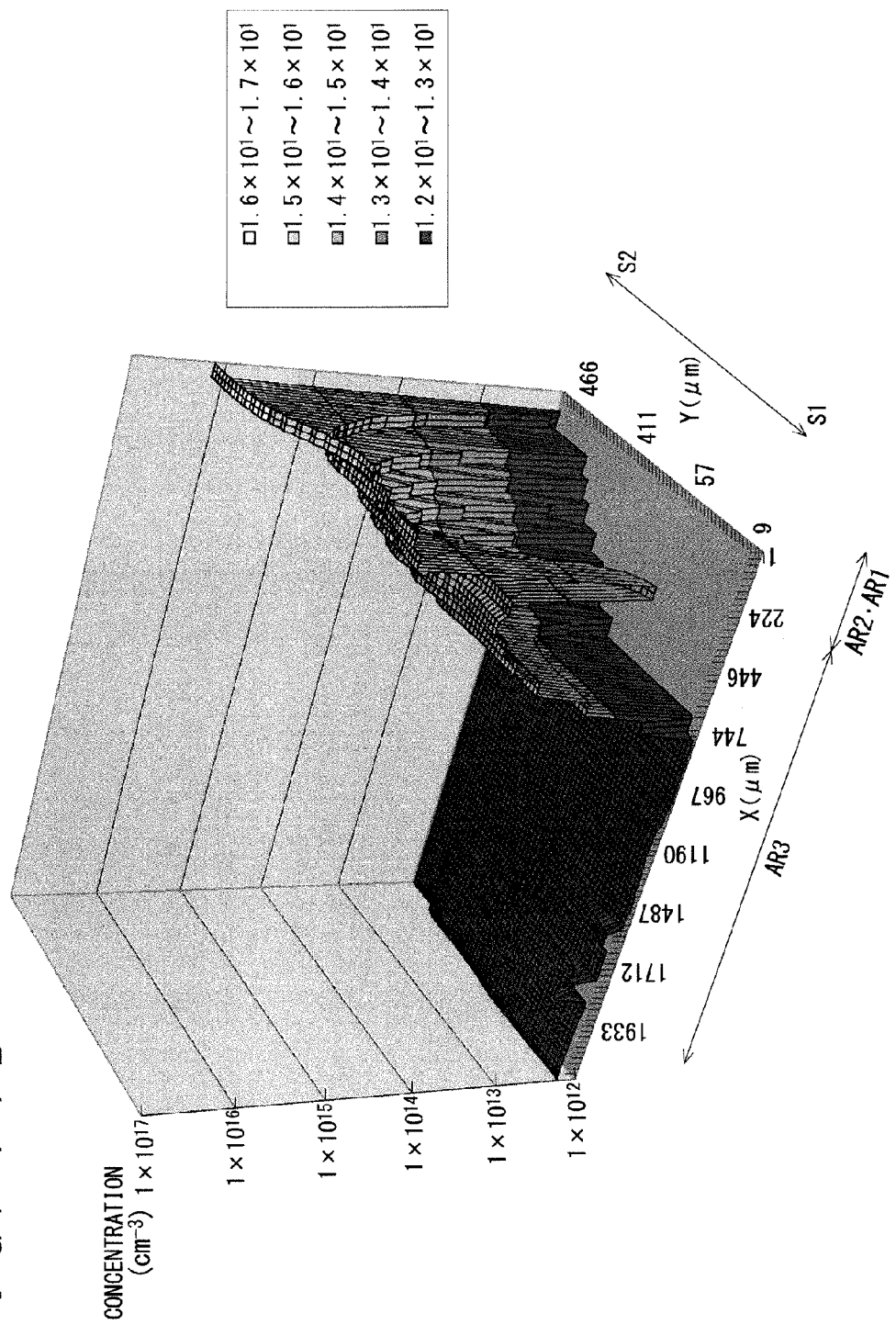
FIG. 14B is a distribution chart showing the carrier concentration inside the device when $t=t_{peak}$ (FIG. 11) in the structure D as the embodiment.
Figure 16B:
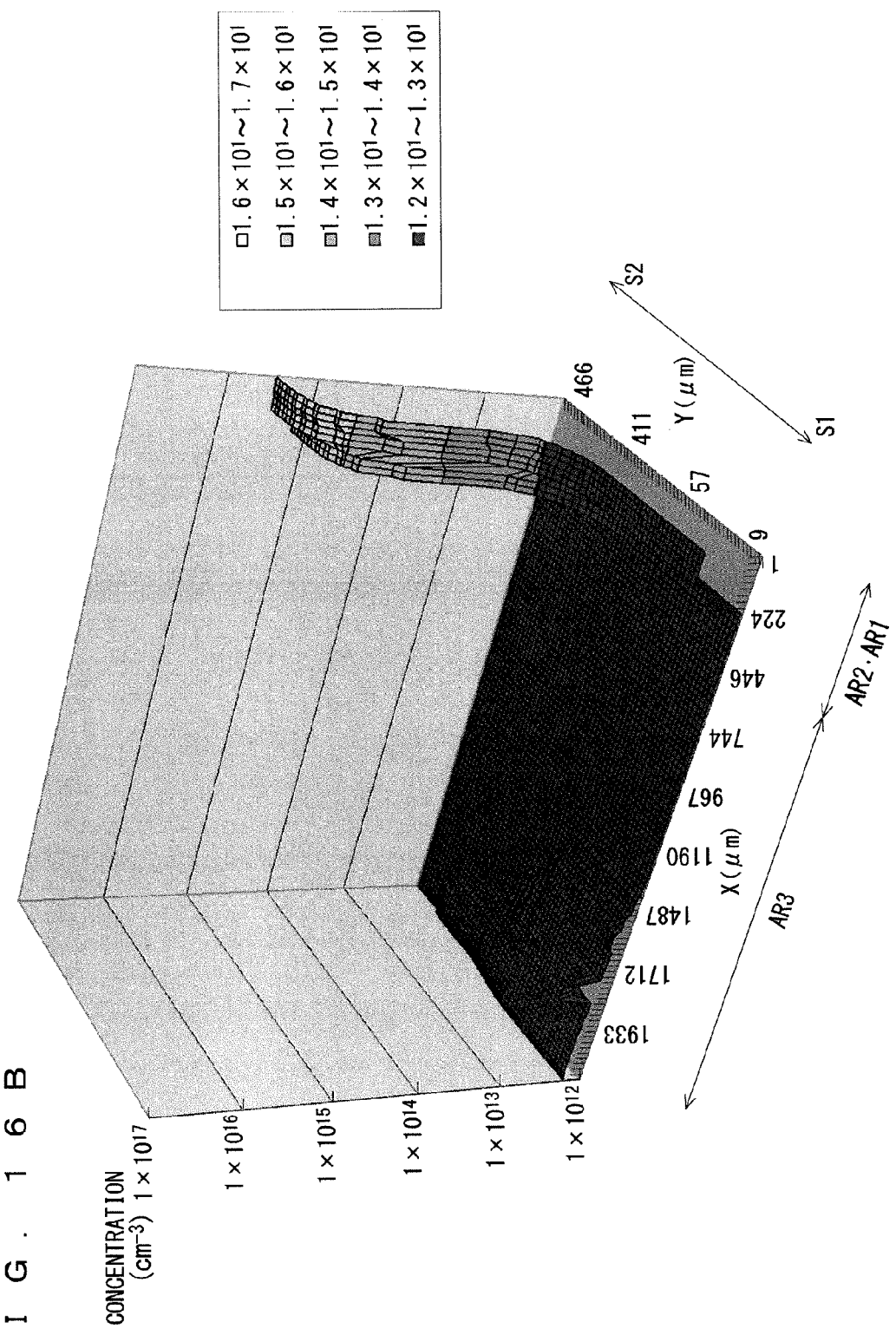
FIG. 16B is a distribution chart showing the carrier concentration inside the device when $t=t_{tail}$ (FIG. 11) in the structure D as the embodiment.
Figure 19A:
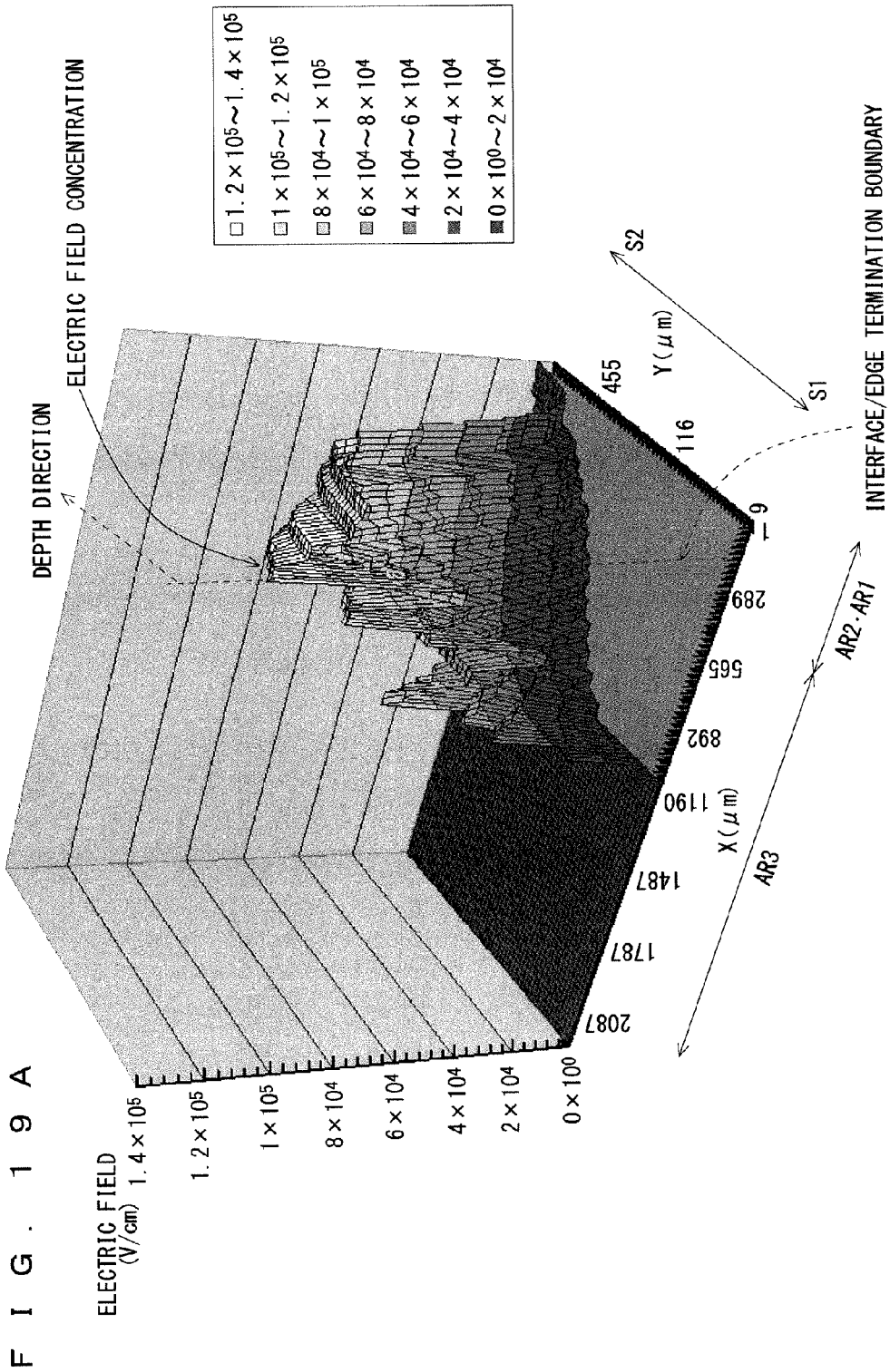
FIG. 19A is a distribution chart showing the electric field strength inside the device when $t=t_{tail}$ (FIG. 11) in the structure A as the comparative example.
Figure 19B:
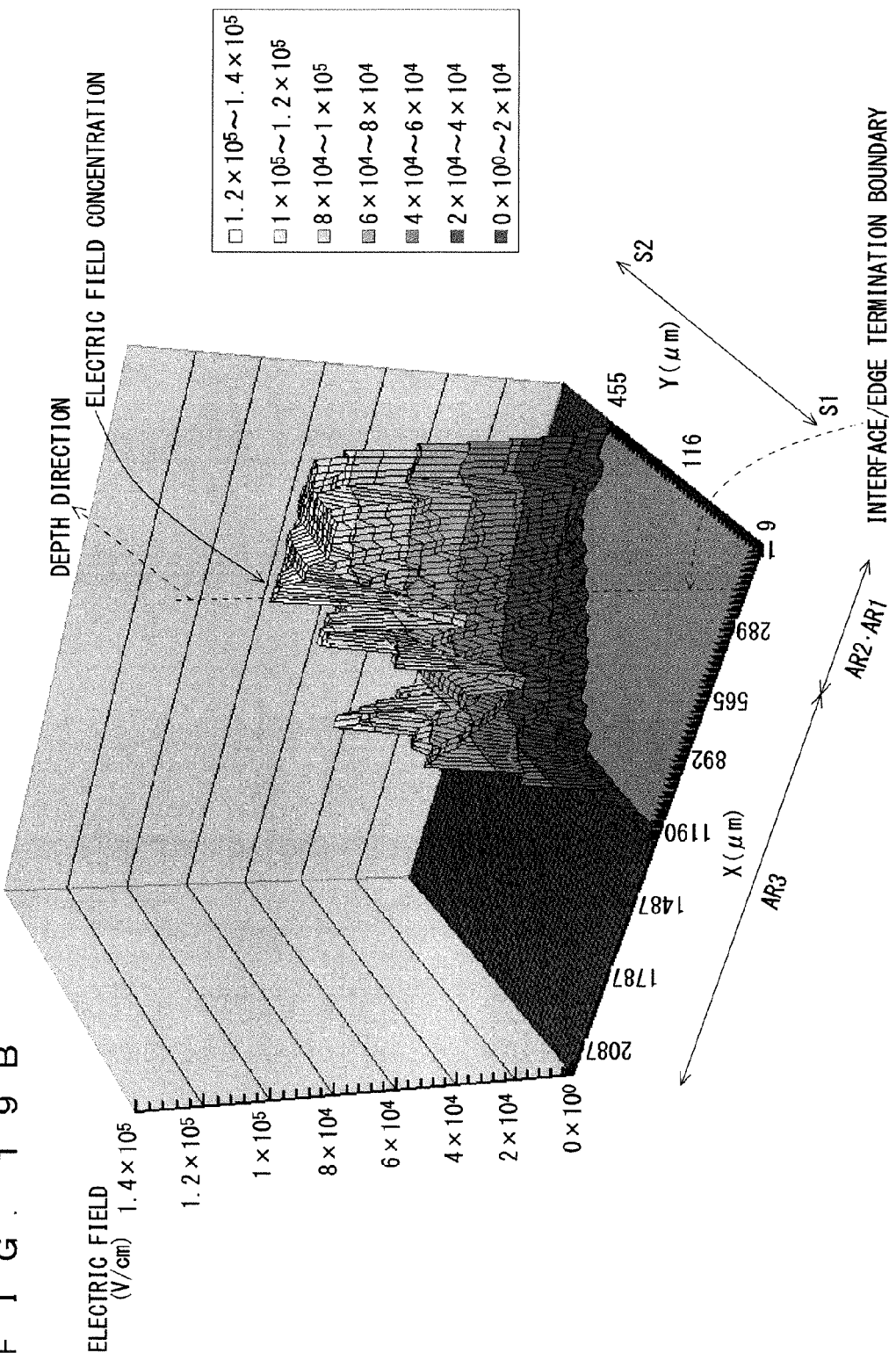
FIG. 19B is a distribution chart showing the electric field strength inside the device when $t=t_{tail}$ (FIG. 11) in the structure D as the embodiment.

FIG. 11 shows an example of each turn-off waveform in the IGBT 900A (broken line) as the comparative example and in the IGBT 900D (solid line) as the embodiment. FIG. 12A shows a current potential and a hole concentration in an ON state of the comparative example ($t_{ON}$ in FIG. 11) from the view of FIG. 4. FIG. 12B shows the current potential and the hole concentration at a peak of a collector-emitter voltage $V_{CE}$ during turn-off of the comparative example ($t_{peak}$ of the broken line in FIG. 11) from the view of FIG. 4. FIG. 13A shows the current potential and the hole concentration in an ON state of the embodiment ($t_{ON}$ in FIG. 11) from the view of FIG. 6. FIG. 13B shows the current potential and the hole concentration at a peak of the collector-emitter voltage $V_{CE}$ during turn-off of the embodiment ($t_{peak}$ of the solid line in FIG. 11) from the view of FIG. 6. FIGS. 14A and 14B respectively show a carrier concentration inside the device when t=$t_{ON}$ (FIG. 11) in the comparative example and the embodiment. FIGS. 15A and 15B respectively show the carrier concentration inside the device when t=$t_{peak}$ (FIG. 11) in the comparative example and the embodiment. FIGS. 16A and 16B respectively show the carrier concentration inside the device when t=$t_{tail}$ (FIG. 11) in the comparative example and the embodiment. FIGS. 17A and 17B respectively show electric field strength inside the device when t=$t_{ON}$ (FIG. 11) in the comparative example and the embodiment. FIGS. 18A and 18B respectively show the electric field strength inside the device when t=$t_{peak}$ (FIG. 11) in the comparative example and the embodiment. FIGS. 19A and 19B show the electric field strength inside the device when t=$t_{tail}$ (FIG. 11) in the comparative example and the embodiment.

As seen from FIGS. 12A, 12B, 13A, 13B, 14A, 14B, 15A, 15B, 16A, and 16B, the carrier concentration of the IGBT 900D (structure D) in the embodiment is almost the same as that in the active area AR1 of the IGBT 900A in the comparative example, but the carrier concentration in the edge termination area AR3 of the IGBT 900D is lower than that of the IGBT 900A. The reason is conceivable that a hole injection from the p-collector layer 3 does not occur in the interface area AR2 and the edge termination area AR3. It is conceivable that this action is also similar to that in the IGBT 900B (structure B) having the same collector structure as the IGBT 900D.

Moreover, as shown in FIGS. 17A, 17B, 18A, 18B, 19A, and 19B, the above-mentioned action accelerates electric field relaxation and depletion in the interface area AR2 and the edge termination area AR3 during the turn-off operation. Particularly with reference to FIGS. 19A and 19B, the electric field relaxation in the boundary between the interface area AR2 and the edge termination area AR3 on the upper surface S1 contributes to an improvement in the breaking capability.

Figure 20:
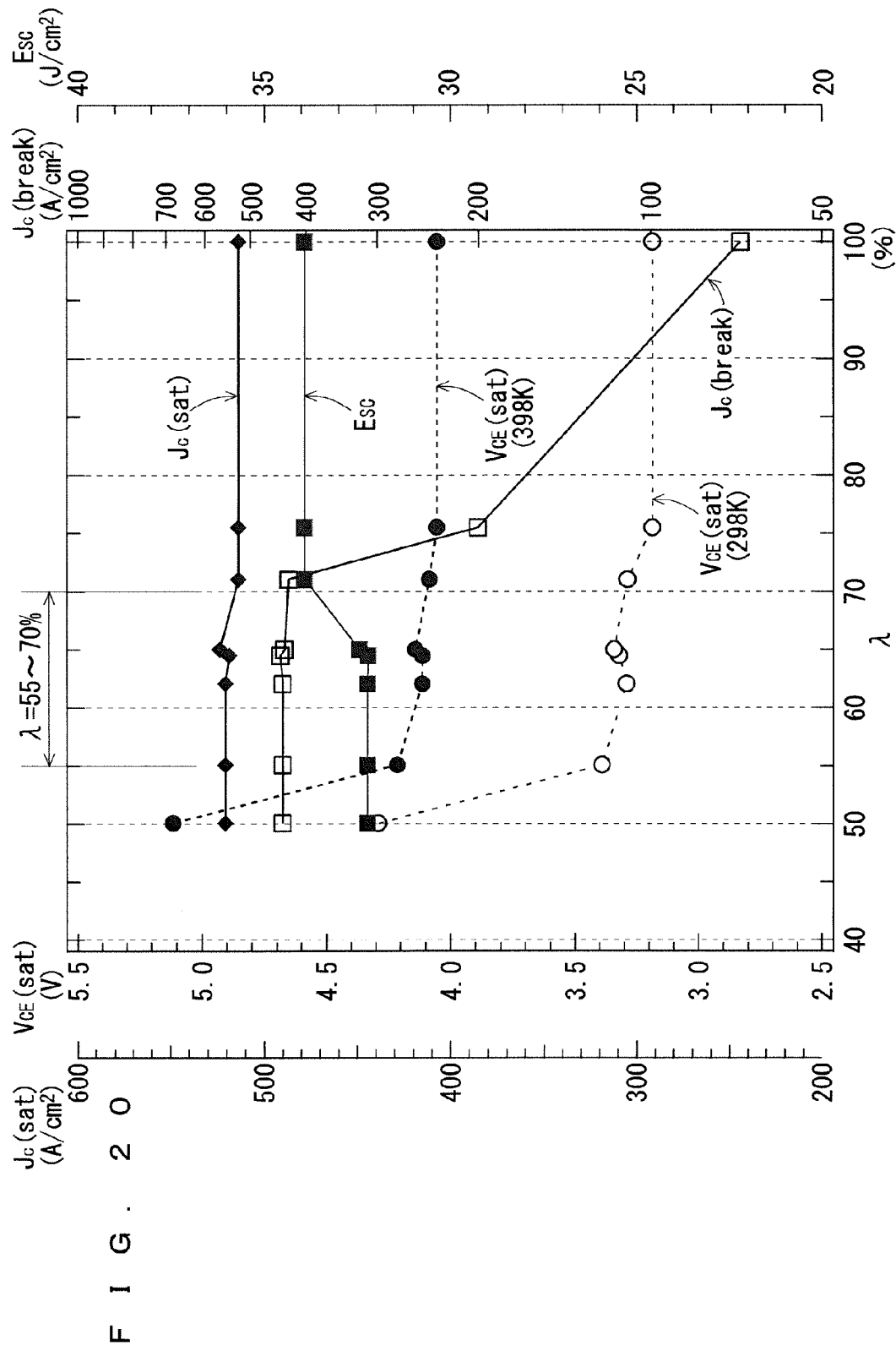
FIG. 20 is a graphical representation showing an example of relationships between a proportion λ of a p-collector layer in the structure D and various electrical characteristics, which are a saturation current density $J_C$ (sat), an ON-state voltage $V_{CE}$ (sat), a turn-off maximum breaking current density $J_C$ (break), and a maximum breaking energy $E_{SC}$ when a short circuit occurs.

With reference to FIG. 20, a proportion λ of an area of the p-collector layer 3 to the lower surface S2 of the substrate SB needs to be appropriate to keep a suitable balance between a high breaking capability and a low ON-state voltage. In the diagram, λ=100% corresponds to the collector structure of the IGBT 900A in the comparative example. As seen from the results shown, λ is preferably greater than or equal to 55% and less than or equal to 70%. Setting a value of λ from 55 to 70% can both achieve a high turn-off maximum breaking current density $J_C$ (break) and no adverse effect of increasing an ON-state voltage $V_{CE}$ (sat).

The result that λ=75% in the graph corresponds to the structure in which the p-collector layer 3 is provided in the active area AR1 and the interface area AR2 and not provided in the edge termination area AR3. When λ is increased to 75%, a noticeable decrease is seen in the turn-off maximum breaking current density $J_C$ (break). This indicates that providing no p-collector layer 3 in the interface area AR2 is important in order to increase $J_C$ (break).

Figure 21:
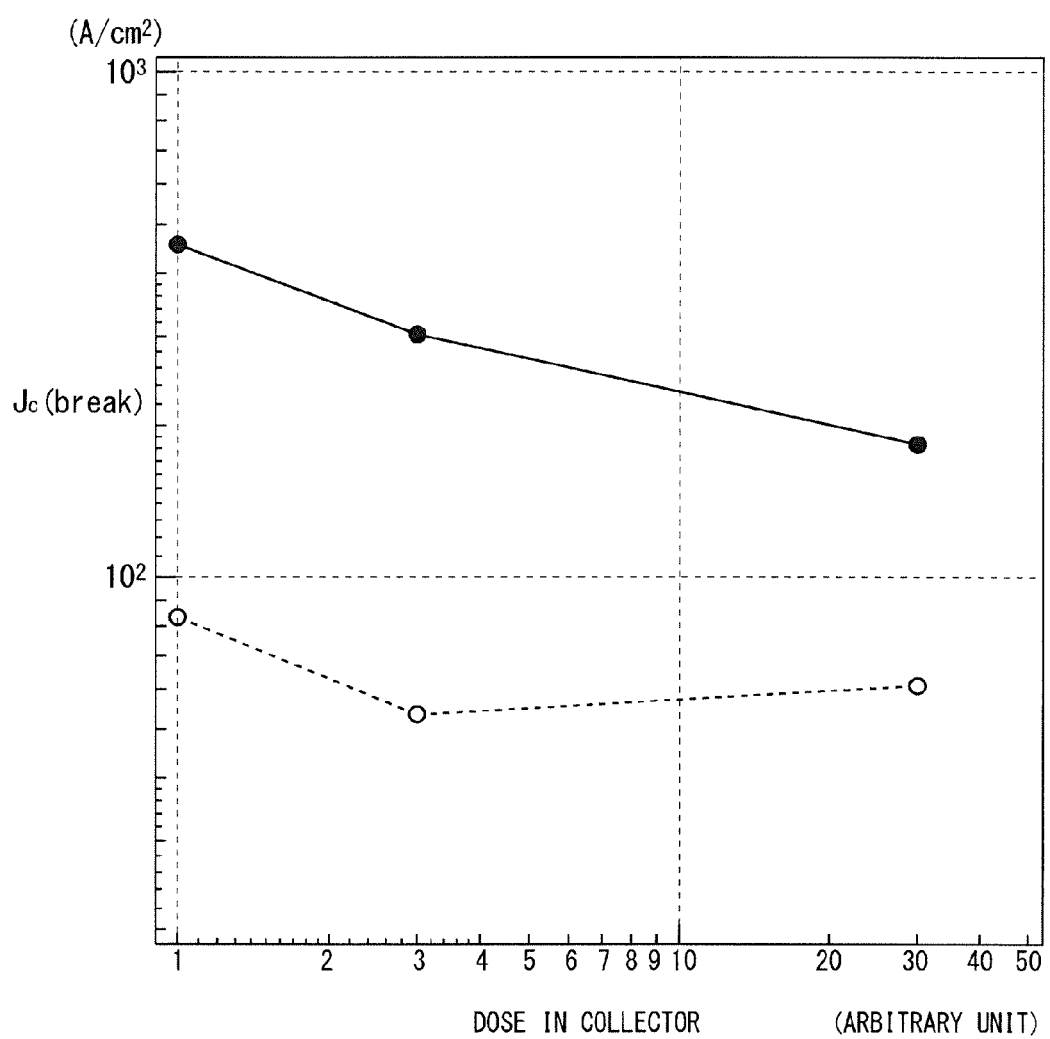
FIG. 21 is a graphical representation showing relationships between a dose in collector and the turn-off maximum breaking current density $J_C$ (break) in the structure A (broken line) as the comparative example and the structure D (solid line) as the embodiment.
Figure 22:
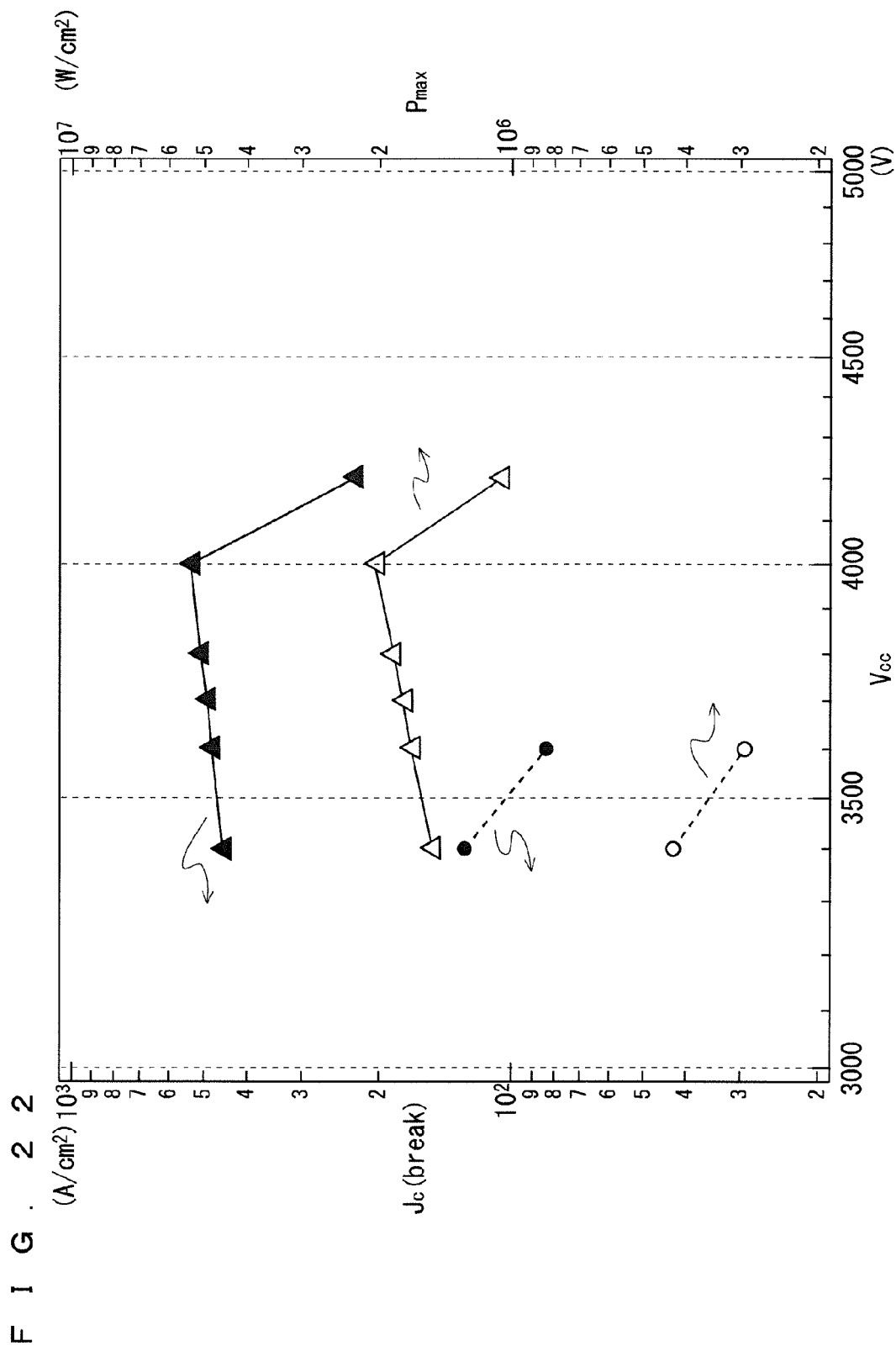
FIG. 22 is a graphical representation showing reverse bias safe operating areas (RBSOAs) in the structure A (broken line) as the comparative example and the structure D (solid line) as the embodiment.

FIG. 21 shows an example of relationships between a dose of ion implantation for forming the p-collector layer 3 and the turn-off maximum breaking current density $J_C$ (break) in the IGBT 900A (broken line) as the comparative example and the IGBT 900D (solid line) as the embodiment. FIG. 22 shows relationships between a power supply voltage $V_{CC}$ and a saturation current density $J_C$ (sat) or a maximum power density $P_{max}$, as RBSOAs in the comparative example (broken line) and the embodiment (solid line). A region surrounded by each line in FIG. 22 is a region called a recovery safe operating area (SOA). The breaking capability during the turn-off of the IGBT is affected by efficiency of the hole injection from the p-collector layer 3. A dose in the p-collector layer 3 is a parameter for controlling trade-off characteristics between the ON-state voltage $V_{CE}$ (sat) and a turn-off loss $E_{OFF}$ in the IGBT. Even if the dose in the p-collector layer 3 is adjusted to control the trade-off characteristics between $V_{CE}$ (sat) and $E_{OFF}$, the embodiment (solid line) can obtain $J_C$ (break) higher than that in the comparative example (broken line) as seen from FIG. 21 and is the excellent IGBT having a low dependence of the dose in the p-collector layer 3 on $J_C$ (break). Moreover, FIG. 22 indicates the excellent effects of the embodiment that expands the RBSOA and increases the power density for breaking during the turn-off.

Table 1 below provides a summary of relationships between structural characteristics of the IGBTs 900A to 900D (structures A to D) and the turn-off maximum breaking current density $J_C$ (break) with reference to a rated current density $J_C$ (rated).

TABLE 1

| Structure | Back Surface Structure of Interface Area | Ballast Resistance | $J_C$ (break) @ $V_{CC}$ = 3600 V |
|---|---|---|---|
| A (Comparative Example) (IGBT 900A) | p-collector | No | 1.0 $J_C$ (rated) |
| B (IGBT 900B) | n-buffer | No | 4.0 $J_C$ (rated) |
| C (IGBT 900C) | p-collector | Yes | 3.0 $J_C$ (rated) |
| D (IGBT 900D) | n-buffer | Yes | ≥7.0 $J_C$ (rated) |

As shown above, the structures B to D (IGBTs 900B to 900D) have $J_C$ (break), namely, the turn-off breaking capability, higher than that in the structure A (IGBT 900A). The structure D (IGBT 900D) particularly has the remarkably high capability.

Figure 23:
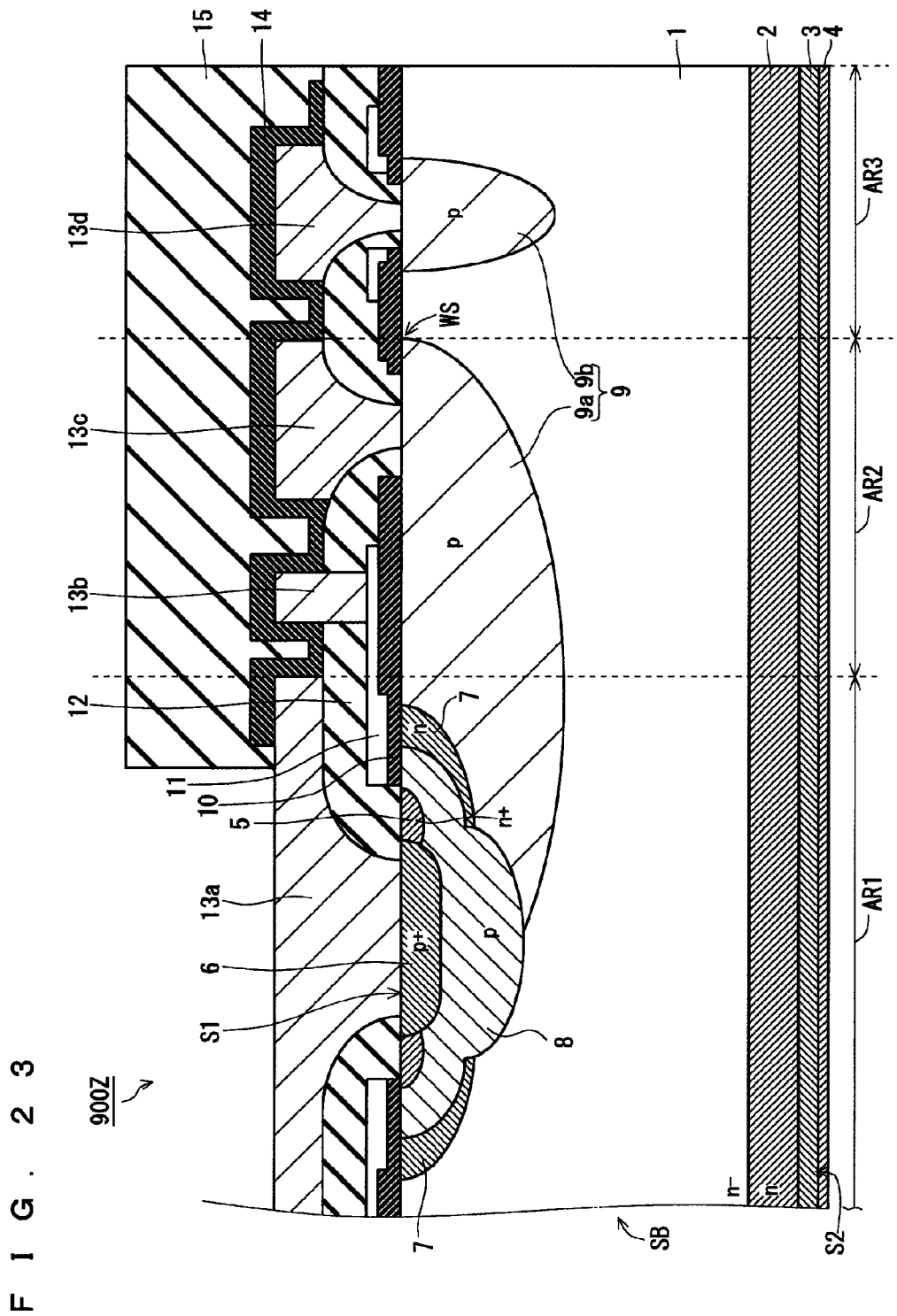
FIG. 23 is a partial cross-sectional view showing a section of a configuration of a planar IGBT as another comparative example taken along the II-II line (FIG. 1) (IGBT 900Z).
Figure 24:
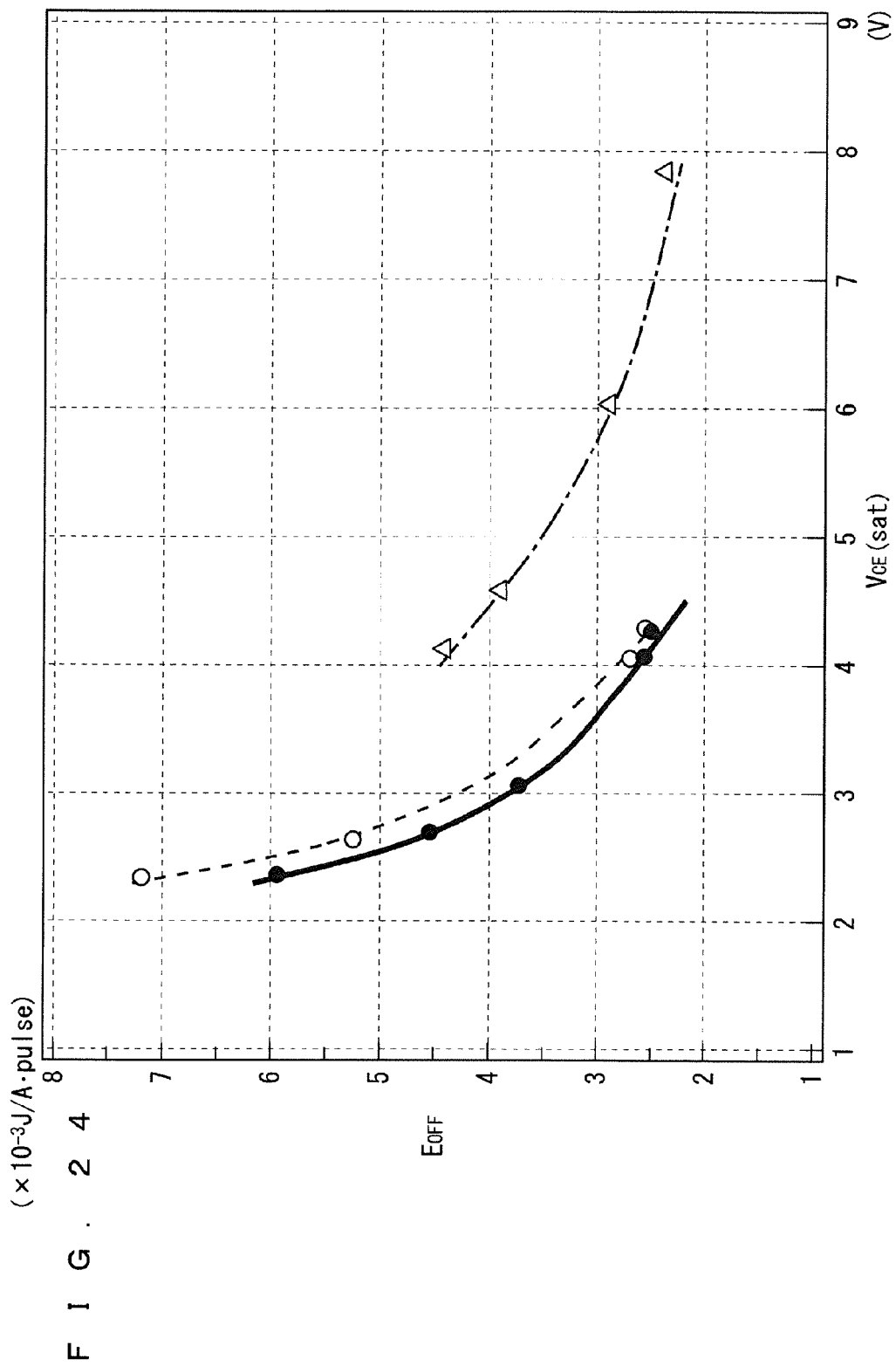
FIG. 24 is a graphical representation showing trade-off characteristics between the ON-state voltage $V_{CE}$ (sat) and a turn-off loss $E_{OFF}$ in the structure D (solid line) as the embodiment, the structure A (broken line) as the comparative example, and the planar IGBT (alternate long and short dashed line) as the other comparative example.

FIG. 23 shows a configuration of an IGBT 900Z as another comparative example. The IGBT 900Z is different from the IGBTs 900A to 900D described above and includes a planar gate electrode 11. FIG. 24 shows the trade-off characteristics between the ON-state voltage $V_{CE}$ (sat) and the turn-off loss $E_{OFF}$ in the IGBT 900D (solid line) as the embodiment and the IGBT 900A (broken line) and the IGBT 900Z (alternate long and short dashed line) as the comparative examples. It is clear from the results that the IGBT 900D has the high turn-off breaking capability as described with reference to FIG. 21 and Table 1 and also has the excellent trade-off characteristics between the ON-state voltage $V_{CE}$ (sat) and the turn-off loss $E_{OFF}$.

(About IGBT 900E and IGBT 900F)

Figure 25:
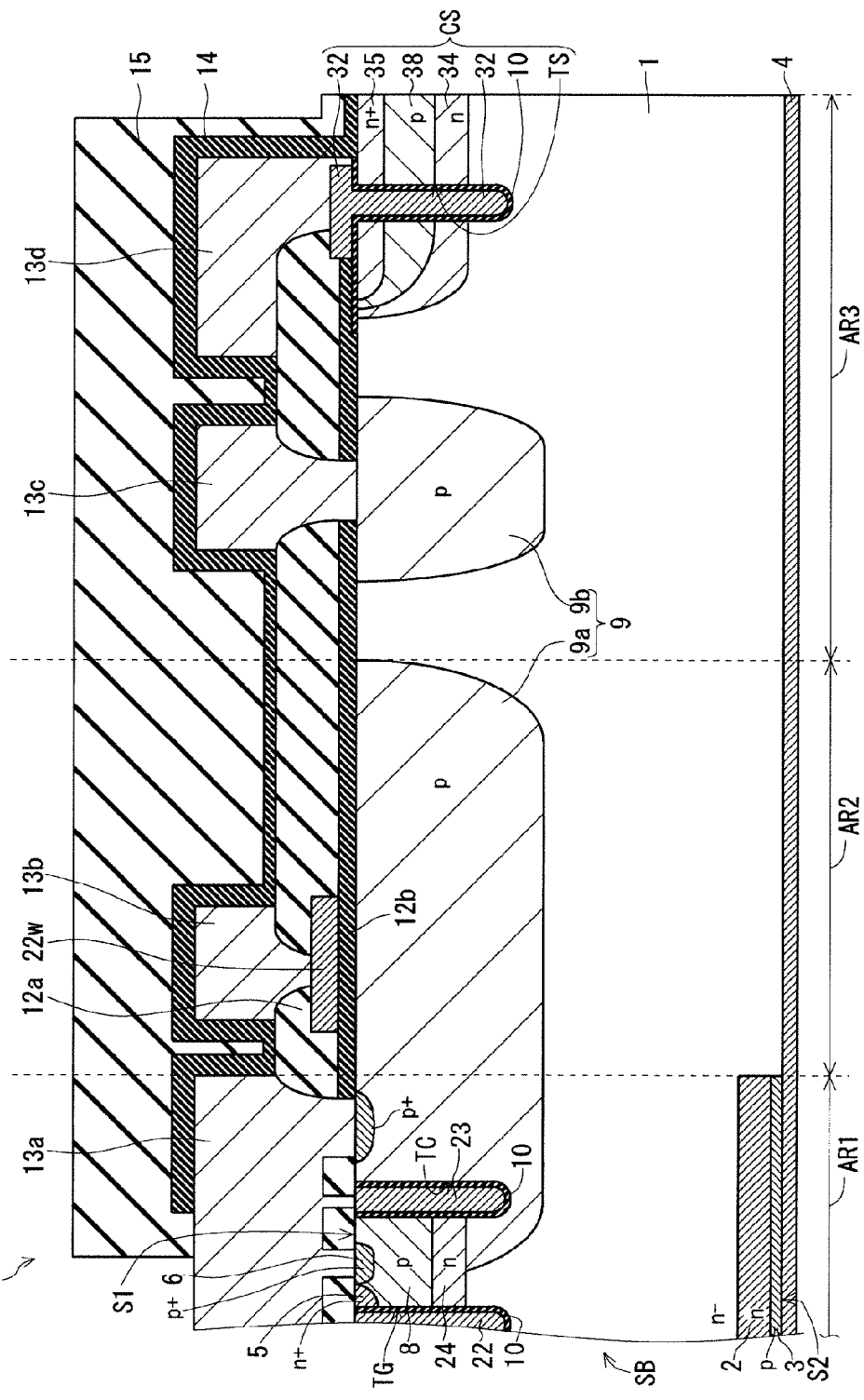
FIG. 25 is a partial cross-sectional view schematically showing a structure E in a modification when seen similarly to FIG. 2 (IGBT 900E, structure E).

With reference to FIG. 25, in an IGBT 900E as a modification of the IGBT 900D (FIG. 6), the n-buffer layer 2 is provided only in the active area AR1 and not provided in the interface area AR2 and the edge termination area AR3. The pattern of the n-buffer layer 2 may be the same as the pattern of the p-collector layer 3. In addition, such structure may be combined with the IGBT 900B instead of the IGBT 900D.

Figure 26:
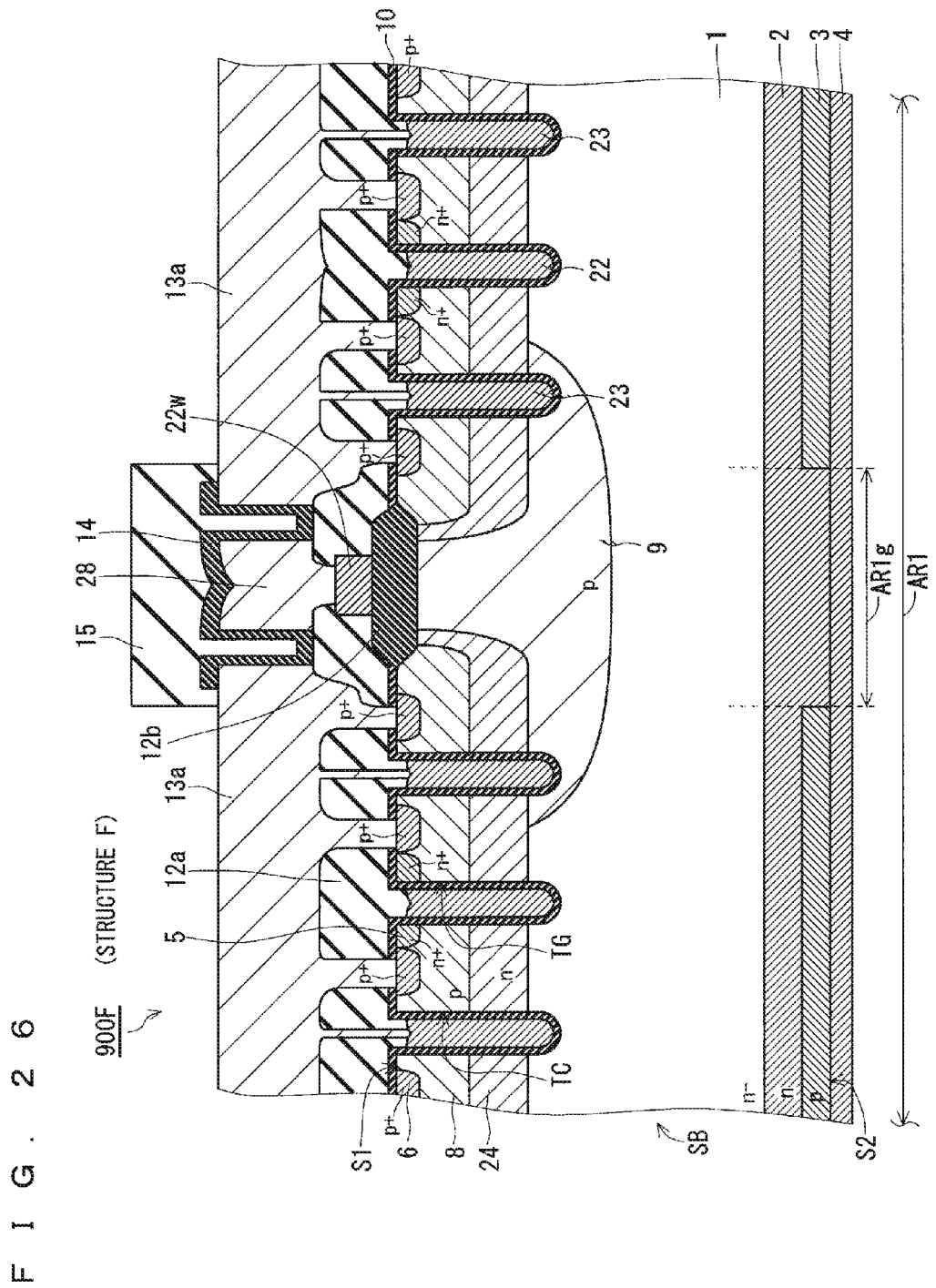
FIG. 26 is a partial cross-sectional view schematically showing a structure F in a modification (IGBT 900F, structure F).

With reference to FIG. 26, in an IGBT 900F as a modification of the IGBT 900B (FIG. 2), the active area AR1 has a Metal Insulator Semiconductor (MIS) structural portions (left portion and right portion in the diagram) in which a MIS structural cell is disposed and a non-MIS structural portion (central portion in the diagram) in which no MIS structural cell is disposed. In the diagram, the central portion is a portion AR1g in which the gate wiring portion 28 and the gate pad 29 (FIG. 1) are provided in the active area AR1. The p-collector layer 3 is not provided in the portion AR1g, and, as a result, the buffer layer 2 contacts the collector electrode 4 on the lower surface S2. The MIS structure is typically a metal oxide semiconductor (MOS) structure. Such structure also has the same effects as those of the IGBT 900D.

Second Embodiment

Figure 27:
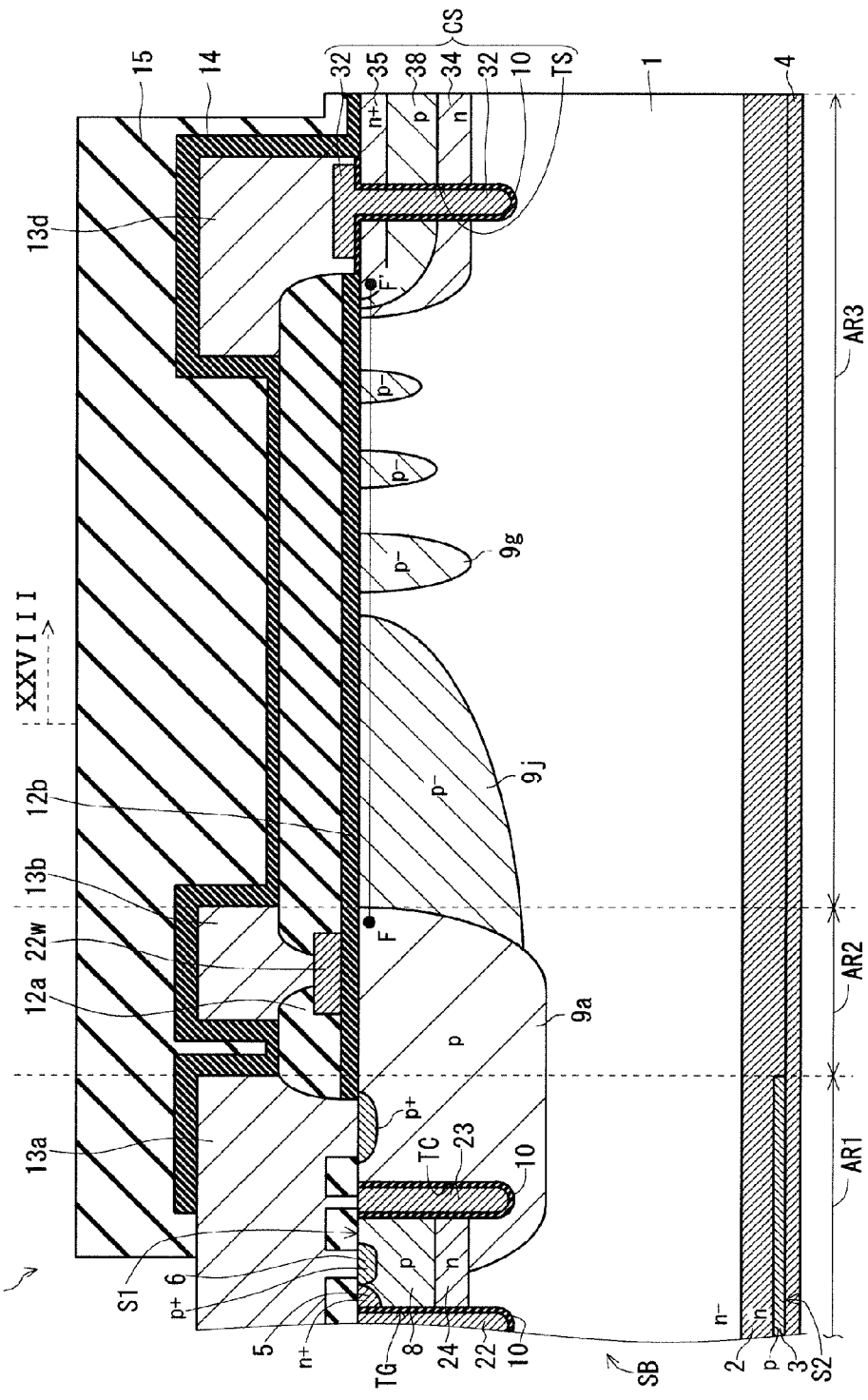
FIG. 27 is a partial cross-sectional view schematically showing a structure G of an IGBT as a power semiconductor device in a second embodiment of the present invention (IGBT 900G, structure G).

With reference to FIG. 27, a structure (referred to as a structure G) of an IGBT 900G in this embodiment is described.

A substrate SB in the structure G includes an n⁻-drift layer 1, an n-buffer layer 2, a p-collector layer 3, an n⁺-emitter layer 5, a p⁺-layer 6, a p-base layer 8, an n-layer 24, a p-well region 9a, a p⁻-extension region 9j, and a plurality of p⁻-field-limiting rings 9g. The p-well region 9a is covered with an interlayer insulating film 12b in an interface area AR2.

The p⁻-extension region 9j extends outward (to the right side in the diagram) from the p-well region 9a on an upper surface S1 and is shallower than the p-well region 9a. The p⁻-extension region 9j has a p-type and has a peak impurity concentration and a surface impurity concentration lower than those of the p-well.

Figure 28:
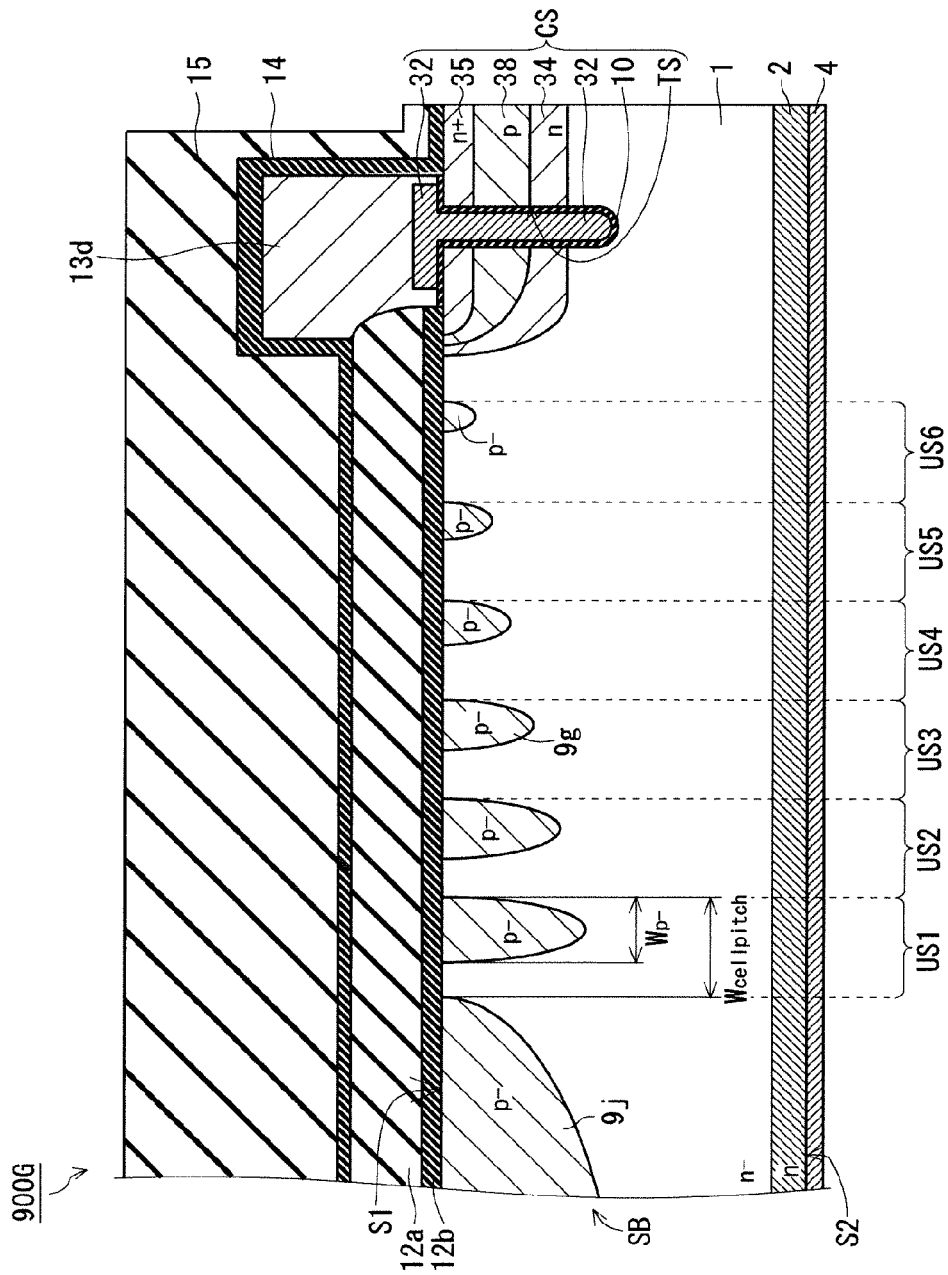
FIG. 28 is a partial cross-sectional view showing a region XXVIII in FIG. 27 in more detail.

Further, with reference to FIG. 28, the p⁻-field-limiting rings 9g have the p-type. The p⁻-field-limiting rings 9g are provided on the upper surface S1 outside the p⁻-extension region 9j in an edge termination area AR3. The n⁻-drift layer 1 is located on the inner side of each of the p⁻-field-limiting rings 9g on the upper surface S1, and each of the p⁻-field-limiting rings 9g together with the n⁻-drift layer 1 located on the inner side forms corresponding unit structures US1 to US6 (collectively referred to as USs). A width $W_{cellpitch}$ of the unit structure US is a fixed value. The p⁻-field-limiting ring 9g located closer to the outside (right side in the diagram) has a lower proportion of a width $W_{p-}$ to the width $W_{cellpitch}$ of the unit structure US on the upper surface S1. The unit structure US located closer to the outside has a lower average dose. Herein, the average dose in the unit structure US is a numeric value that the number of ions implanted for forming the p⁻-field-limiting ring 9g of the specific unit structure US is divided by an area of the unit structure US on the upper surface S1. In other words, the average dose in the unit structure US is a dose from a macroscopic perspective that ignores the internal structure of the unit structure US.

In the structure illustrated in FIG. 28, each of the unit structures USs on the upper surface S1 of the substrate SB has the fixed width $W_{cellpitch}$. The p⁻-field-limiting ring 9g located closer to the outside (right side in the diagram) has the smaller $W_{p-}$ on the upper surface S1. To obtain the unit structures USs, an ion implantation mask having a plurality of openings at a fixed pitch may be used in an ion implantation step of forming the field-limiting rings 9g, for example, the opening located closer to the outside having a smaller width. The field-limiting ring 9g having the smaller width when subjected to the ion implantation eventually has a smaller depth after activation annealing, namely, after diffusion. FIG. 28 shows as if the p⁻-field-limiting rings 9g are individual, but approximately ⅓ to ½ of the plurality of p⁻-field-limiting rings 9g that have been originally formed as impurity regions are connected to the p⁻-extension region 9j due to the activation annealing.

Figure 29:
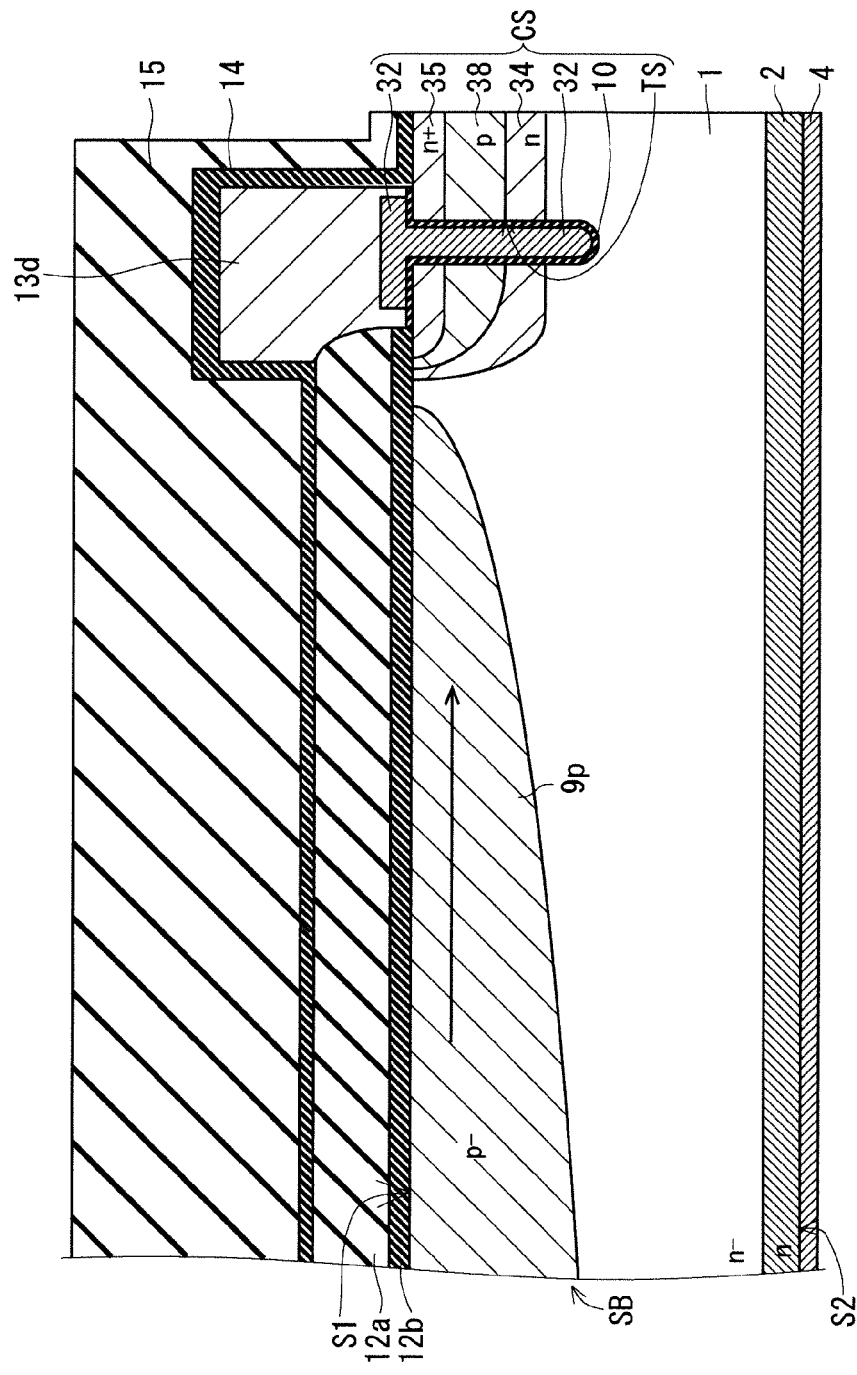
FIG. 29 is a partial cross-sectional view schematically showing a configuration of a pseudo-well of field-limiting rings in FIG. 28.

The width $W_{p-}$ is preferably decreased by a fixed dimension for each unit structure US toward the outside. In this case, an average dose in the unit structure US linearly changes for each unit structure US toward the outside under the condition that the width $W_{cellpitch}$ is fixed. From a macroscopic perspective that ignores the internal structure of the unit structure US, a pseudo-p⁻ well 9p is supposed to be provided such that an impurity concentration thereof is decreased with a fixed concentration gradient in a direction of the arrow in the diagram, as shown in FIG. 29. In this configuration, on the upper surface S1, the p⁻-extension region 9j (FIG. 27) has the almost fixed impurity concentration while the pseudo-p⁻ well 9p located outside the p⁻-extension region 9j has the impurity concentration linearly decreased toward the outside.

The configuration except for the above-described configuration is almost the same as the configuration of the IGBT 900D in the first embodiment described above, so that the same or corresponding components have the same references, and their description will not be repeated.

In this embodiment, the unit structures USs are formed of the p⁻-field-limiting rings 9g provided in the edge termination area AR3, and the unit structure US located closer to the outside has the lower average dose. This configuration can sufficiently suppress the electric field strength in the interface area AR2 even if the edge termination area AR3 is smaller than the edge termination area AR3 in which the average dose is not controlled as described above. Thus, a temperature rise can be suppressed in the boundary between the active area AR1 and the interface area AR2 without greatly sacrificing the area of the active area AR1. In other words, both of a low ON-state voltage and a high breaking capability can be obtained. Particularly in a case where each of the unit structures USs have the fixed width $W_{cellpitch}$, both of the low ON-state voltage and the high breaking capability can be obtained with more reliability.

Next, the verification results of the action effects described above are described below.

Figure 30A:
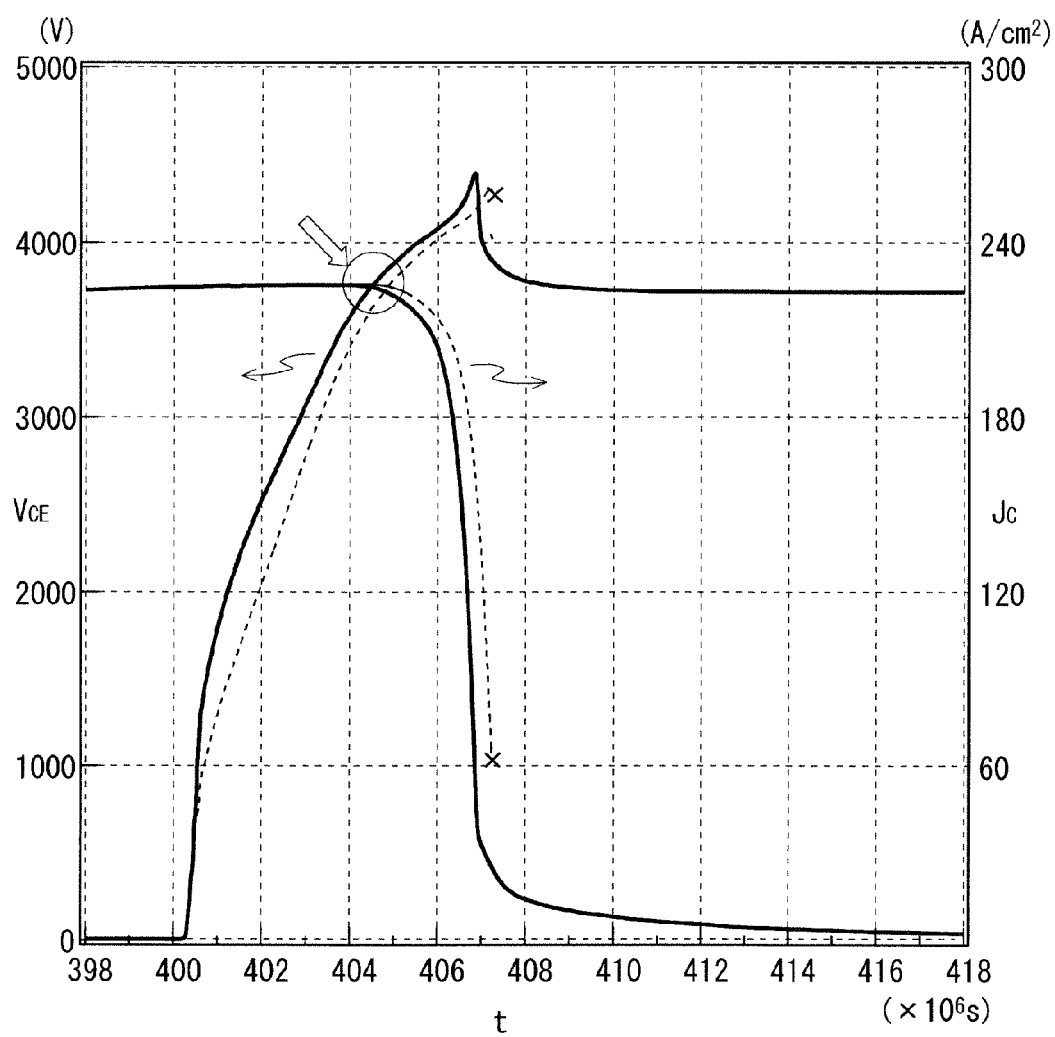
FIG. 30A is a graphical representation showing simulation results of each turn-off waveform of the collector-emitter voltage $V_{CE}$ and a collector current density $J_C$ in the comparative example (broken line) having the structure A and in the embodiment (solid line) having the structure G.

FIG. 30A shows the simulation results of each turn-off waveform of the collector-emitter voltage $V_{CE}$ and the collector current density $J_C$ in the IGBT 900A (FIG. 4) as the comparative example (broken line) and in the IGBT 900G (FIG. 27) as the embodiment (solid line). FIG. 30B is a graphical representation showing simulation results of peak temperatures inside the devices in the comparative example (broken line) and the embodiment (solid line). "x" in FIGS. 30A and 30B represents breakage of the device. The simulation results of the internal state of the device at the point indicated by an arrow in FIG. 30A are shown in more detail in FIGS. 31A and 31B. FIG. 31A shows temperatures inside the devices in the comparative example and the embodiment. FIG. 31B shows impact ionization rates inside the devices in the comparative example and the embodiment. In FIGS. 31A and 31B, the broken line portion indicated by an arrow corresponds to the interface area AR2. As seen from the simulation results, a local temperature rise in the interface area AR2 is lower in the embodiment than that in the comparative example. Thus, the embodiment conceivably has the smaller temperature rise inside the device during the turn-off operation of the IGBT and the higher breaking capability.

Figure 32A:
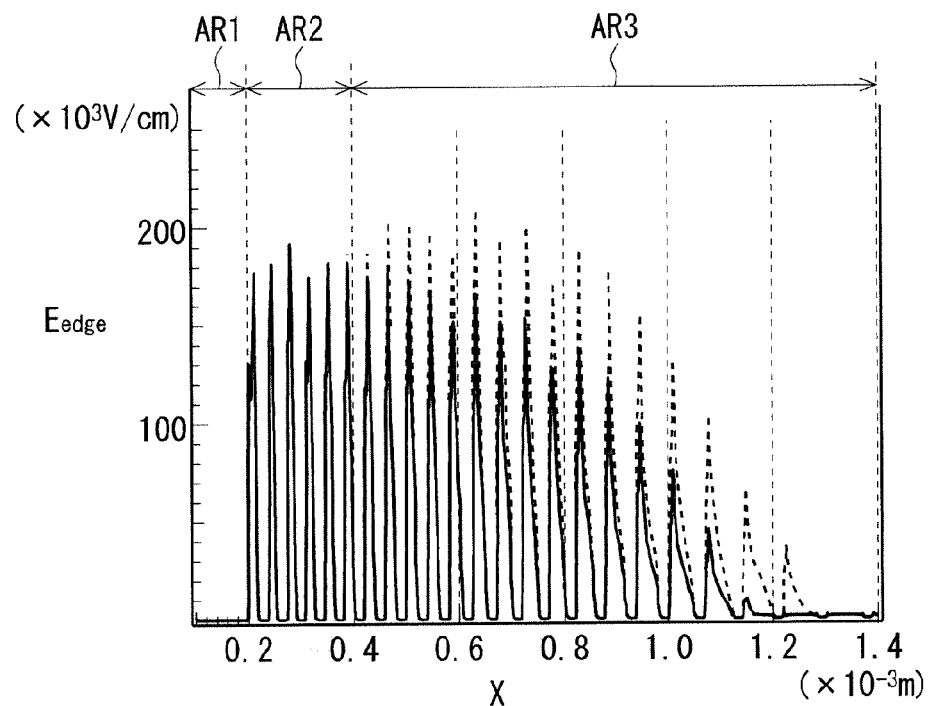
FIG. 32A is a graphical representation showing relationships between a position X and electric field strength $E_{edge}$ on the upper surface of the substrate each in a dynamic state (solid line) and a static state (broken line) of the comparative example having the structure A.
Figure 32B:
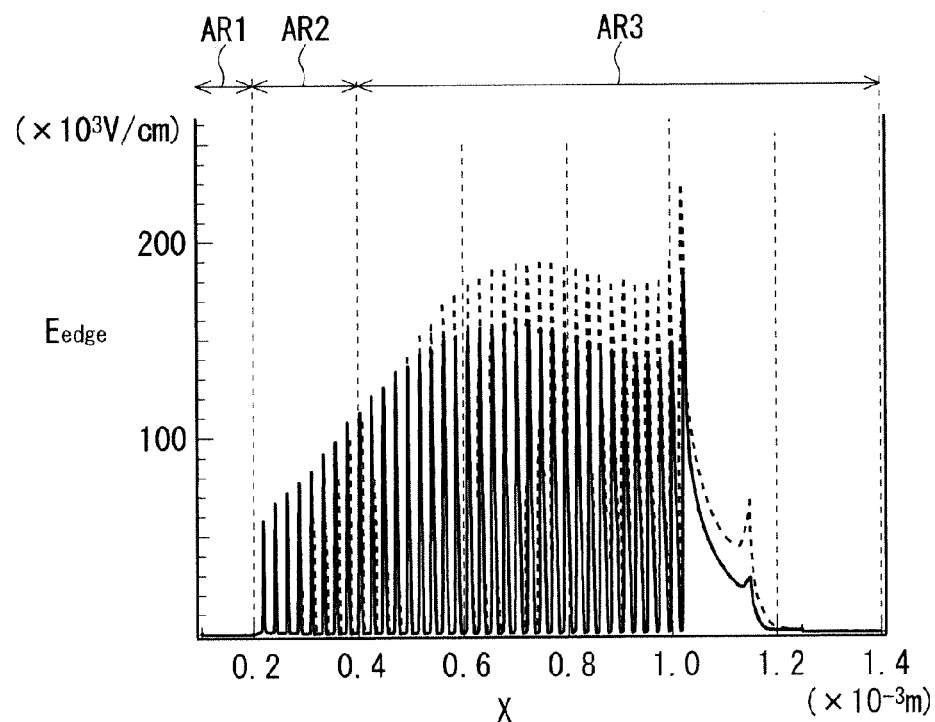
FIG. 32B is a graphical representation showing relationships between the position X and the electric field strength $E_{edge}$ on the upper surface of the substrate each in the dynamic state (solid line) and the static state (broken line) of the embodiment having the structure G.

FIG. 32A shows relationships between a position X and electric field strength $E_{edge}$ on the upper surface of the substrate each in a dynamic state (solid line) and a static state (broken line) of the IGBT 900A (FIG. 4) as the comparative example. FIG. 32B shows relationships between the position X and the electric field strength $E_{edge}$ on the upper surface of the substrate each in the dynamic state (solid line) and the static state (broken line) of the IGBT 900G (FIG. 27) as the embodiment. Herein, the condition for the static state is that a collector-emitter voltage $V_{CES}$=3600 V, a gate voltage $V_G$=0 V, and a temperature T=423 K. For the dynamic state, the state indicated by the arrow in FIG. 30A is used. As seen from the results, the electric field strength $E_{edge}$ around the boundary between the interface area AR2 and the edge termination area AR3 is lower in not only the static state but also the dynamic state of the IGBT 900G than that in the IGBT 900A. In this manner, the electric field strength is more suppressed in the IGBT 900G than that in the IGBT 900A, and thus the impact ionization is suppressed (FIG. 31B), which conceivably suppresses the local temperature rise (FIG. 31A).

As described above, this embodiment can increase the turn-off breaking capability. Moreover, the active area AR1 can have the same configuration as that in the IGBT 900A (FIG. 4) in the comparative example, so that the other characteristics are not particularly adversely affected. Thus, this embodiment can also obtain the similar characteristics to those of the IGBT 900D (FIG. 6) described above.

Further, this embodiment can reduce the width of the edge termination area AR3. According to estimates by the simulation, the width measurement can be reduced by approximately 40 to 50%. This will be described below.

Figure 33:
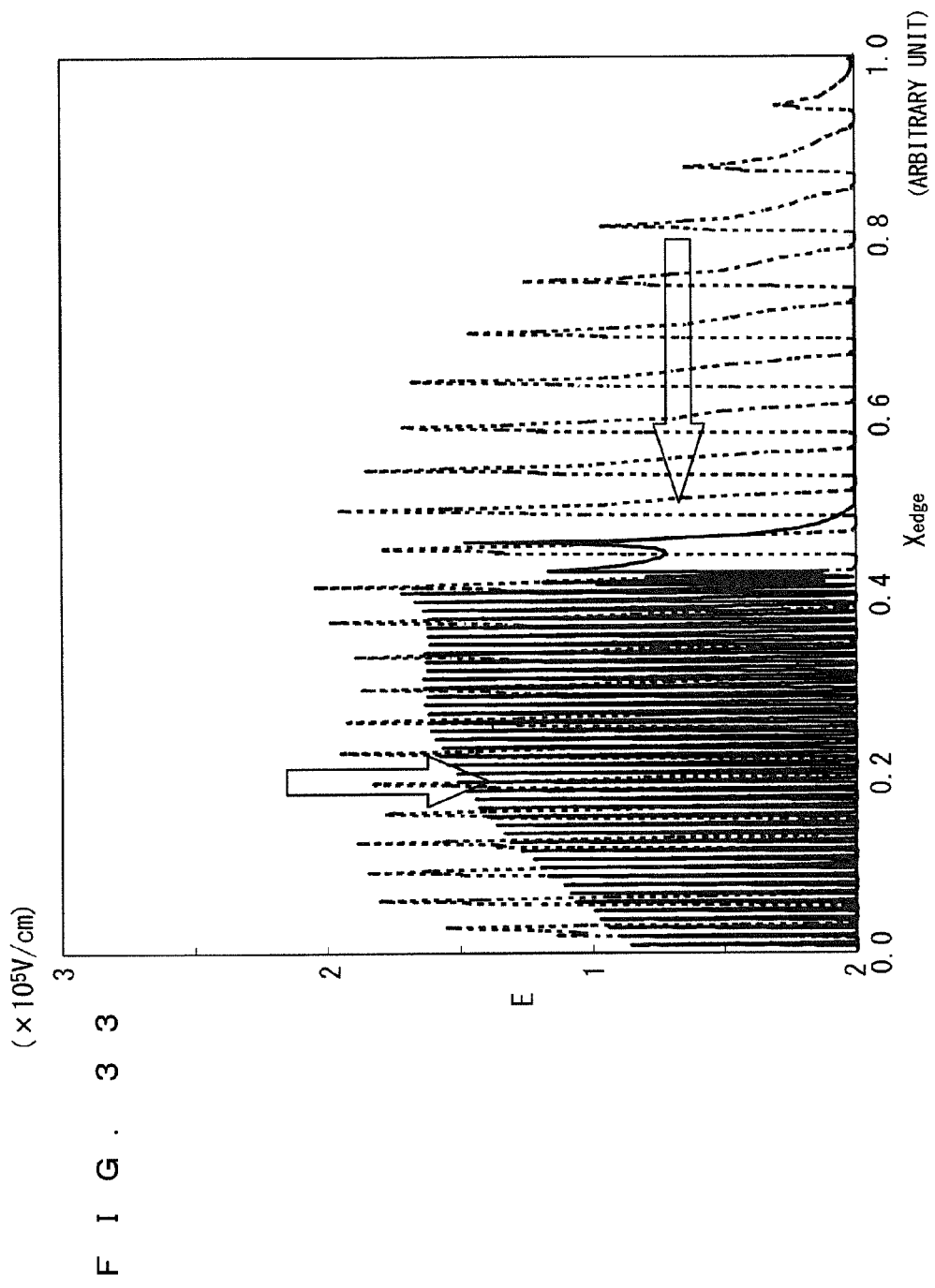
FIG. 33 is a graphical representation showing relationships between a position $X_{edge}$ along a F-F' line and electric field strength E in the static state of the comparative example (broken line) having the structure A (FIG. 4) and the embodiment (solid line) having the structure G (FIG. 27).

FIG. 33 shows relationships between a position $X_{edge}$ along a F-F' line and electric field strength E in the IGBT 900A (FIG. 4) as the comparative example (broken line) and in the IGBT 900G (FIG. 27) as the embodiment (solid line) under the conditions that a collector-emitter voltage $V_{CES}$=4500 V and a temperature T=298 K. As seen from the results, when the comparative example and the embodiment keep the same collector-emitter voltage $V_{CES}$, the embodiment suppresses the electric field strength E more (see the down arrow in the diagram) than the comparative example while suppressing the measurement necessary for the position $X_{edge}$ (see the left arrow in the diagram).

FIG. 34 is a graphical representation showing relationships between a breakdown voltage class $V_{class}$ and a necessary width $W_{edge}$ of the edge termination area AR3 in the comparative example (broken line) and the embodiment (solid line). The necessary width $W_{edge}$ of the edge termination area AR3 can be more reduced by 40 to 50% in the embodiment than that in the comparative example regardless of the breakdown voltage class $V_{class}$. In other words, the device structure of FIG. 27 in this embodiment allows for chip-size shrinking effects of reducing $X_n$ and $Y_n$ being the chip size of the semiconductor device shown in FIG. 3 without changing the size of the active area AR1 occupied in the semiconductor device. Specifically, this embodiment can increase the number of semiconductor devices (the number of theoretical chips) per wafer in which the semiconductor devices are formed and can reduce the cost of the chip.

Figure 35:
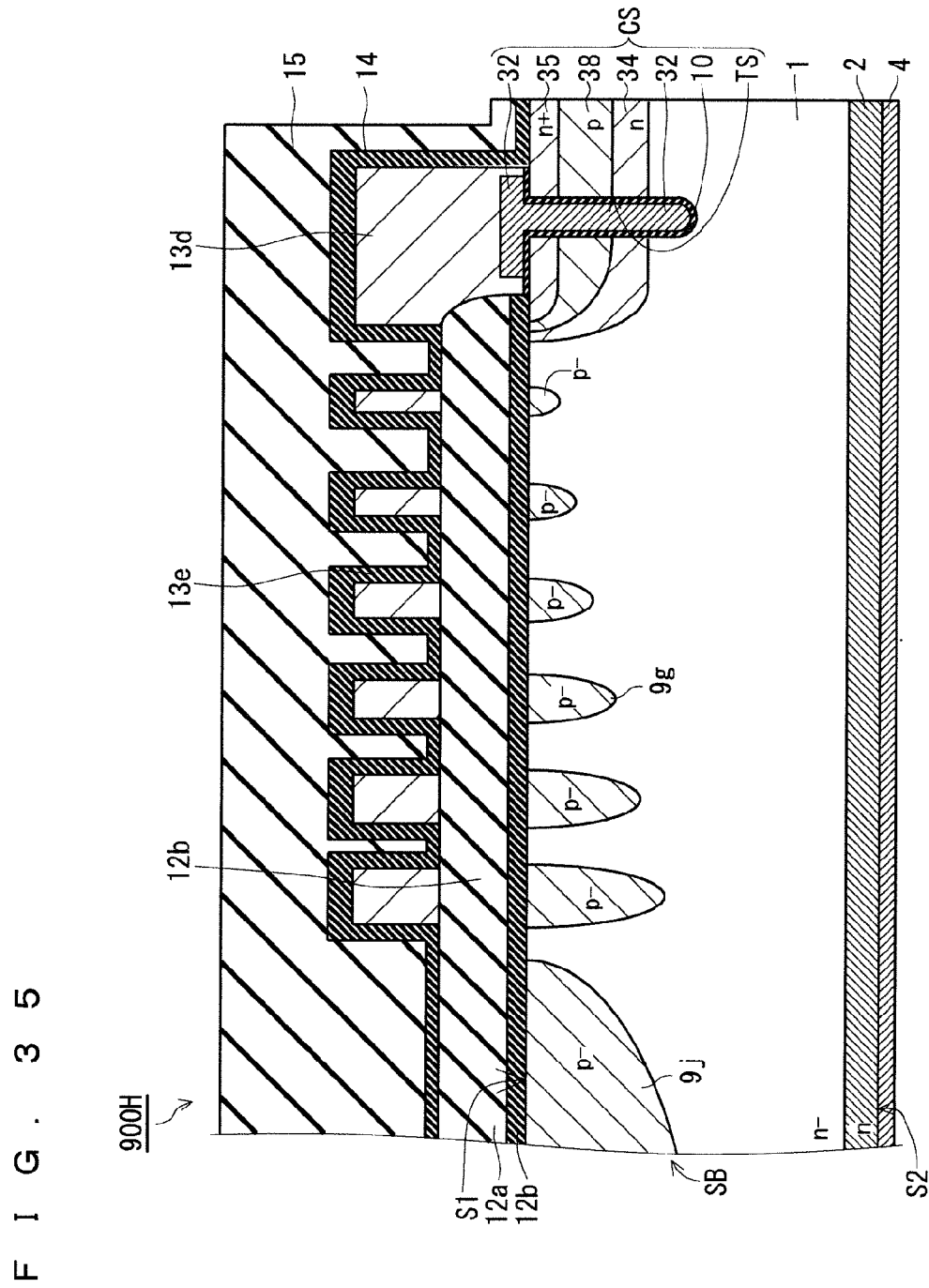
FIG. 35 is a partial cross-sectional view schematically showing a structure H of a modification of FIG. 28 (IGBT 900H, structure H).
Figure 36A:
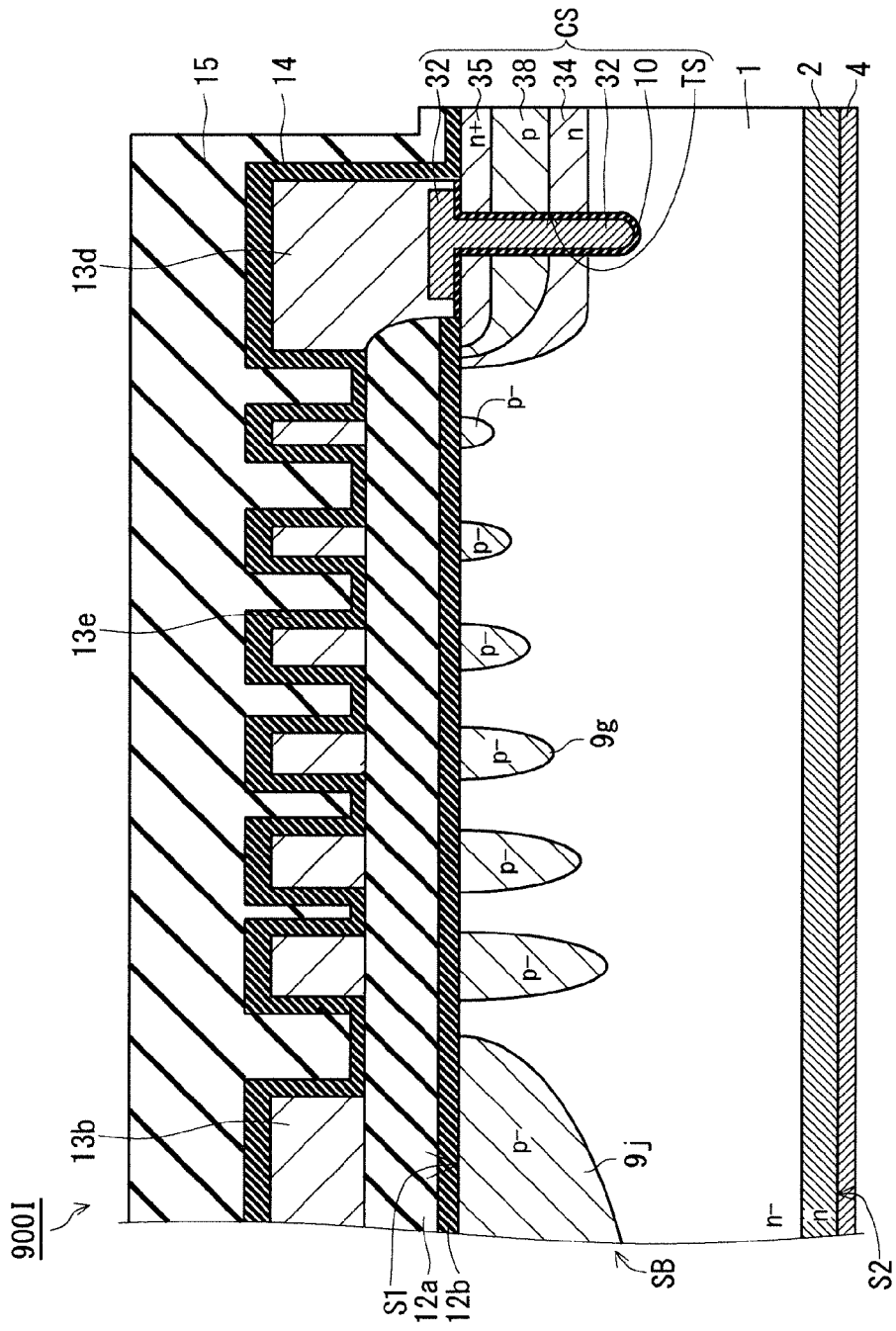
FIG. 36A is a partial cross-sectional view schematically showing a structure I of a modification of FIG. 28 (IGBT 900I, structure I).
Figure 36B:
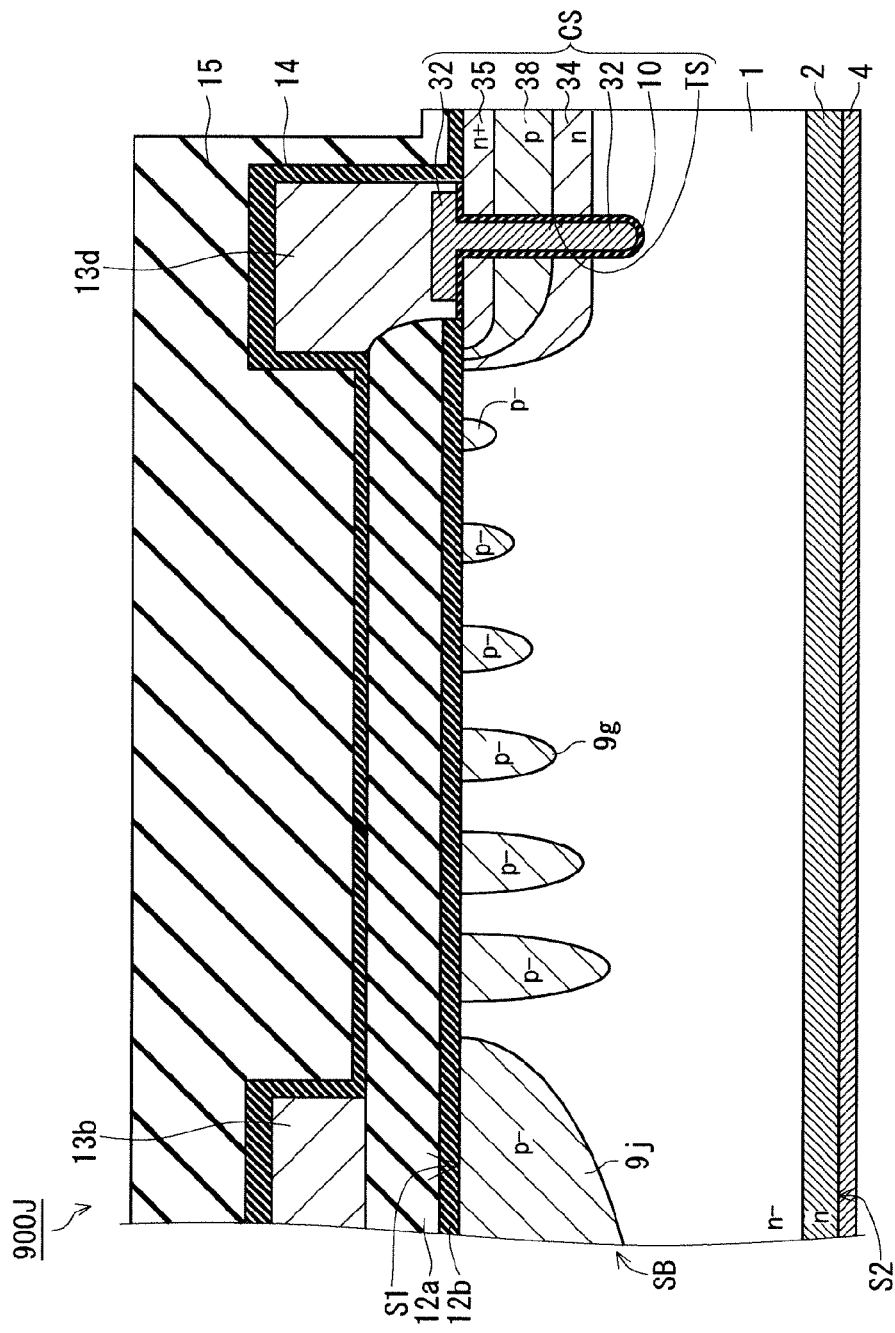
FIG. 36B is a partial cross-sectional view schematically showing a structure J of a modification of FIG. 28 (IGBT 900J, structure J).

Next, a modification is described below. With reference to FIG. 35, an IGBT 900H includes a floating electrode 13e on each of the p⁻-field-limiting rings 9g with the interlayer insulating films 12a, 12b therebetween. Each of the floating electrodes 13e is disposed within the p⁻-field-limiting ring 9g located directly below the floating electrode 13e in a width direction (lateral direction in FIG. 35) with the interlayer insulating films 12a, 12b therebetween. With reference to FIG. 36A, in an IGBT 900I, a gate connecting electrode 13b (see FIG. 27) extends to the p⁻-extension region 9j with the interlayer insulating films 12a, 12b, which cover the p⁻-extension region 9j, between the gate connecting electrode 13b and the p⁻-extension region 9j. It should be noted that the gate connecting electrode 13b is formed so as to be located on the inner side of the p⁻-extension region 9j and the floating electrodes 13e are formed so as to be located within the p⁻-field-limiting rings 9g as described above in the width direction (lateral direction in the diagram). With reference to FIG. 36B, an IGBT 900J has the structure of the IGBT 900I (FIG. 36A) from which the floating electrodes 13e are omitted. These structures can obtain the higher breakdown voltage and the higher breaking capability while a distribution of the electric field strength in the edge termination area AR3 characterized by the IGBT 900G in FIGS. 32B, 33 does not vary with time and is stabilized in a range of operation temperatures that guarantee the performance of the IGBT even if electrical stress is applied.

Third Embodiment

This embodiment gives descriptions of a diode having the same configuration as the ballast resistance region (FIG. 5: the portion having the width $L_{EEBR}$ in the p-well region 9a in the IGBT 900C) described in the first embodiment. In addition, part of the descriptions of the same configuration as the IGBT 900C will not be repeated.

Figure 37:
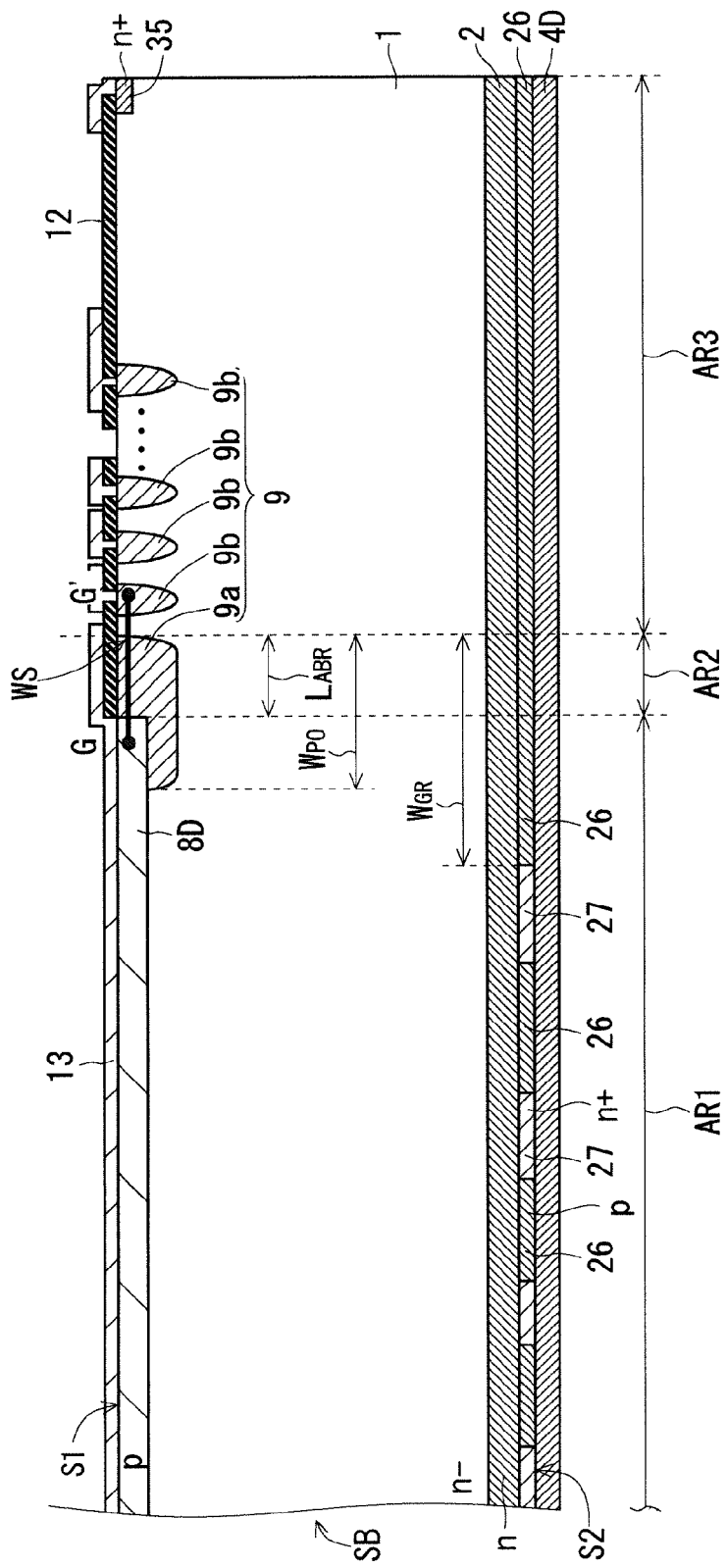
FIG. 37 is a partial cross-sectional view schematically showing a configuration of a diode as a power semiconductor device in a third embodiment of the present invention (diode 800A).

With reference to FIG. 37, a diode 800A (power semiconductor device) in this embodiment has an active area AR1, an interface area AR2 provided around a periphery of the active area AR1, and an edge termination area AR3 provided around a periphery of the interface area AR2 similarly to the IGBT shown in FIG. 5. The active area AR1 is a portion having the basic functions of the diode in this embodiment.

The diode 800A includes a substrate SB (semiconductor substrate), an anode electrode 13 (first electrode), a cathode electrode 4D (second electrode), and an interlayer insulating film 12. The substrate SB includes an n$^-$-drift layer 1 (drift region), an n-buffer layer 2, an anode layer 8D, a p-guard ring 9, a p-layer 26, an n$^+$-layer 27, and an n$^+$-region 35. The anode electrode 13 is provided in the active area AR1 and contacts the anode layer 8D on an upper surface S1 of the substrate SB. The anode layer 8D is provided on the n$^-$-drift layer 1. The cathode electrode 4D contacts a semiconductor layer formed of the p-layer 26 and the n$^+$-layer 27 on a lower surface S2 of the substrate SB. The n$^+$-layer 27 is provided only in the active area AR1. The n-buffer layer 2 is provided between the semiconductor layer and the n$^-$-drift layer 1. The interlayer insulating film 12 has openings in the active area AR1.

The anode layer 8D has a depth of approximately 0.5 to 10 μm, for example. The anode layer 8D has a p-type and has a peak impurity concentration of, for example, approximately $1\times10^{16}$ to $1\times10^{20}$ cm$^{-3}$. The p-guard ring 9 has a depth of approximately 5 to 10 μm, for example. The p-guard ring 9 has a peak impurity concentration of approximately $1\times10^{16}$ to $1\times10^{20}$ cm$^3$, for example. The n$^+$-region 35 has a depth of approximately 0.2 to 1 μm, for example. The n$^+$-region 35 has an n-type and has a peak impurity concentration of, for example, approximately $1\times10^{18}$ to $1\times10^{21}$ cm$^{-3}$. The p-layer 26 has a depth of approximately 0.3 to 5 μm, for example. The p-layer 26 has a surface impurity concentration of approximately $1\times10^{16}$ to $1\times10^{20}$ cm$^{-3}$, for example. The n$^+$-layer 27 has a depth of approximately 0.3 to 5 μm, for example. The n$^+$-layer 27 has a surface impurity concentration of approximately $1\times10^{18}$ to $1\times10^{20}$ cm$^3$, for example.

A p-well region 9a in the diode 800A forms an electrical path that connects the anode electrode 13 to an end portion (right end in the diagram) of the p-well region 9a with the p-type region on the upper surface S1. This electrical path crosses the interface area AR2 between the active area AR1 and the edge termination area AR3 and has a resistance region having a width $L_{ABR}$. The entire resistance region is covered with the interlayer insulating film 12. The p-well region 9a has a width $W_{p0}$. The outer peripheral end of the n$^+$-layer 27 and the boundary between the interface area AR2 and the edge termination area AR3 are spaced by a distance having a width $W_{GR}$ therebetween.

The widths $L_{ABR}$, $W_{p0}$, and $W_{GR}$ are important parameters in the design of the diode 800A. The width $L_{ABR}$ is set so as to obtain a ballast resistance effect of sharing a temperature rise at both ends of a resistance region during a recovery operation of the diode to suppress a local temperature rise in one of the ends. Specifically, a temperature rise due to a local current concentration at an arrow WS shown in FIG. 37 is shared, to thereby suppress a local temperature rise. In this respect, the width $L_{ABR}$ is specifically greater than or equal to 100 μm.

Figure 38:
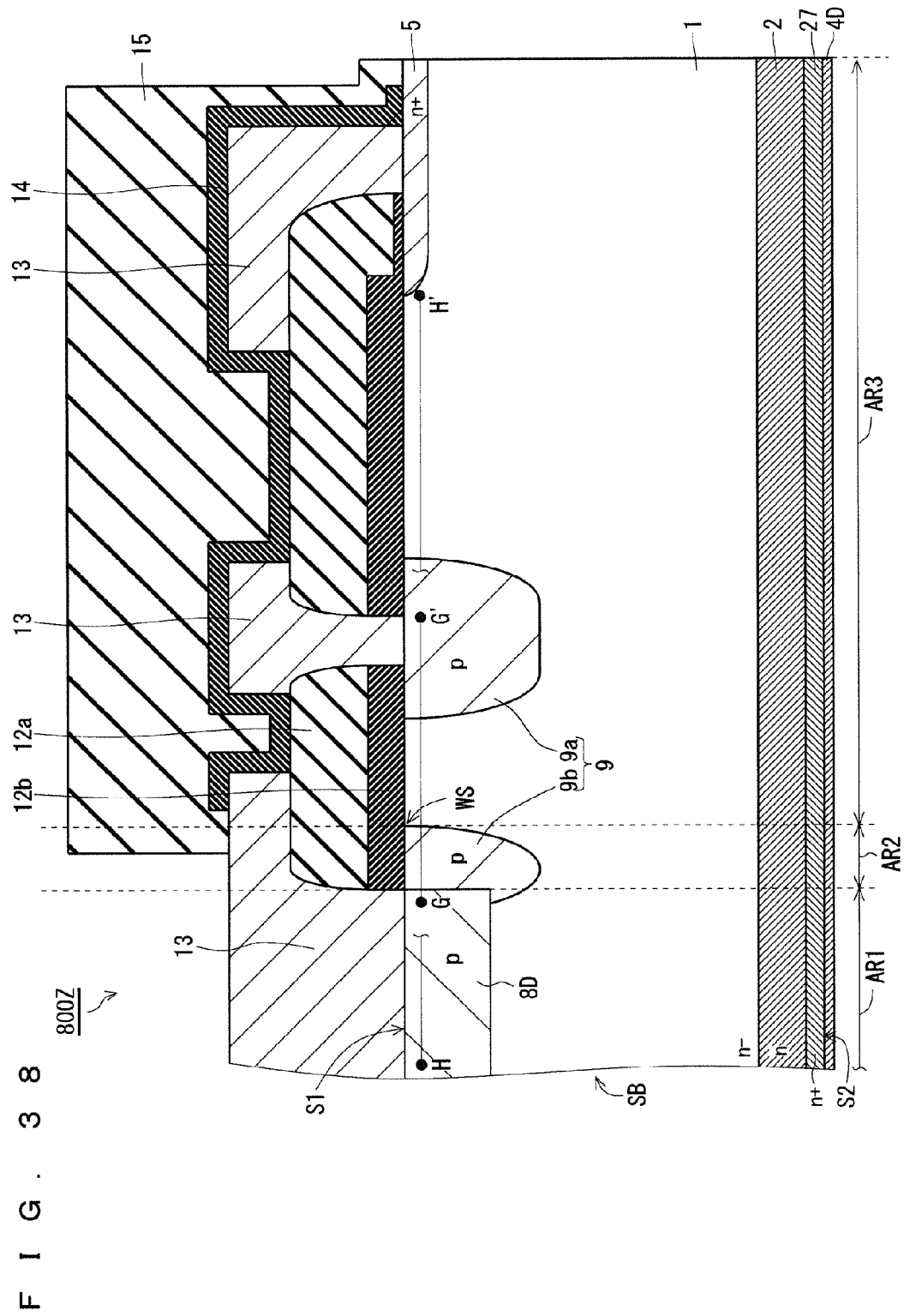
FIG. 38 is a partial cross-sectional view showing a configuration of a diode in a comparative example (diode 800Z).

The ballast resistance region described above is not provided in a diode 800Z (FIG. 38) in a comparative example. FIG. 38 schematically shows one p-edge region 9b, but there are a plurality of p-edge regions 9b similarly to FIG. 37. In the diode 800Z, a local temperature rise is likely to occur in the boundary between the interface area AR2 and the edge termination area AR3, namely, an arrow WS, on the upper surface S1 of the substrate SB during a recovery operation. This phenomenon limits the breaking capability of the diode 800Z.

In contrast, this embodiment suppresses a local temperature rise due to a concentration of current in the boundary between the interface area AR2 and the edge termination area AR3 by distributing the current in the ballast resistance region corresponding to the position of the boundary between the interface area AR2 and the edge termination area AR3, as described below with reference to FIG. 40A, during the recovery operation of the diode. Herein, the active area AR1 can have the same configuration as that in the conventional diode, so that an adverse effect such as an increase in ON-state voltage is not seen. As described above, similarly to the IGBT 900C, the diode 800A also has both of the low ON-state voltage and the high breaking capability.

Next, the verification results of the action effects described above are described below.

Figure 39:
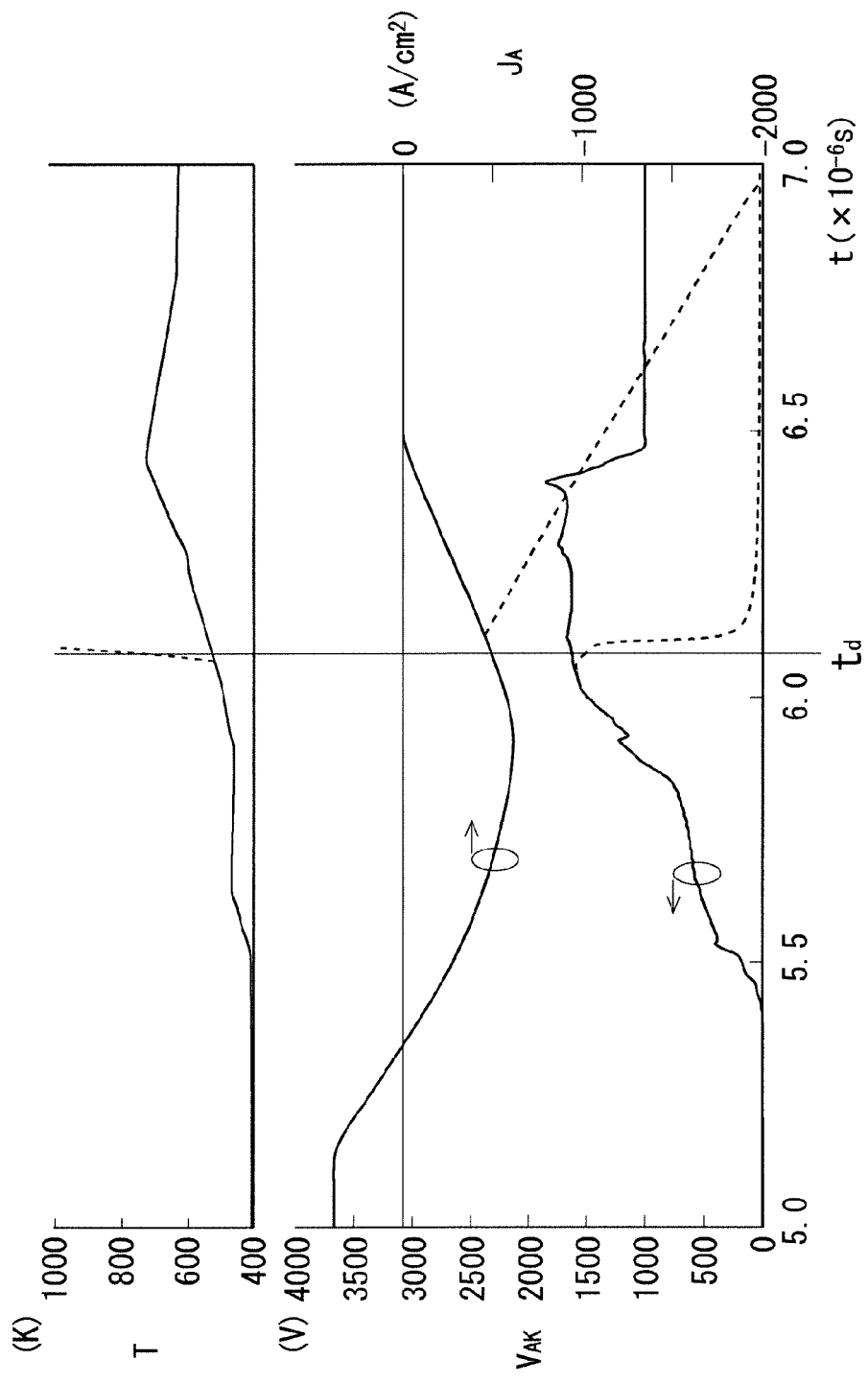
FIG. 39 is a graphical representation showing waveforms of a voltage $V_{AK}$ and a current density $J_A$ during a recovery operation and a peak temperature T inside the device in each of the embodiment (solid line) and the comparative example (broken line).

FIG. 39 shows waveforms of a voltage $V_{AK}$ and a current density $J_A$ during a recovery operation and a peak temperature T inside the device in each of the diode 800A as the embodiment (solid line) and the diode 800Z as the comparative example (broken line). FIG. 40A shows a relationship between a position X along a G-G' line (FIGS. 37 and 38) and the current density $J_A$ at a time $t_d$ (FIG. 39) in each of the embodiment (solid line) and the comparative example (broken line), and FIG. 40B shows a relationship between the position X and a temperature T. In the comparative example (broken line) in which the ballast resistance region is not provided, a concentration of the current density $J_A$ occurs at the end portion of the interface area AR2 located around the boundary between the interface area AR2 and the edge termination area AR3, and a local rise in the temperature T occurs. As a result, as shown in FIG. 39, the diode 800Z fails to complete the breaking operation, leading to breakage. In contrast, in the diode 800A, the current density $J_A$ is distributed in the interface area AR2 without being extremely concentrated, and there exists no place that is heated to 800 K or more, an index of temperature at which breakage of the device is likely to occur. The ballast resistance region shares the current, so that the diode 800A performs the breaking operation without breakage. Thus, the breaking capability of the diode in the embodiment improves.

Figure 41:
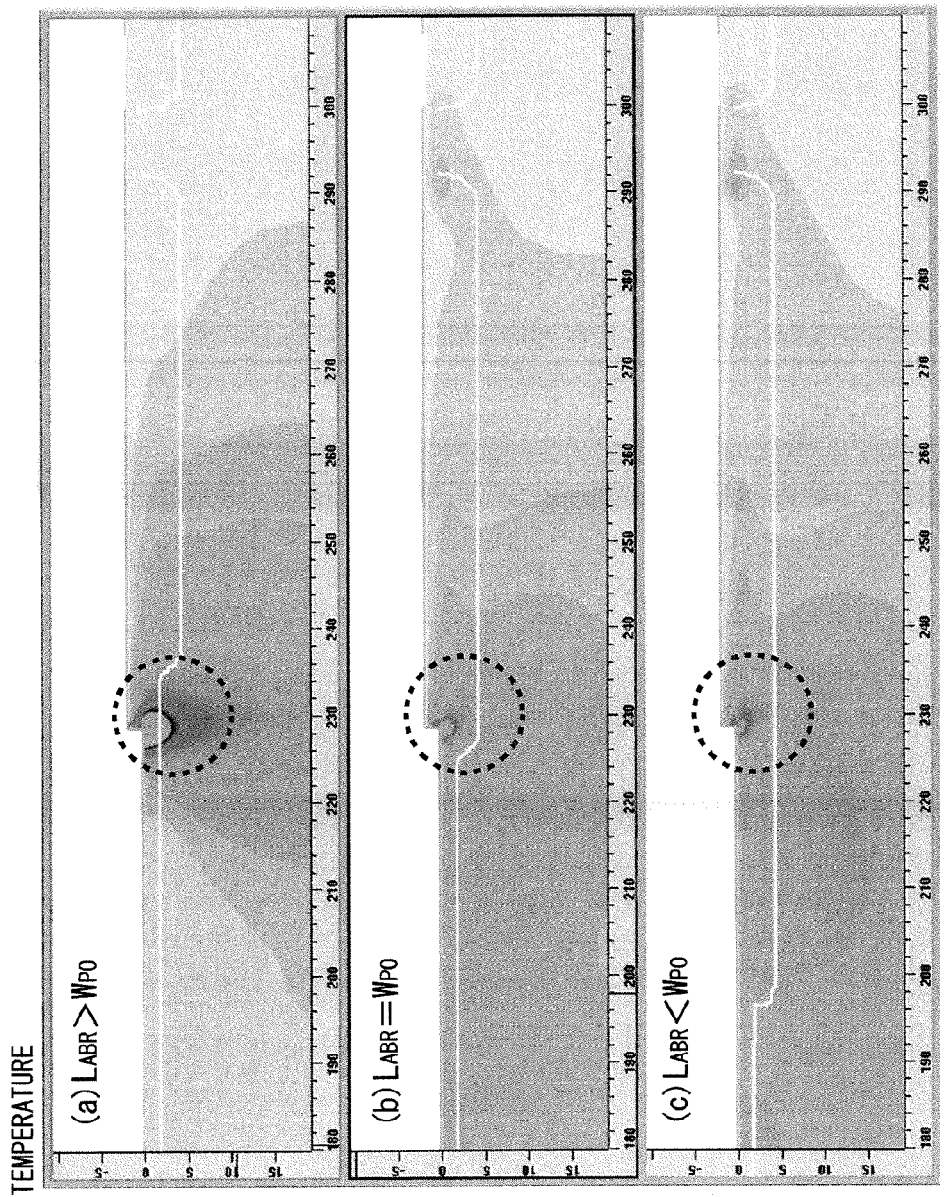
FIG. 41 is a distribution chart showing relationships between widths $L_{ABR}$, $W_{p0}$ in FIG. 37 and a temperature inside the device at the time $t_d$ (FIG. 39).
Figure 42A:
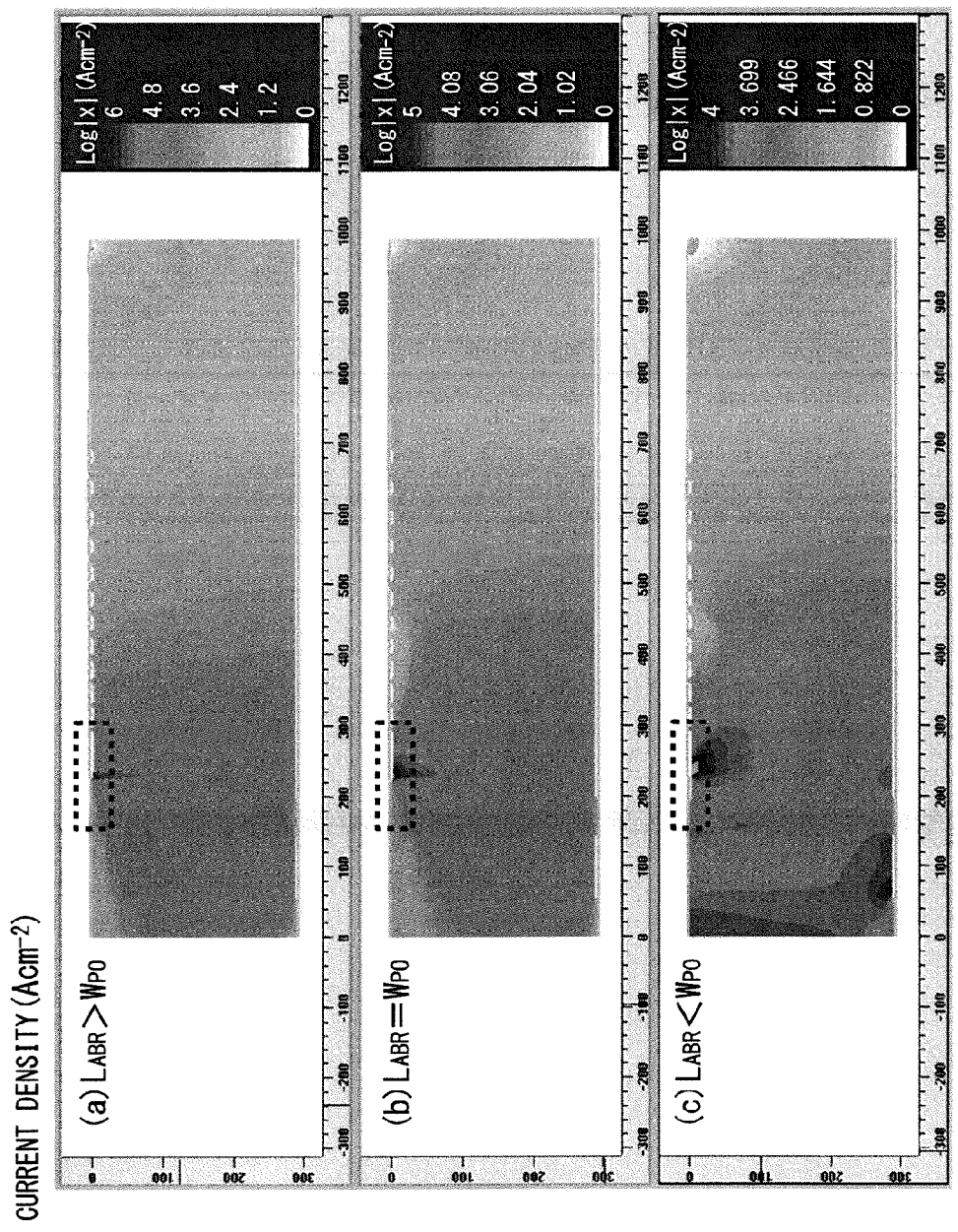
FIG. 42A is a distribution chart showing relationships between the widths $L_{ABR}$, $W_{p0}$ in FIG. 37 and a current density inside the device at the time $t_d$ (FIG. 39).

FIGS. 41, 42A, and 42B show relationships between the widths $L_{ABR}$, $W_{p0}$ (FIG. 37) of the diode 800A and a temperature or a current density inside the device at the time $t_d$ (FIG. 39). As seen from the results, $L_{ABR}<W_{p0}$ needs to be set to suppress a concentration of the current density and a local temperature rise in order to improve the breaking capability of the diode.

Figure 43:
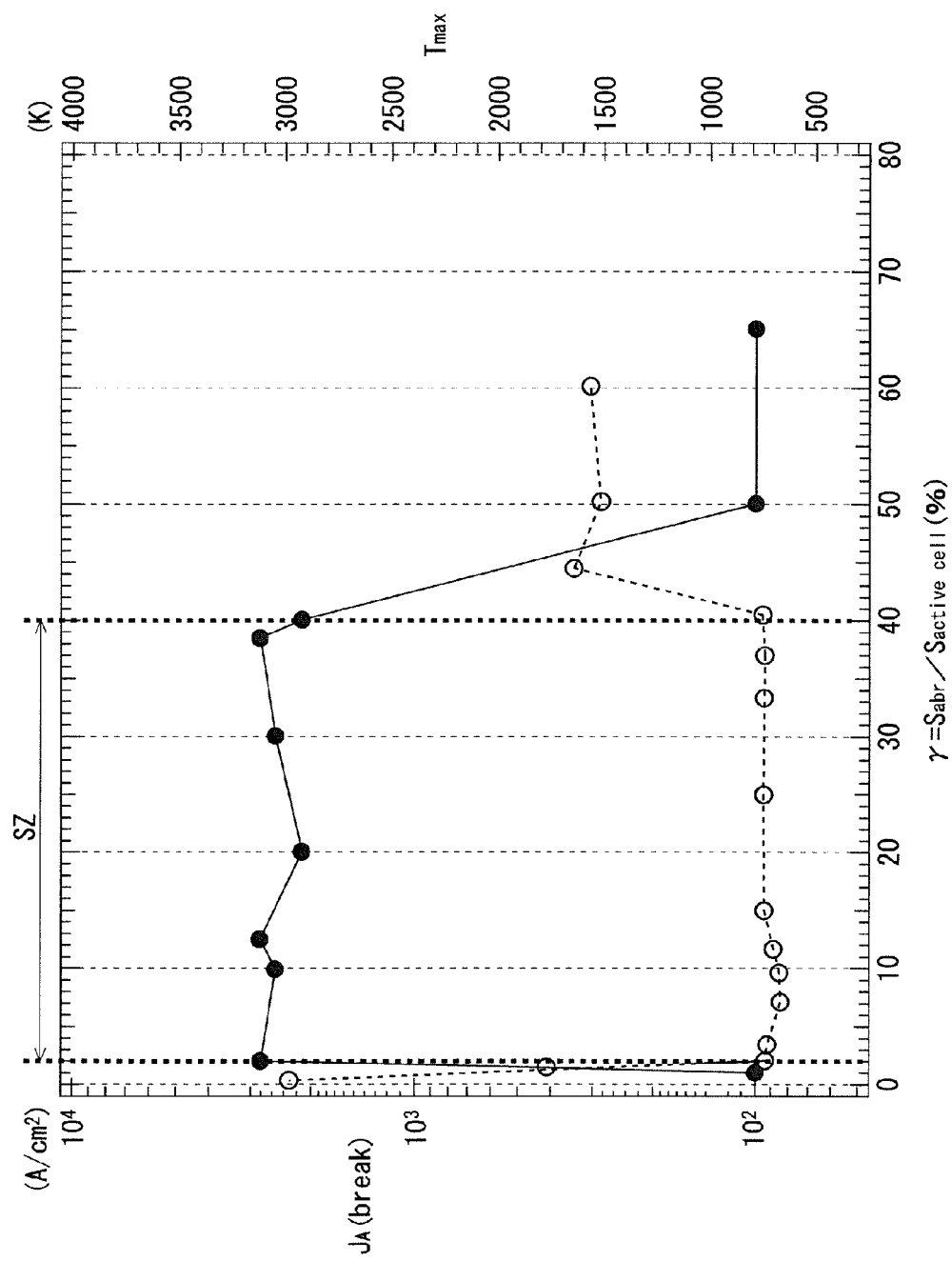
FIG. 43 is a graphical representation showing relationships between a proportion γ of an area $S_{abr}$ of a ballast resistance region to an area $S_{active\ cell}$ of an active area and a maximum breaking current density $J_A$ (break) or an inside-device maximum temperature $T_{max}$ during a recovery operation.

FIG. 43 shows relationships between a proportion γ of an area $S_{abr}$ of the ballast resistance region to an area $S_{active\ cell}$ (namely, the area of the anode electrode 13) of the active area AR1 (FIG. 37) and a maximum breaking current density $J_A$ (break) or an inside-device maximum temperature $T_{max}$ during a recovery operation. In the example of FIG. 37, the area $S_{abr}$ is substantially the same as the area of the interface area AR2, as shown in FIG. 44. $J_A$ (break) is an experimental result in the actual device, and $T_{max}$ is a simulation result. When γ is selected by the simulation such that $T_{max}$ is set to be less than or equal to 800 K (in a safety region SZ in the diagram), the actual device having high $J_A$ (break) can be obtained. Specifically, it is clear that the high $J_A$ (break) can be obtained when γ is greater than or equal to 2% and less than or equal to 40%.

With reference to FIG. 37, the width $W_{GR}$ is preferably set to be greater than the width $W_{p0}$. To summarize the subject of the parameters, the relationships below need to be satisfied in order to increase the breaking capability of the diode 800A.

$$L_{ABR} < W_{p0}$$

$$2\% \leq \gamma \leq 40\%$$

$$W_{GR} > W_{p0}$$

Fourth Embodiment

This embodiment gives descriptions of a diode having the same configuration as the unit structure US in the IGBT 900G (FIG. 28) described in the second embodiment. In addition, part of the descriptions of the same configuration as the IGBT 900G or the diode 800A (FIG. 37) described above will not be repeated.

Figure 45A:
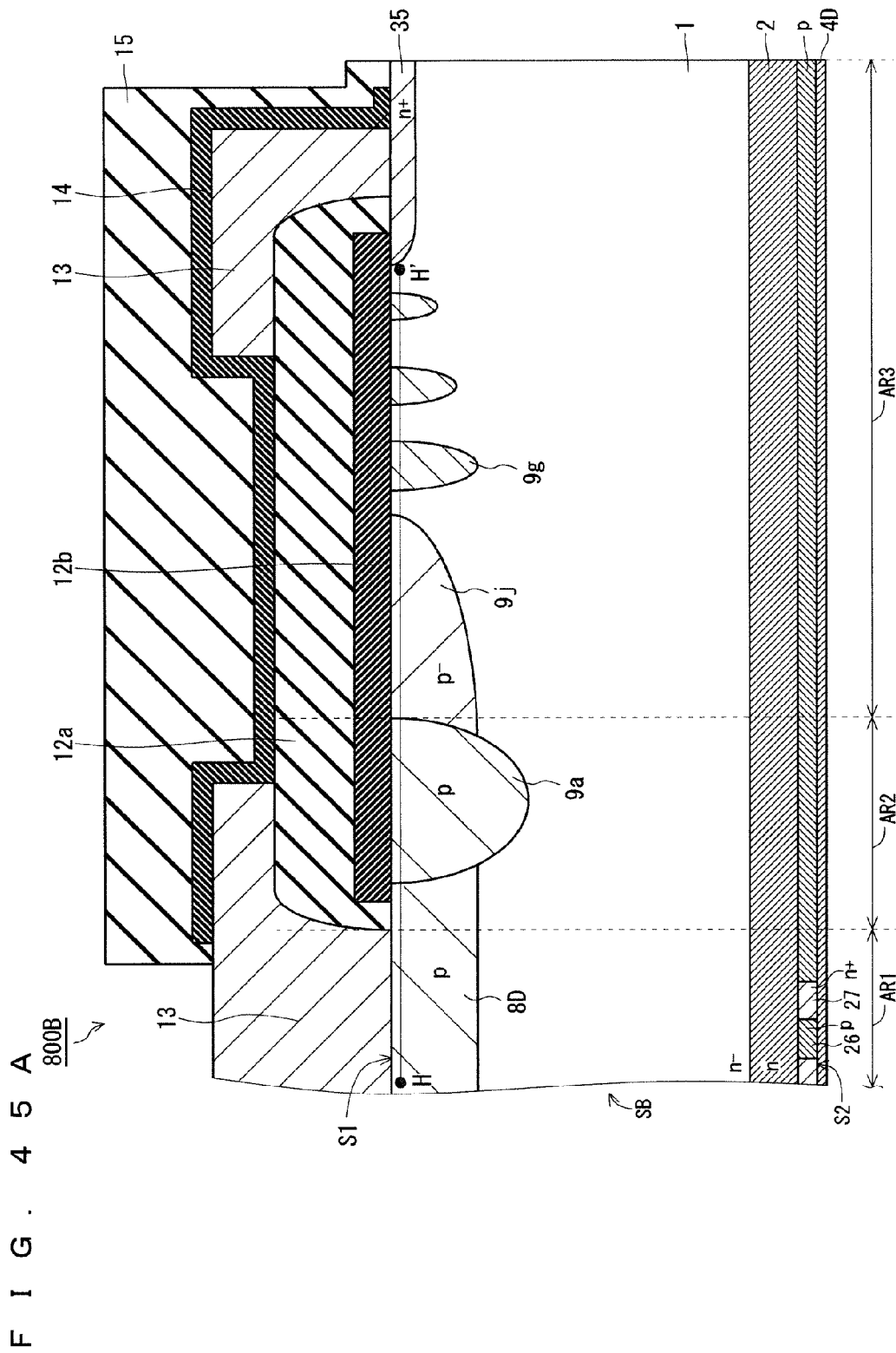
FIG. 45A is a partial cross-sectional view schematically showing a configuration of a diode as a power semiconductor device in a fourth embodiment of the present invention (diode 800B).
Figure 45B:
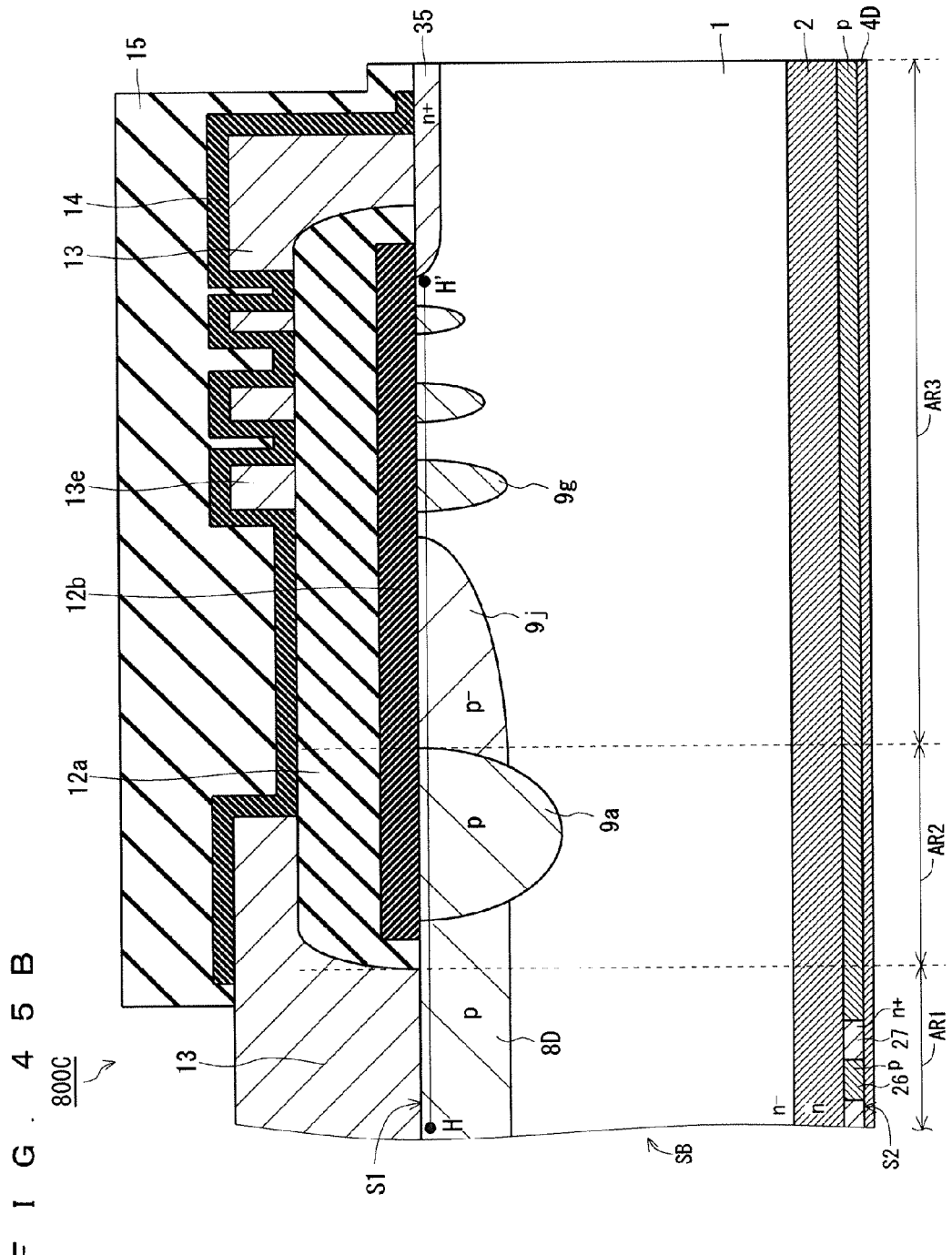
FIG. 45B is a partial cross-sectional view showing a configuration of a modification of FIG. 45A (diode 800C).
Figure 45D:
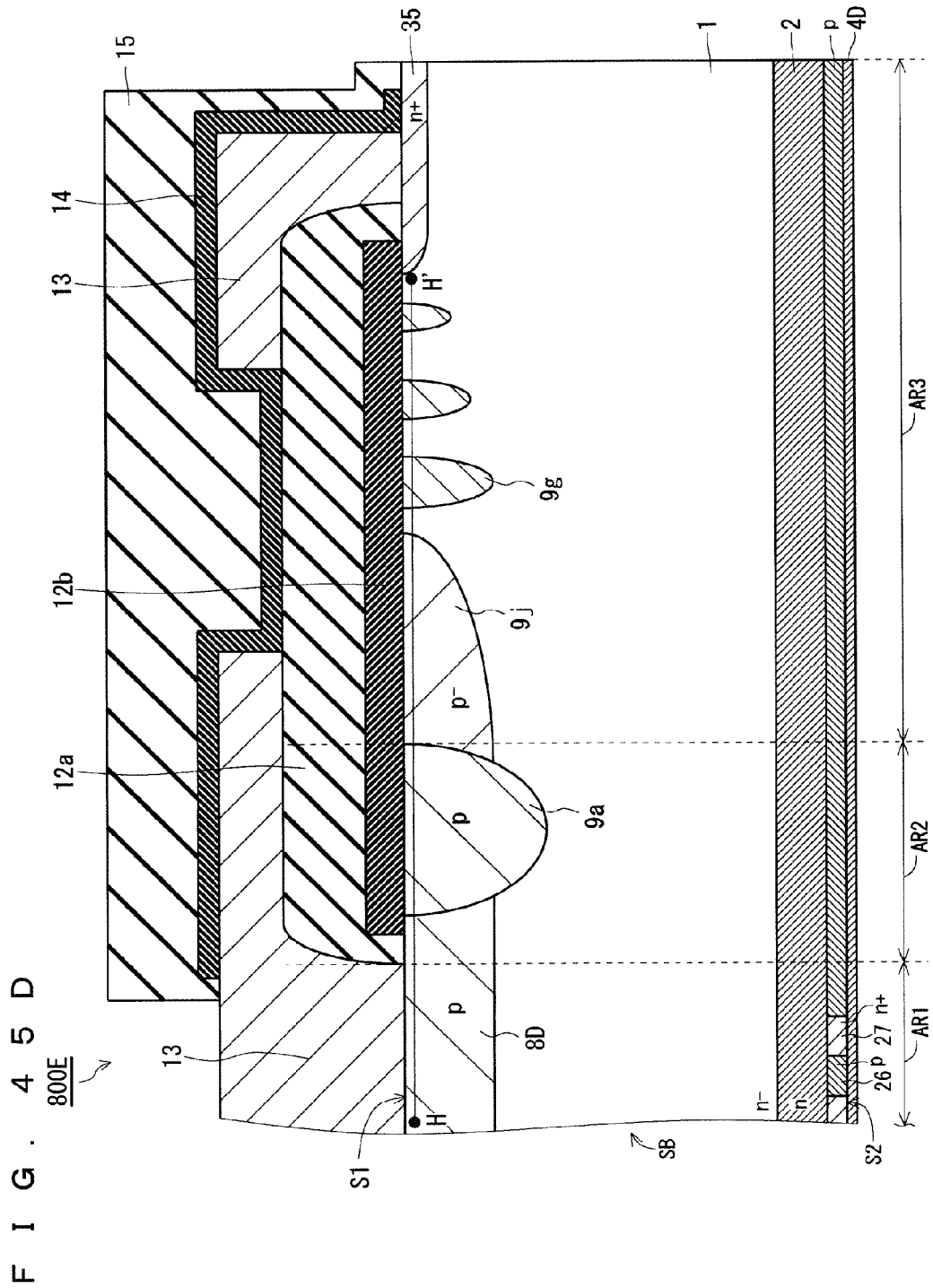
FIG. 45D is a partial cross-sectional view showing a configuration of a modification of FIG. 45A (diode 800E).

With reference to FIG. 45A, a diode 800B in this embodiment includes an interlayer insulating film 12a and an interlayer insulating film 12b on an upper surface S1 of a substrate SB in an interface area AR2 and an edge termination area AR3. The substrate SB includes an anode layer 8D (impurity layer) that is provided on the upper surface S1 and has a p-type. The substrate SB includes a $p^-$-extension region 9j and a plurality of $p^-$-field-limiting rings 9g on the upper surface S1 in the edge termination area AR3. Similarly to the third embodiment, an $n^-$-drift layer 1 is located on the inner side of each of the $p^-$-field-limiting rings 9g on the upper surface S1, and each of the $p^-$-field-limiting rings 9g together with the $n^-$-drift layer 1 located on the inner side forms the unit structure US (FIG. 28). FIGS. 45B to 45D respectively show diodes 800C to 800E being modifications. The diode 800C (FIG. 45B) includes floating electrodes 13e similarly to the IGBT 900H (FIG. 35). In the diode 800D (FIG. 45C), an anode electrode 13 extends to the $p^-$-extension region 9j with the interlayer insulating films 12a, 12b therebetween, similarly to the gate connecting electrode 13b in the IGBT 900I (FIG. 36A). The diode 800E (FIG. 45D) has the structure of the diode 800D (FIG. 45C) from which the floating electrodes 13e are omitted.

Figure 46B:
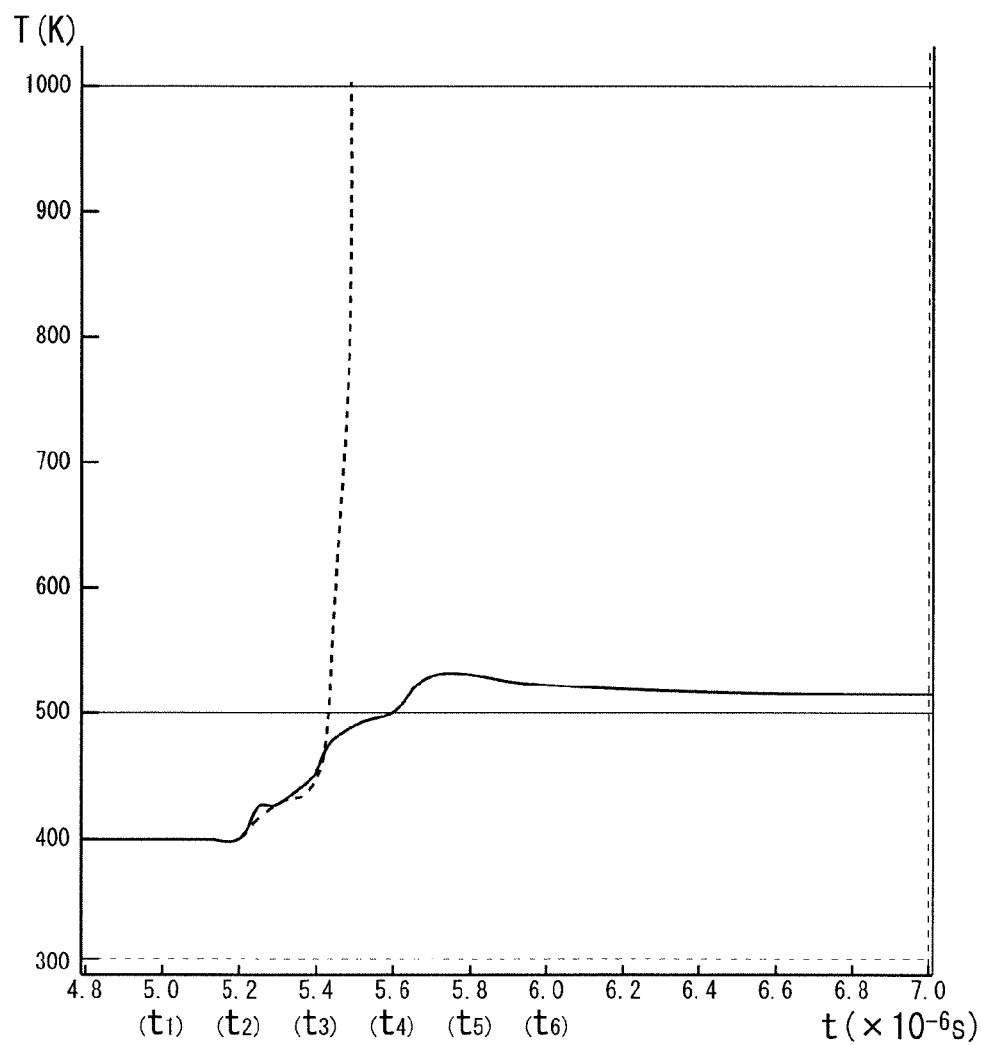
FIG. 46B is a graphical representation showing simulation results of a peak temperature T inside the device during the recovery operation in each of the embodiment (solid line) and the comparative example (broken line).
Figure 47B:
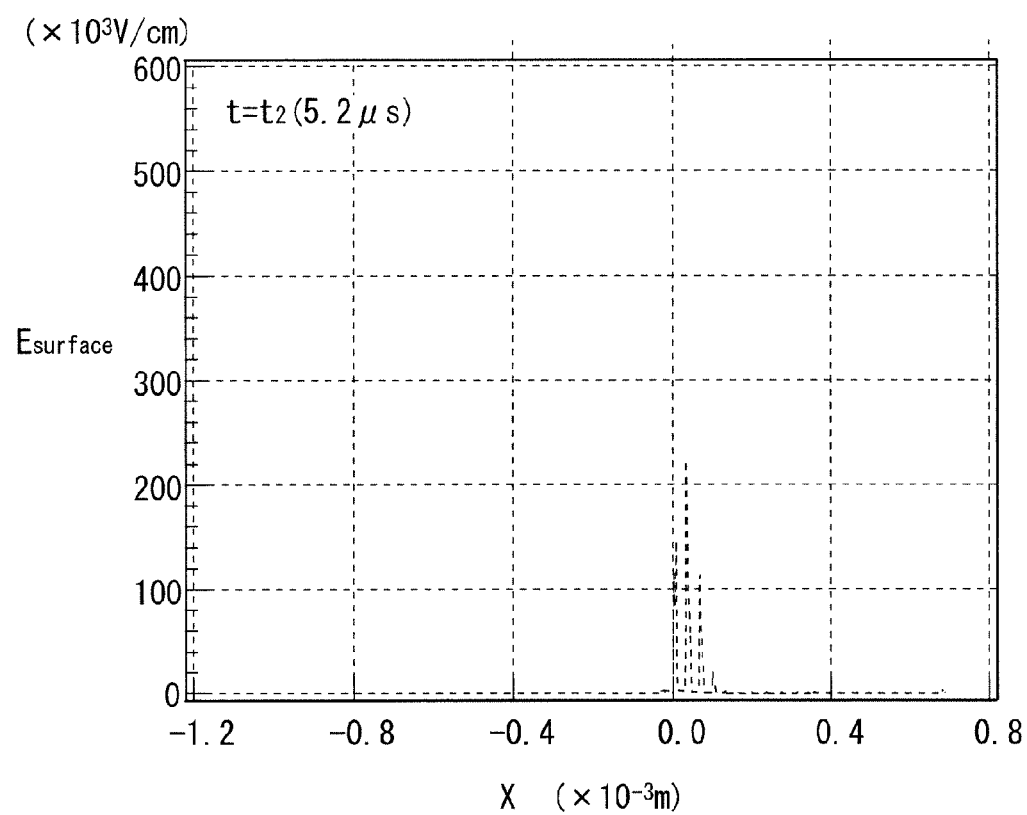
FIG. 47B is a graphical representation showing a relationship between the position X in the H-H' line (FIG. 38) of the comparative example and the electric field strength $E_{surface}$ when t=$t_2$ (FIGS. 46A and 46B).
Figure 48C:
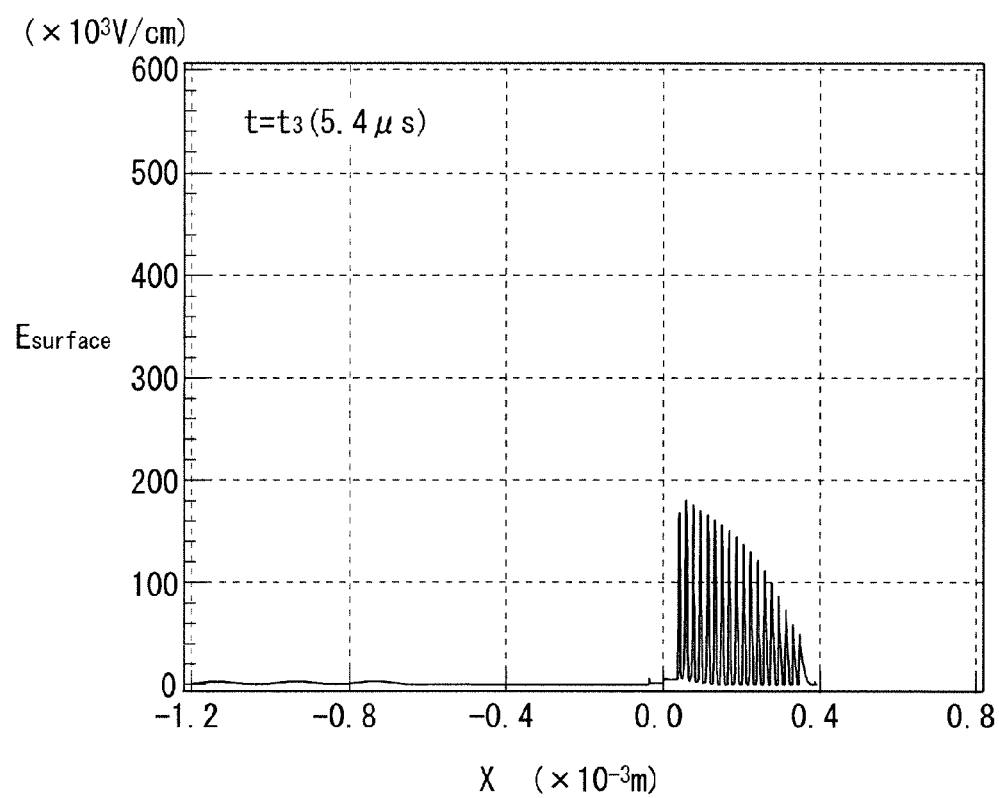
FIG. 48C is a graphical representation showing a relationship between the position X in the H-H' line (FIG. 45A) of the embodiment and the electric field strength $E_{surface}$ when $t=t_3$ (FIGS. 46A and 46B).
Figure 48E:
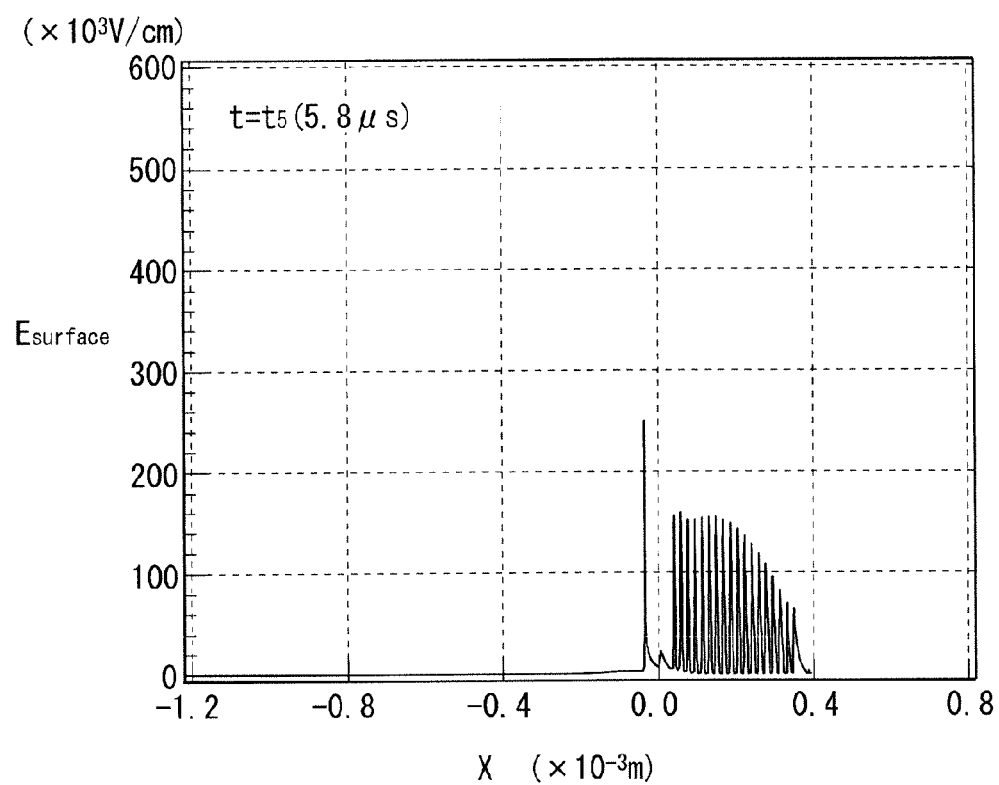
FIG. 48E is a graphical representation showing a relationship between the position X in the H-H' line (FIG. 45A) of the embodiment and the electric field strength $E_{surface}$ when $t=t_5$ (FIGS. 46A and 46B).
Figure 48F:
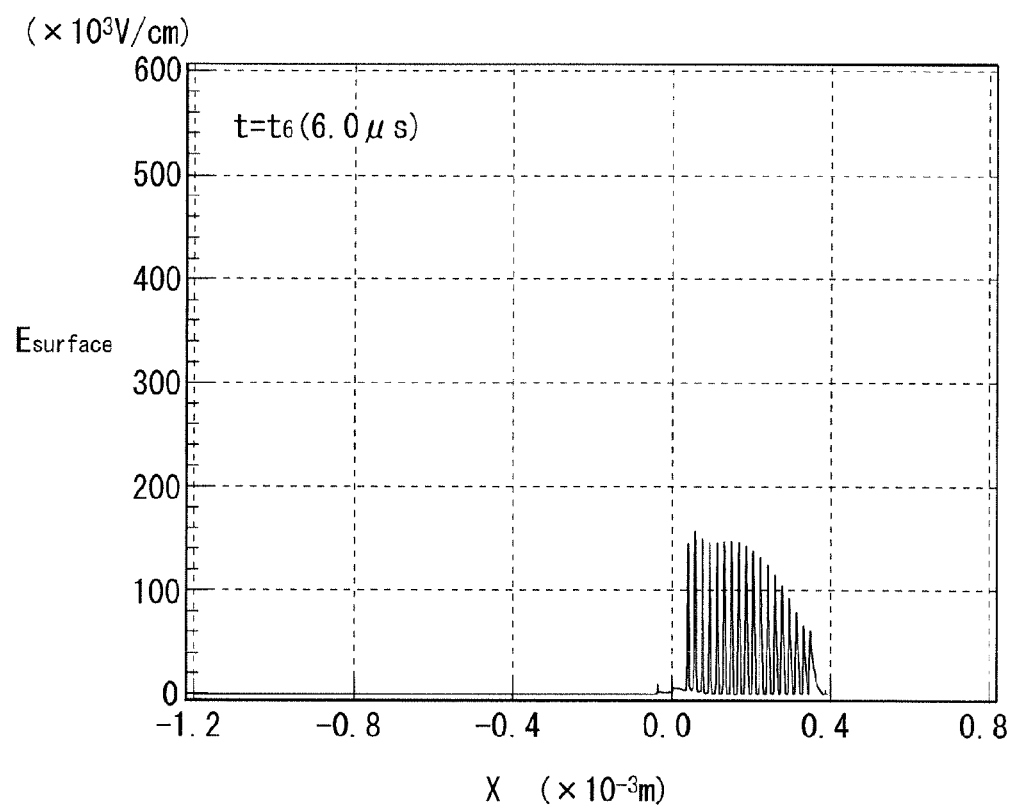
FIG. 48F is a graphical representation showing a relationship between the position X in the H-H' line (FIG. 45A) of the embodiment and the electric field strength $E_{surface}$ when $t=t_6$ (FIGS. 46A and 46B).
Figure 49A:
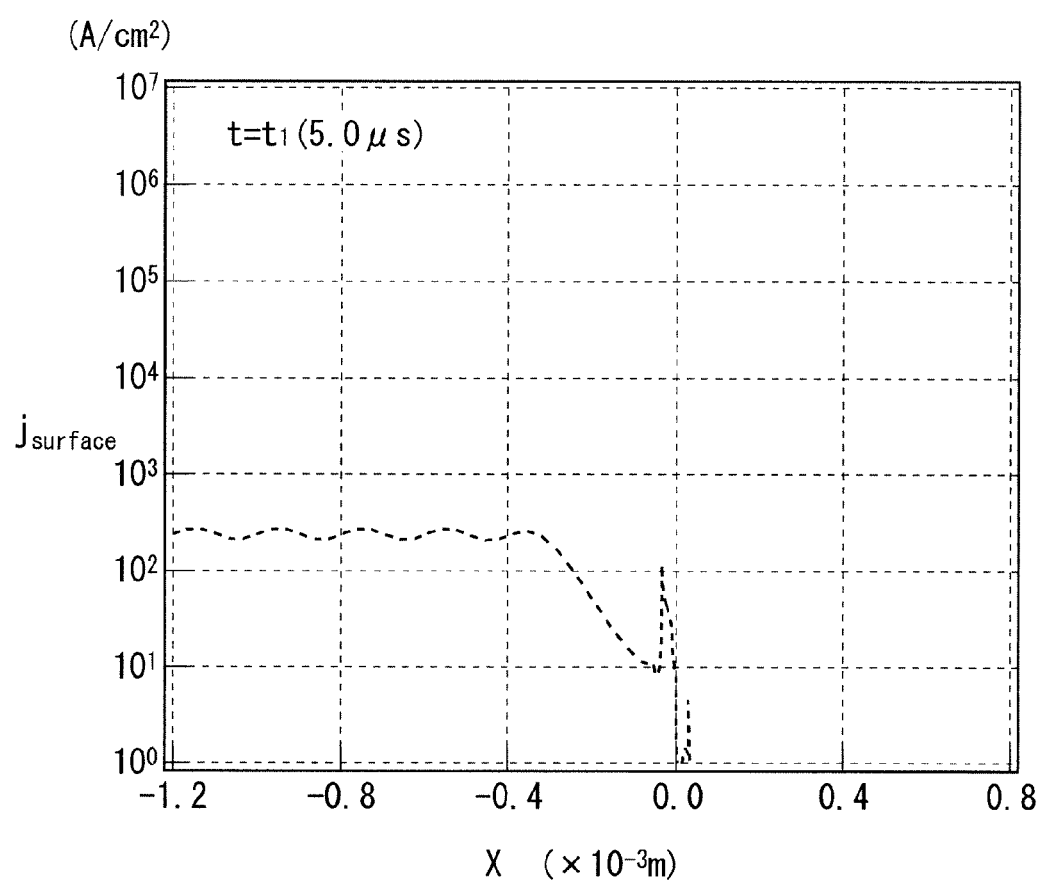
FIG. 49A is a graphical representation showing a relationship between the position X in the H-H' line (FIG. 38) of the comparative example and a current density $j_{surface}$ when $t=t_1$ (FIGS. 46A and 46B).
Figure 49B:
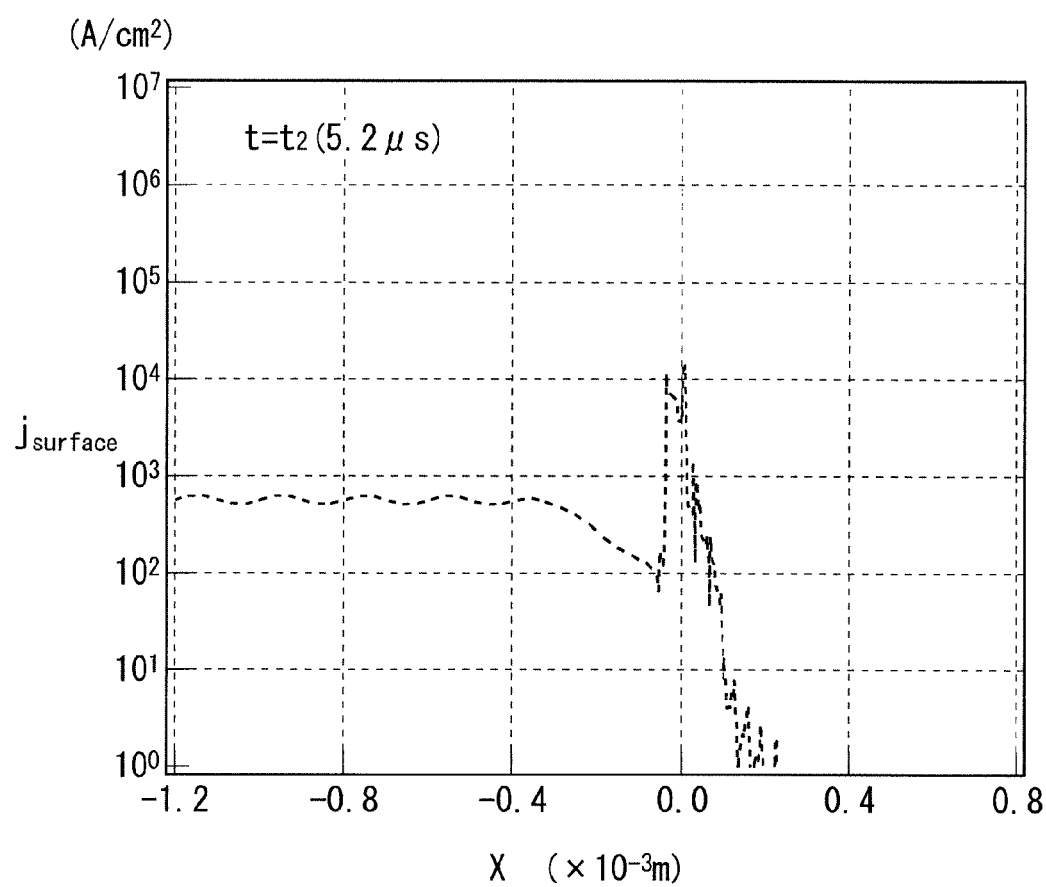
FIG. 49B is a graphical representation showing a relationship between the position X in the H-H' line (FIG. 38) of the comparative example and the current density $j_{surface}$ when $t=t_2$ (FIGS. 46A and 46B).
Figure 49D:
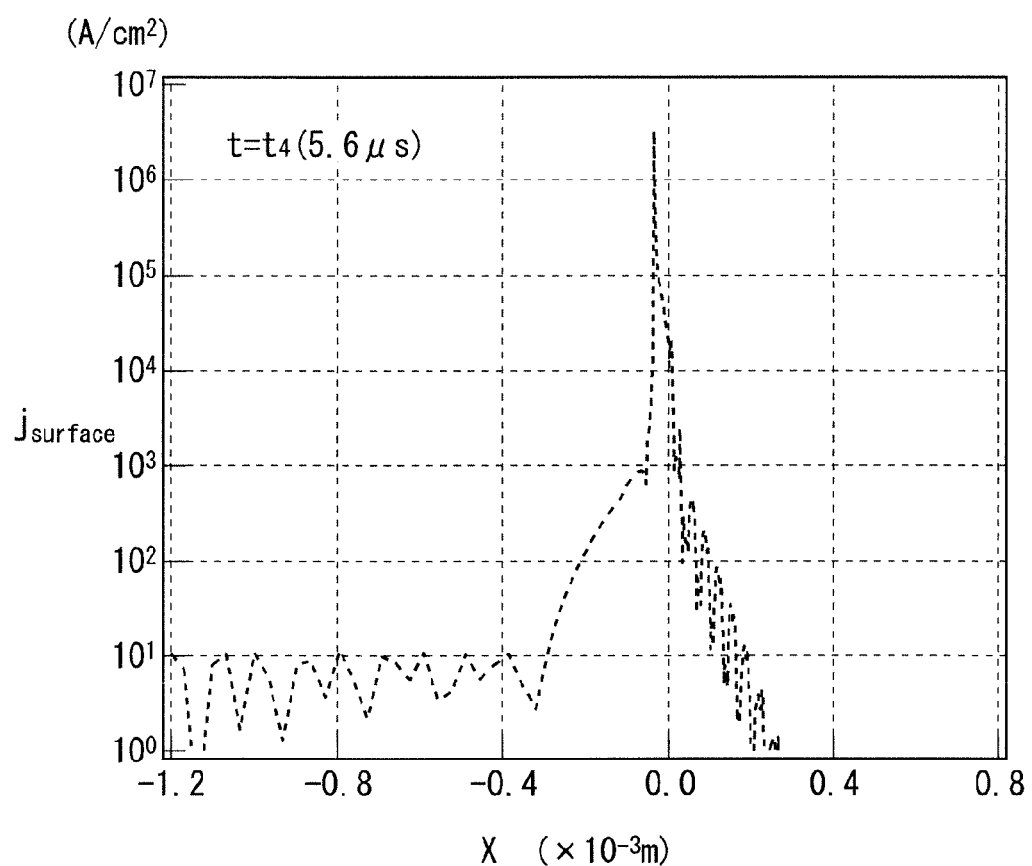
FIG. 49D is a graphical representation showing a relationship between the position X in the H-H' line (FIG. 38) of the comparative example and the current density $j_{surface}$ when $t=t_4$ (FIGS. 46A and 46B).
Figure 50B:
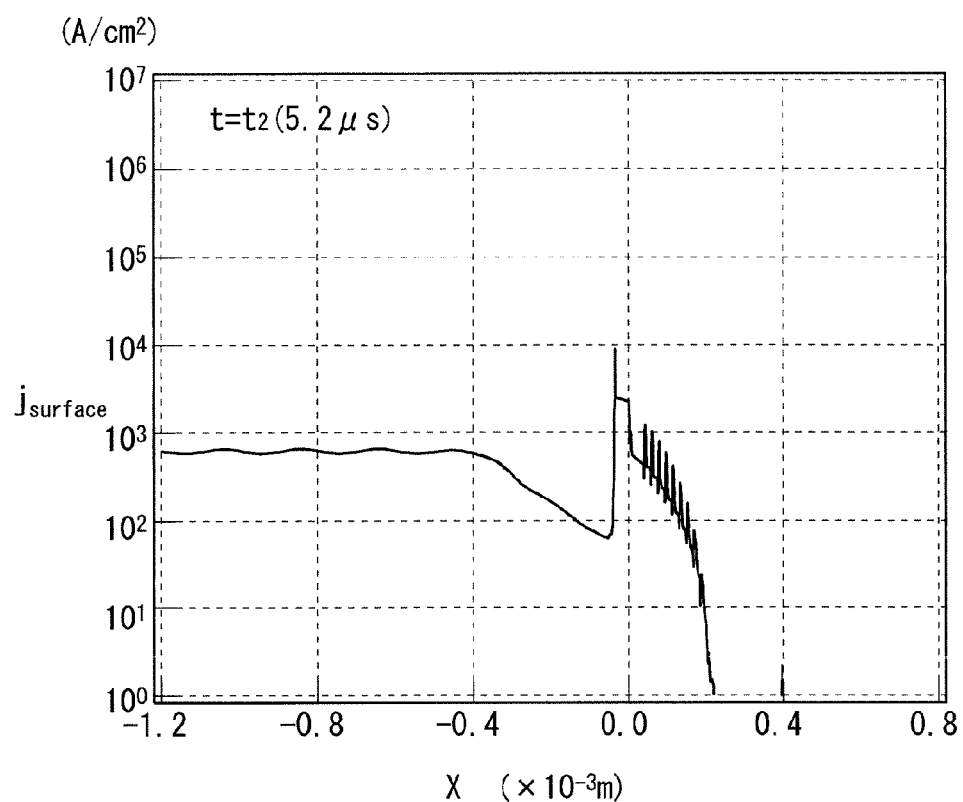
FIG. 50B is a graphical representation showing a relationship between the position X in the H-H' line (FIG. 45A) of the embodiment and the current density $j_{surface}$ when $t=t_2$ (FIGS. 46A and 46B).
Figure 50C:
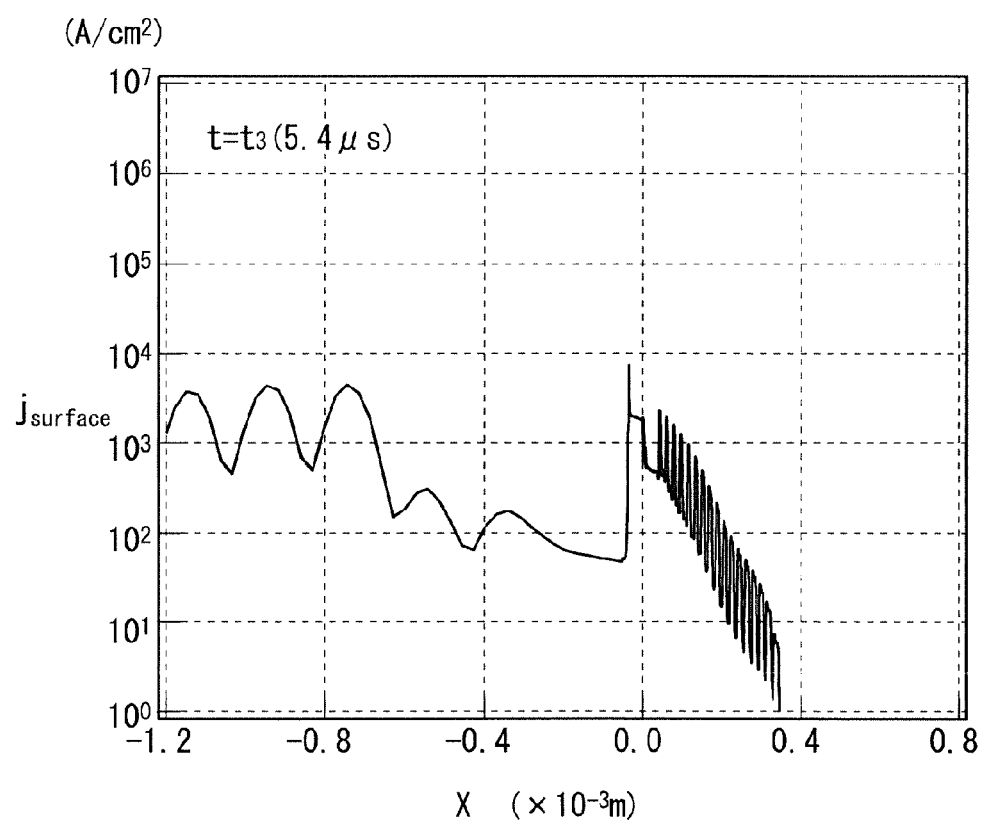
FIG. 50C is a graphical representation showing a relationship between the position X in the H-H' line (FIG. 45A) of the embodiment and the current density $j_{surface}$ when $t=t_3$ (FIGS. 46A and 46B).
Figure 50E:
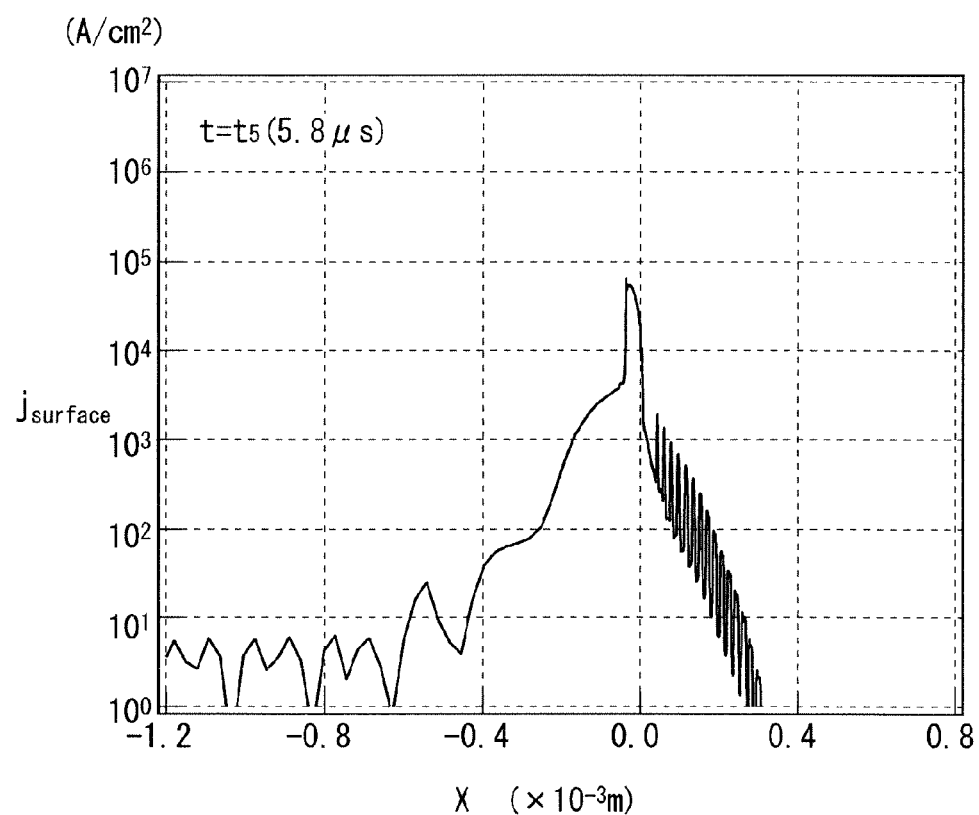
FIG. 50E is a graphical representation showing a relationship between the position X in the H-H' line (FIG. 45A) of the embodiment and the current density $j_{surface}$ when $t=t_5$ (FIGS. 46A and 46B).
Figure 51A:
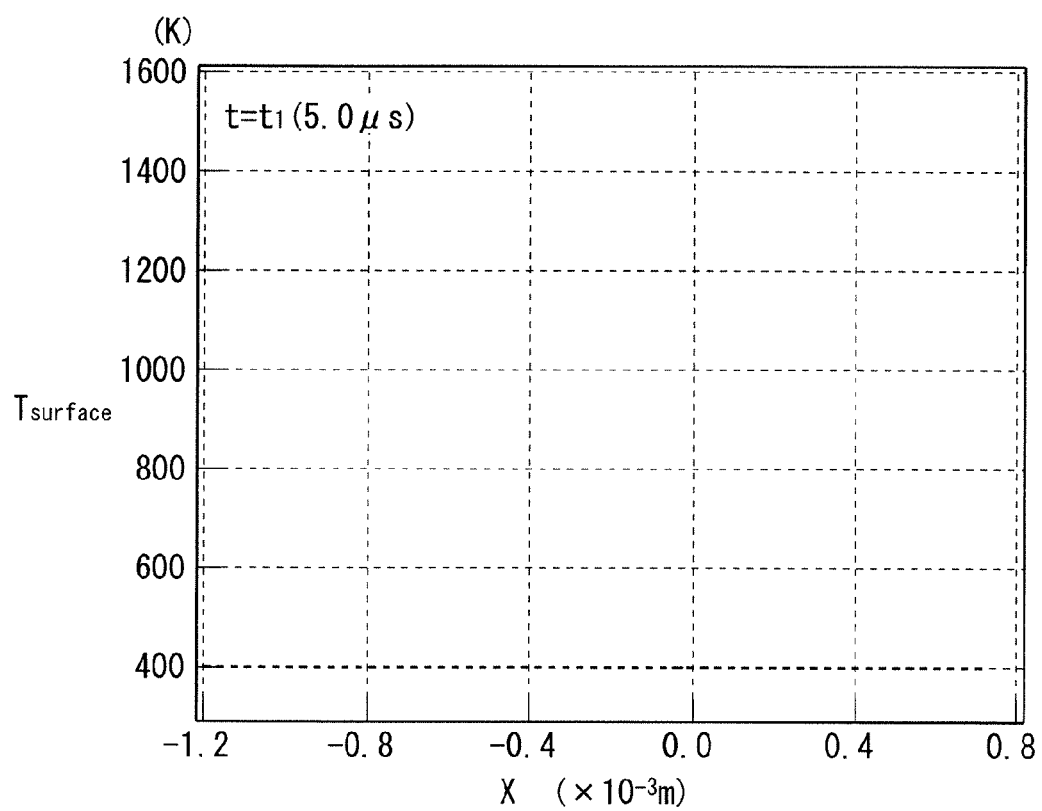
FIG. 51A is a graphical representation showing a relationship between the position X in the H-H' line (FIG. 38) of the comparative example and a temperature $T_{surface}$ of an upper surface S1 of the device when $t=t_1$ (FIGS. 46A and 46B).
Figure 52B:
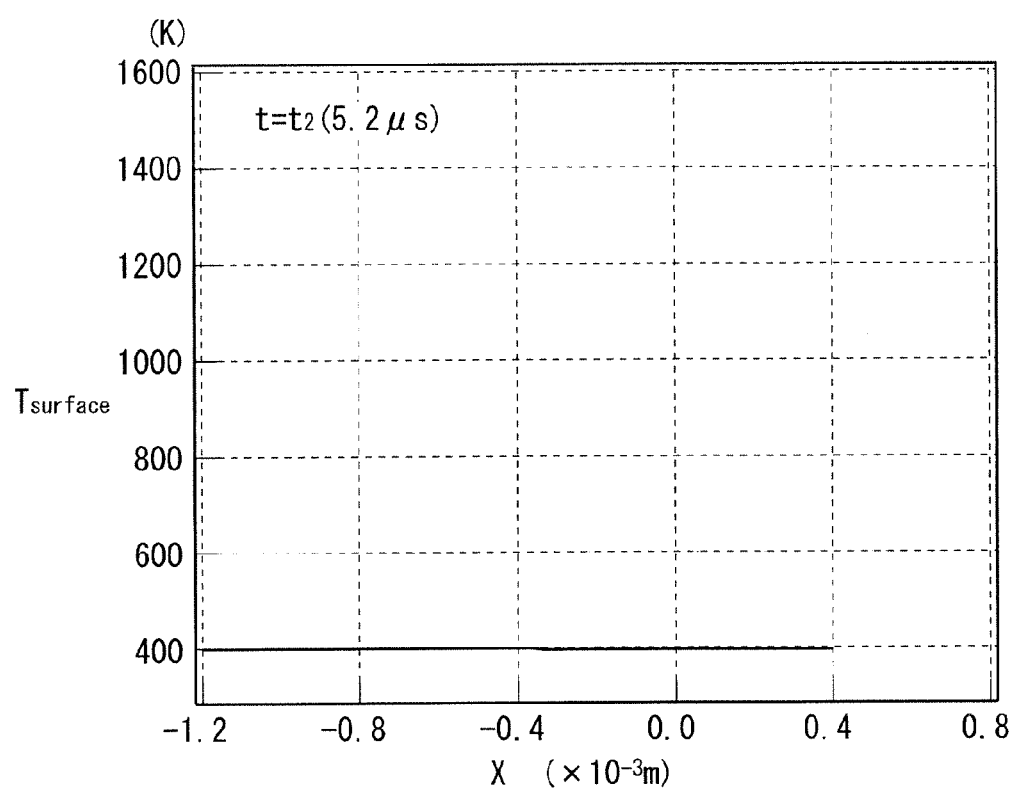
FIG. 52B is a graphical representation showing a relationship between the position X in the H-H' line (FIG. 45A) of the embodiment and the temperature $T_{surface}$ of the upper surface S1 of the device when $t=t_2$ (FIGS. 46A and 46B).
Figure 52C:
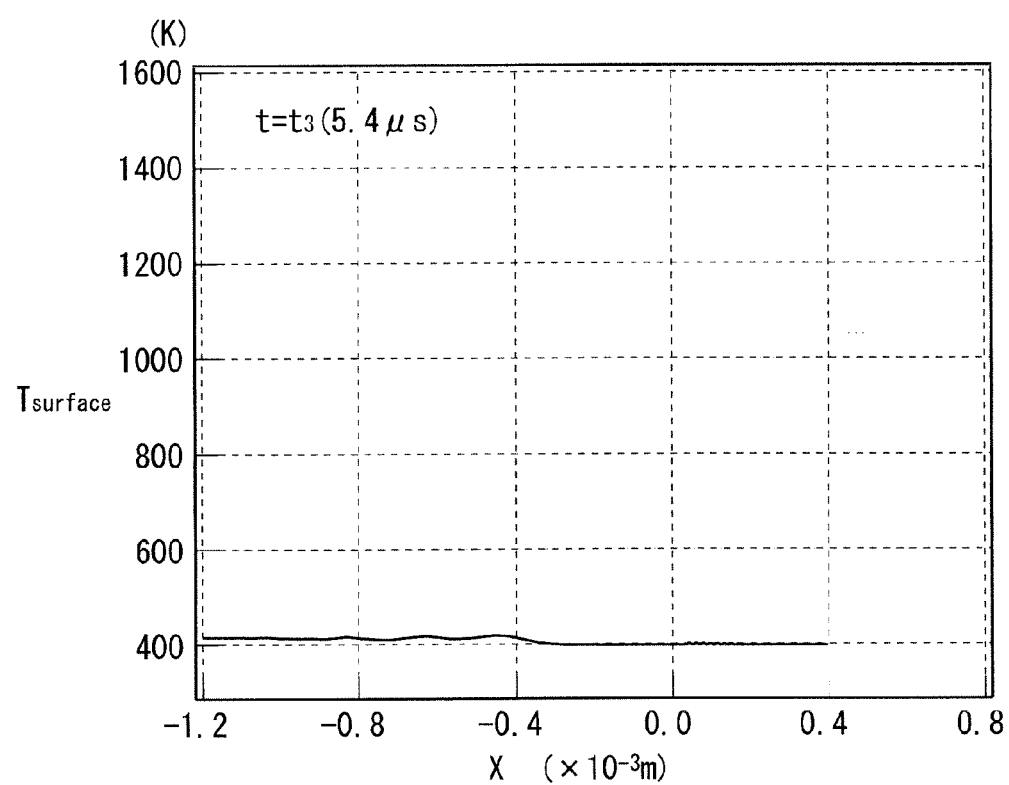
FIG. 52C is a graphical representation showing a relationship between the position X in the H-H' line (FIG. 45A) of the embodiment and the temperature $T_{surface}$ of the upper surface S1 of the device when $t=t_3$ (FIGS. 46A and 46B).
Figure 52F:
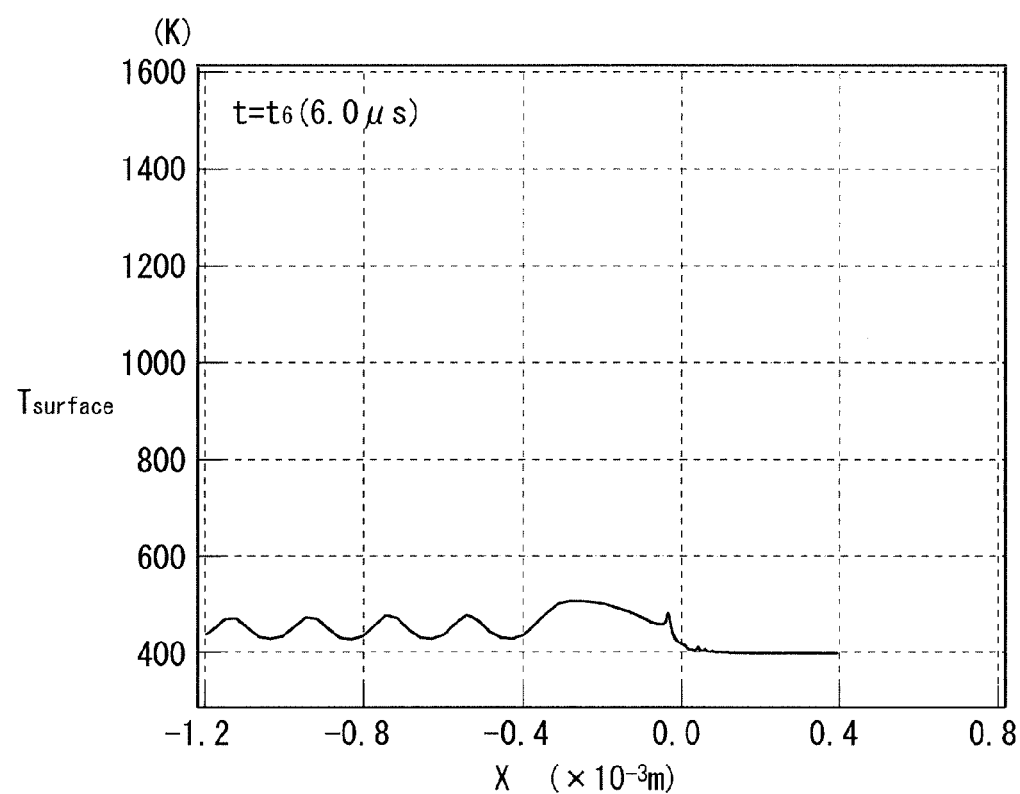
FIG. 52F is a graphical representation showing a relationship between the position X in the H-H' line (FIG. 45A) of the embodiment and the temperature $T_{surface}$ of the upper surface S1 of the device when $t=t_6$ (FIGS. 46A and 46B).

FIG. 46A shows waveforms of a voltage $V_{AK}$ and a current density $J_A$ during a recovery operation in each of the diode 800B as the embodiment (solid line) and the diode 800Z as the comparative example (broken line), and FIG. 46B shows peak temperatures T inside the devices during the recovery operation. In the comparative example, when t=5.5 μs, an abrupt decrease in $V_{AK}$ and an abrupt increase in temperature to T>800 K occur. In other words, breakage of the diode occurs in the middle of the recovery operation. In contrast, the break is completed without the breakage in this embodiment.

FIGS. 47A to 47D respectively show a relationship between a position X in a H-H' line (FIG. 38) of the comparative example and surface electric field strength $E_{surface}$ when t=$t_1$ to $t_4$ (FIGS. 46A and 46B). FIGS. 48A to 48F respectively show a relationship between a position X in a H-H' line (FIG. 45A) of the embodiment and the surface electric field strength $E_{surface}$ when t=$t_1$ to $t_6$ (FIGS. 46A and 46B). FIGS. 49A to 49D respectively show a relationship between the position X in the H-H' line of the comparative example and a current density $j_{surface}$ when t=$t_1$ to $t_4$. FIGS. 50A to 50F respectively show a relationship between the position X in the H-H' line of the embodiment and the current density $j_{surface}$ when t=$t_1$ to $t_6$. FIGS. 51A to 51D respectively show a relationship between the position X in the H-H' line of the comparative example and a temperature $T_{surface}$ of the upper surface S1 of the device when t=$t_1$ to $t_4$. FIGS. 52A to 52F respectively show a relationship between the position X in the H-H' line of the embodiment and the temperature $T_{surface}$ of the upper surface S1 of the device when t=$t_1$ to $t_6$.

As seen from the results, the electric field strength in the interface area AR2 and the edge termination area AR3, particularly, the interface area AR2, during the recovery operation is lower in the embodiment than that in the comparative example, and the temperature rise in the interface area AR2 is suppressed. Thus, the diode 800B conceivably has the high breaking capability similarly to the IGBT 900G. As a result, the effect of expanding the SOA can be obtained.

Figure 53:
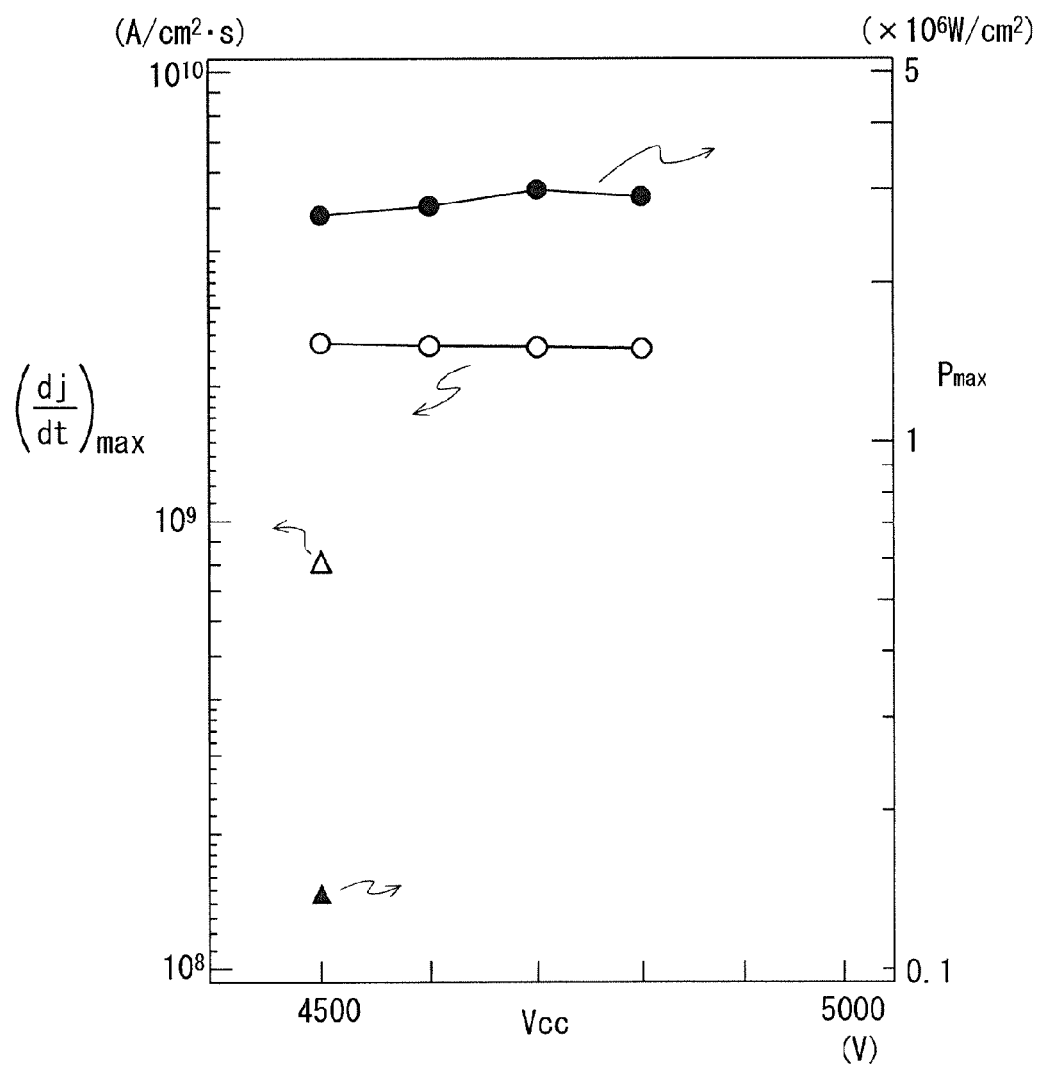
FIG. 53 is a graphical representation for describing recovery safe operating areas in the comparative example (indicated by triangles) and the embodiment (indicated by circles).

FIG. 53 is a graphical representation for describing recovery SOAs in the comparative example (indicated by triangles) and the embodiment (indicated by circles). Herein, $(dj/dt)_{max}$ represents a maximum value of a time derivative of a current density allowable during the break, and $P_{max}$ represents a maximum power density. The dj/dt value is a slope of a waveform of a current density in a region shown in, for example, FIG. 46A, and the greater value allows the diode to perform the recovery operation at higher speed (that is to say, the breaking capability during the recovery operation of the diode is higher). It is clear from the results that the recovery SOA improves since this embodiment having the dj/dt value about three times as great as that in the comparative example allows the recovery operation at higher speed and allows the break of the power density 50 times as great as that in the comparative example.

The power semiconductor device in each of the embodiments is particularly suitable for the high breakdown voltage class of approximately 3300 to 6500 V, but the amount of the breakdown voltage of the power semiconductor device is not particularly limited and may be, for example, greater than or equal to approximately 600 V. Further, the material for the semiconductor substrate is not limited to silicon and may be wide band gap materials such as silicon carbide (SiC) and gallium nitride (GaN), for example. The first conductivity type and the second conductivity type of the semiconductor substrate may be respectively the n-type and the p-type and vice versa.

In addition, according to the present invention, each embodiment can be appropriately varied or omitted within the scope of the invention. While the invention has been shown and described in detail, the above description is the exemplification in all aspects and the present invention is not intended to be limited thereto. It is therefore understood the numerous modifications and variations can be devised without departing from the scope of the invention.

DESCRIPTION OF NUMERALS

1 $n^-$-drift layer (drift region); 2 n-buffer layer (buffer layer); 3 p-collector layer (collector region); 4 collector electrode (second electrode); 4D cathode electrode (second electrode); 5 $n^+$-emitter layer; 6 $p^+$-layer; 8 p-base layer; 8D anode layer (impurity layer); 9 p-guard ring; 9a p-well region; 9b p-edge region; 9g $p^-$-field-limiting ring; 9j $p^-$-extension region; 10 trench insulating film; 11 gate electrode; 12, 12a, 12b interlayer insulating film; 13 anode electrode (first electrode); 13*a* emitter electrode (first electrode); 13*b* gate connecting electrode; 13*c*, 13*d* electrode; 13*e* floating electrode; 14, 15 passivation film; 22 gate electrode; 22*w* gate wiring layer; 23 capacitor electrode; 24 n-layer; 26 p-layer; 27 n$^+$-layer; 28 gate wiring portion; 29 gate pad; 32 channel stop electrode; 34 n-region; 35 n$^+$-region; 38 p-region; 800A, 800B diode; 900A to 900I IGBT; AR1 active area; AR2 interface area; AR3 edge termination area; CS channel stop structure; S1 upper surface (first surface); S2 lower surface (second surface); SB substrate (semiconductor substrate); TC capacitor trench; TG gate trench; TS channel stop trench; US, US1 to US6 unit structure.

The invention claimed is:

1. A power semiconductor device having an active area, an interface area provided around a periphery of said active area, and an edge termination area provided around a periphery of said interface area, said power semiconductor device comprising:
   a semiconductor substrate having a first surface and a second surface opposite to said first surface, said first surface and said second surface each being located across said active area, said interface area, and said edge termination area, said semiconductor substrate including
      a drift region that is provided across said active area, said interface area, and said edge termination area and has a first conductivity type,
      a collector region that is provided only in said active area, forms part of said second surface, and has a second conductivity type different from said first conductivity type, and
      a buffer layer that has a portion located between said drift region and said collector region in said active area, has said first conductivity type, and has an impurity concentration higher than an impurity concentration in said drift region;
   an emitter electrode that is provided in said active area and contacts said first surface of said semiconductor substrate; and
   a collector electrode that is provided on said second surface of said semiconductor substrate and contacts said collector region, wherein
   said active area has a MIS structural portion in which a MIS structural cell is disposed and a non-MIS structural portion in which no MIS structural cell is disposed,
   said buffer layer and said collector electrode contact each other on said second surface of said semiconductor substrate in said non-MIS structural portion, and
   said MIS structural portion includes two portions and the non-MIS structural portion is between the two portions of the MIS structural portion, and said collector electrode and said emitter electrode are electrically connected to said two MIS structural portions of the MIS structural cell.

2. The power semiconductor device according to claim 1, wherein said collector region has an area accounting for greater than or equal to 55% and less than or equal to 70% of said second surface of said semiconductor substrate.

3. The power semiconductor device according to claim 1, wherein said collector electrode on said second surface of said semiconductor substrate contacts said collector region in said active area and contacts said buffer layer in said interface area and said edge termination area.

4. The power semiconductor device according to claim 1, wherein
   said buffer layer is provided only in said active area among said active area, said interface area, and said edge termination area, and
   said collector electrode on said second surface of said semiconductor substrate contacts said collector region in said active area and contacts said drift region in said interface area and said edge termination area.

5. The power semiconductor device according to claim 1, wherein said semiconductor substrate includes a well region that is provided on said first surface, is at least partially included in said interface area, has an end portion on said first surface between said interface area and said edge termination area, and has said second conductivity type.

6. The power semiconductor device according to claim 5, wherein
   said first surface has an electrical path formed thereon, said electrical path connecting said emitter electrode to said end portion of said well region with a region of said second conductivity type,
   said electrical path has a resistance region that is formed of said well region and has a width L, and
   the width L is set so as to suppress a local temperature rise in one of both ends of said resistance region by sharing the temperature rise at said both ends during a breaking operation of said power semiconductor device.

7. The power semiconductor device according to claim 6, wherein said L is greater than or equal to 100 μm.

8. The power semiconductor device according to claim 1, wherein
   each of said two portions of said MIS structural portion comprises a gate insulating film and a gate electrode that constitute said MIS structural cell, and
   said non-MIS structural portion comprises an interlayer insulating film disposed on said first surface of said semiconductor substrate and a gate wiring portion disposed on said interlayer insulating film.

9. A power semiconductor device having an active area, an interface area provided around a periphery of said active area, and an edge termination area provided around a periphery of said interface area, said power semiconductor device comprising:
   a semiconductor substrate having a first surface and a second surface opposite to said first surface, said first surface and said second surface each being located across said active area, said interface area, and said edge termination area, said semiconductor substrate including
      a drift region that is provided across said active area, said interface area, and said edge termination area and has a first conductivity type, and
      a well region that is provided on said first surface, is at least partially included in said interface area, has an end portion on said first surface between said interface area and said edge termination area, and has a second conductivity type different from said first conductivity type;
   a first electrode that is provided in said active area and contacts said first surface of said semiconductor substrate, said first surface having an electrical path formed thereon, said electrical path connecting said first electrode to said end portion of said well region with a region of said second conductivity type, said electrical path having a resistance region that is formed of said well region and has a width L, the width L being greater than or equal to 100 μm to suppress a local temperature rise in one of both ends of said resistance region by sharing the temperature rise at said both ends during an operation of said power semiconductor device; and a second electrode contacting said second surface of said semiconductor substrate.

10. The power semiconductor device according to claim 9, wherein said first surface of said semiconductor substrate in said active area has an area $S_{act}$, said resistance region on said first surface of said semiconductor substrate in said interface area has an area $S_{abr}$, and said area $S_{abr}$ is greater than or equal to 2% and less than or equal to 40% of the area $S_{act}$.

11. The power semiconductor device according to claim 9, wherein said semiconductor substrate includes:

a collector region that is provided only in said active area, forms part of said second surface, and has a second conductivity type different from said first conductivity type; and a buffer layer that has a portion located between said drift region and said collector region in said active area, has said first conductivity type, and has an impurity concentration higher than an impurity concentration in said drift region.

12. The power semiconductor device according to claim 11, wherein said second electrode on said second surface of said semiconductor substrate contacts said collector region in said active area and contacts said buffer layer in said interface area and said edge termination area.

13. The power semiconductor device according to claim 11, wherein said buffer layer is provided only in said active area among said active area, said interface area, and said edge termination area, and said second electrode on said second surface of said semiconductor substrate contacts said collector region in said active area and contacts said drift region in said interface area and said edge termination area.

14. The power semiconductor device according to claim 11, wherein said active area has a MIS structural portion in which a MIS structural cell is disposed and a non-MIS structural portion in which no MIS structural cell is disposed, and said buffer layer and said second electrode contact each other on said second surface of said semiconductor substrate in said non-MIS structural portion.

15. A power semiconductor device having an active area, an interface area provided around a periphery of said active area, and an edge termination area provided around a periphery of said interface area, said power semiconductor device comprising:

a semiconductor substrate having a first surface and a second surface opposite to said first surface, said first surface and said second surface each being located across said active area, said interface area, and said edge termination area, said semiconductor substrate including a drift region that is provided across said active area, said interface area, and said edge termination area and has a first conductivity type, a collector region that is provided only in said active area, forms part of said second surface, and has a second conductivity type different from said first conductivity type, and a buffer layer that has a portion located between said drift region and said collector region in said active area, has said first conductivity type, and has an impurity concentration higher than an impurity concentration in said drift region;

an emitter electrode that is provided in said active area and contacts said first surface of said semiconductor substrate; and a collector electrode that is provided on said second surface of said semiconductor substrate and contacts said collector region, wherein said semiconductor substrate includes a well region that is provided on said first surface, is at least partially included in said interface area, has an end portion on said first surface between said interface area and said edge termination area, and has said second conductivity type, in said interface area, a contact at the same potential as the emitter electrode to said well region is not provided, and a width of an electrical path from a connection of the emitter electrode to the well region in the active area to the end portion of the well region is greater than or equal to 100 μm.

* * * * *